(12) United States Patent
Chung

(10) Patent No.: US 10,586,593 B2
(45) Date of Patent: *Mar. 10, 2020

(54) PROGRAMMABLE RESISTIVE DEVICE AND MEMORY USING DIODE AS SELECTOR

(71) Applicant: Attopsemi Technology Co., LTD, Hsinchu (TW)

(72) Inventor: Shine C. Chung, San Jose, CA (US)

(73) Assignee: Attopsemi Technology Co., LTD, Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 15/805,109

(22) Filed: Nov. 6, 2017

(65) Prior Publication Data

US 2018/0075906 A1 Mar. 15, 2018

Related U.S. Application Data

(63) Continuation of application No. 14/101,125, filed on Dec. 9, 2013, now Pat. No. 9,818,478.

(Continued)

(51) Int. Cl.
*G11C 13/00* (2006.01)
*G11C 17/18* (2006.01)
*G11C 17/16* (2006.01)

(52) U.S. Cl.
CPC ........ *G11C 13/0069* (2013.01); *G11C 13/004* (2013.01); *G11C 13/0004* (2013.01);
(Continued)

(58) Field of Classification Search
CPC .................................................. G11C 13/0069
See application file for complete search history.

(56) References Cited

U.S. PATENT DOCUMENTS

| 3,198,670 A | 8/1965 | Nissim |
| 3,715,242 A | 2/1973 | Daniel |

(Continued)

FOREIGN PATENT DOCUMENTS

| CN | 1469473 A | 1/2004 |
| CN | 1691204 A | 11/2005 |

(Continued)

OTHER PUBLICATIONS

U.S. Appl. No. 13/471,704, filed May 15, 2012.
(Continued)

*Primary Examiner* — Mushfique Siddique

(57) ABSTRACT

Building programmable resistive devices in contact holes at the crossover of a plurality of conductor lines in more than two vertical layers is disclosed. There are plurality of first conductor lines and another plurality of second conductor lines that can be substantially perpendicular to each other, though in two different vertical layers. A diode and/or a programmable resistive element can be fabricated in the contact hole between the first and second conductor lines. The programmable resistive element can be coupled to another programmable resistive device or shared between two programmable devices whose diodes conducting currents in opposite directions and/or coupled to a common conductor line. The programmable resistive memory can be configured to be programmable by applying voltages to conduct current flowing through the programmable resistive element to change its resistance for a different logic state.

4 Claims, 20 Drawing Sheets

Related U.S. Application Data

(60) Provisional application No. 61/734,945, filed on Dec. 7, 2012, provisional application No. 61/880,916, filed on Sep. 21, 2013.

(52) U.S. Cl.
CPC .......... *G11C 13/0007* (2013.01); *G11C 17/16* (2013.01); *G11C 17/18* (2013.01); *G11C 2213/72* (2013.01); *G11C 2213/74* (2013.01)

(56) References Cited

U.S. PATENT DOCUMENTS

| | | | |
|---|---|---|---|
| 4,148,046 A | 4/1979 | Hendrickson et al. | |
| 4,192,059 A | 3/1980 | Khan et al. | |
| 4,642,674 A | 2/1987 | Schoofs | |
| 5,192,989 A | 3/1993 | Matsushita et al. | |
| 5,355,342 A | 10/1994 | Ueoka | |
| 5,389,552 A | 2/1995 | Iranmanesh | |
| 5,447,876 A | 9/1995 | Moyer et al. | |
| 5,536,968 A * | 7/1996 | Crafts ................. | H01L 23/5256 257/258 |
| 5,548,225 A | 8/1996 | Rountree | |
| 5,600,588 A | 2/1997 | Kawashima | |
| 5,610,871 A | 3/1997 | Hidaka | |
| 5,635,742 A | 6/1997 | Hoshi et al. | |
| 5,637,901 A | 6/1997 | Beigel et al. | |
| 5,723,890 A | 3/1998 | Fujihira et al. | |
| 5,747,805 A | 5/1998 | Youngquist | |
| 5,757,046 A | 5/1998 | Fujihira et al. | |
| 5,761,148 A | 6/1998 | Allan et al. | |
| 5,962,903 A | 10/1999 | Sung et al. | |
| 6,002,156 A | 12/1999 | Lin | |
| 6,008,092 A | 12/1999 | Gould | |
| 6,034,882 A | 3/2000 | Johnson et al. | |
| 6,054,344 A | 4/2000 | Liang et al. | |
| 6,108,247 A | 8/2000 | Suzu | |
| 6,140,687 A | 10/2000 | Shimormura et al. | |
| 6,215,681 B1 | 4/2001 | Schuurman | |
| 6,222,244 B1 | 4/2001 | Arndt et al. | |
| 6,243,864 B1 | 6/2001 | Odani et al. | |
| 6,249,472 B1 | 6/2001 | Tamura et al. | |
| 6,346,727 B1 | 2/2002 | Ohtomo | |
| 6,388,292 B1 | 5/2002 | Lin | |
| 6,400,540 B1 | 6/2002 | Chang | |
| 6,405,160 B1 | 6/2002 | Djaja et al. | |
| 6,461,934 B2 | 10/2002 | Nishida et al. | |
| 6,483,734 B1 | 11/2002 | Sharma et al. | |
| 6,597,629 B1 | 7/2003 | Raszka et al. | |
| 6,611,043 B2 | 8/2003 | Takiguchi | |
| 6,731,535 B1 | 5/2004 | Ooishi et al. | |
| 6,770,953 B2 | 8/2004 | Boeck et al. | |
| 6,798,684 B2 | 9/2004 | Low et al. | |
| 6,803,804 B2 | 10/2004 | Madurawe | |
| 6,813,705 B2 | 11/2004 | Duesterwald et al. | |
| 6,897,543 B1 | 5/2005 | Huang et al. | |
| 6,934,176 B2 | 8/2005 | Low et al. | |
| 6,944,083 B2 | 9/2005 | Pedlow | |
| 6,967,879 B2 | 11/2005 | Mizukoshi | |
| 7,009,182 B2 | 3/2006 | Kalman et al. | |
| 7,102,951 B2 | 9/2006 | Paillet et al. | |
| 7,167,397 B2 | 1/2007 | Paillet et al. | |
| 7,211,843 B2 | 5/2007 | Low et al. | |
| 7,212,432 B2 | 5/2007 | Ferrant et al. | |
| 7,224,598 B2 | 5/2007 | Perner | |
| 7,263,027 B2 | 8/2007 | Kim et al. | |
| 7,294,542 B2 | 11/2007 | Okushima | |
| 7,369,452 B2 | 5/2008 | Kenkare et al. | |
| 7,391,064 B1 | 6/2008 | Tripsas et al. | |
| 7,405,590 B1 | 7/2008 | Kaneko | |
| 7,411,844 B2 | 8/2008 | Nitzan et al. | |
| 7,439,608 B2 | 10/2008 | Arendt | |
| 7,450,414 B2 | 11/2008 | Scheuerlein | |
| 7,461,371 B2 | 12/2008 | Luo et al. | |
| 7,573,762 B2 | 8/2009 | Kenkare et al. | |
| 7,579,232 B1 | 8/2009 | Ping | |
| 7,589,367 B2 | 9/2009 | Oh et al. | |
| 7,609,578 B2 | 10/2009 | Buer et al. | |
| 7,660,181 B2 | 2/2010 | Kumar et al. | |
| 7,696,017 B1 | 4/2010 | Tripsas et al. | |
| 7,701,038 B2 | 4/2010 | Chen et al. | |
| 7,759,766 B2 | 7/2010 | Booth | |
| 7,764,532 B2 | 7/2010 | Kurjanowicz et al. | |
| 7,772,591 B1 | 8/2010 | Shih et al. | |
| 7,802,057 B2 | 9/2010 | Iyer et al. | |
| 7,808,815 B2 | 10/2010 | Ro et al. | |
| 7,830,697 B2 | 11/2010 | Herner | |
| 7,833,823 B2 | 11/2010 | Klersy | |
| 7,834,659 B1 | 11/2010 | Im et al. | |
| 7,852,656 B2 | 12/2010 | Shin et al. | |
| 7,859,920 B2 | 12/2010 | Jung | |
| 7,889,204 B2 | 2/2011 | Hansen et al. | |
| 7,910,999 B2 | 3/2011 | Lee et al. | |
| 8,008,723 B2 | 8/2011 | Nagai | |
| 8,050,129 B2 | 11/2011 | Liu et al. | |
| 8,089,137 B2 | 1/2012 | Lung et al. | |
| 8,115,280 B2 | 2/2012 | Chen et al. | |
| 8,119,048 B2 | 2/2012 | Nishimura | |
| 8,154,005 B2 | 4/2012 | Hsia | |
| 8,168,538 B2 | 5/2012 | Chen et al. | |
| 8,174,063 B2 | 5/2012 | Liu et al. | |
| 8,174,922 B2 | 5/2012 | Naritake | |
| 8,179,711 B2 | 5/2012 | Kim et al. | |
| 8,183,665 B2 | 5/2012 | Bertin et al. | |
| 8,203,899 B2 | 6/2012 | Chen | |
| 8,217,490 B2 | 7/2012 | Bertin et al. | |
| 8,233,316 B2 | 7/2012 | Liu et al. | |
| 8,339,079 B2 | 12/2012 | Yamada | |
| 8,369,166 B2 | 2/2013 | Kurjanowicz et al. | |
| 8,373,254 B2 | 2/2013 | Chen et al. | |
| 8,380,768 B2 | 2/2013 | Hoefler | |
| 8,415,764 B2 | 4/2013 | Chung | |
| 8,482,972 B2 | 7/2013 | Chung | |
| 8,488,359 B2 | 7/2013 | Chung | |
| 8,488,364 B2 | 7/2013 | Chung | |
| 8,503,141 B2 | 8/2013 | Mallikarjunaswamy | |
| 8,514,606 B2 | 8/2013 | Chung | |
| 8,526,254 B2 | 9/2013 | Kurjanowicz et al. | |
| 8,559,208 B2 | 10/2013 | Chung | |
| 8,570,800 B2 | 10/2013 | Chung | |
| 8,576,602 B2 | 11/2013 | Chung | |
| 8,598,639 B2 | 12/2013 | Hsin | |
| 8,643,085 B2 | 2/2014 | Pfirsch | |
| 8,644,049 B2 | 2/2014 | Chung | |
| 8,648,349 B2 | 2/2014 | Masuda et al. | |
| 8,649,203 B2 | 2/2014 | Chung | |
| 8,680,620 B2 | 3/2014 | Salcedo | |
| 8,699,259 B2 | 4/2014 | Zhang et al. | |
| 8,760,904 B2 | 6/2014 | Chung | |
| 8,804,398 B2 | 8/2014 | Chung | |
| 8,817,563 B2 | 8/2014 | Chung | |
| 8,830,720 B2 | 9/2014 | Chung | |
| 8,848,423 B2 | 9/2014 | Chung | |
| 8,854,859 B2 | 10/2014 | Chung | |
| 8,861,249 B2 | 10/2014 | Chung | |
| 8,913,415 B2 | 12/2014 | Chung | |
| 8,913,449 B2 | 12/2014 | Chung | |
| 8,923,070 B2 | 12/2014 | Xia | |
| 8,923,085 B2 | 12/2014 | Chung | |
| 8,929,122 B2 | 1/2015 | Chung | |
| 8,988,965 B2 | 3/2015 | Chung | |
| 9,019,742 B2 | 4/2015 | Chung | |
| 9,019,791 B2 | 4/2015 | Chung | |
| 9,025,357 B2 | 5/2015 | Chung | |
| 9,070,437 B2 | 6/2015 | Chung | |
| 9,178,100 B2 | 11/2015 | Webster | |
| 9,236,141 B2 * | 1/2016 | Chung .................. | G11C 17/18 |
| 9,281,038 B2 | 3/2016 | Chung | |
| 9,305,973 B2 | 4/2016 | Chung | |
| 9,324,447 B2 | 4/2016 | Chung | |
| 9,324,849 B2 | 4/2016 | Chung | |
| 9,343,176 B2 | 5/2016 | Chung | |
| 9,449,687 B1 | 9/2016 | Piccardi | |
| 9,460,807 B2 | 10/2016 | Chung | |

(56) References Cited

U.S. PATENT DOCUMENTS

| | | |
|---|---|---|
| 9,478,306 B2 | 10/2016 | Chung |
| 9,548,109 B2 | 1/2017 | Chung |
| 9,767,915 B2 | 9/2017 | Chung |
| 9,818,478 B2* | 11/2017 | Chung ............... G11C 13/0069 |
| 9,838,025 B1 | 12/2017 | Deng |
| 9,852,783 B1 | 12/2017 | Na |
| 9,981,970 B2 | 1/2018 | Chung |
| 2002/0018355 A1 | 2/2002 | Johnson et al. |
| 2002/0075744 A1 | 6/2002 | McCollum |
| 2002/0168821 A1 | 11/2002 | Williams et al. |
| 2002/0196659 A1 | 12/2002 | Hurst et al. |
| 2003/0104860 A1 | 6/2003 | Cannon et al. |
| 2003/0135709 A1 | 7/2003 | Niles et al. |
| 2003/0169625 A1 | 9/2003 | Hush et al. |
| 2004/0057271 A1 | 3/2004 | Parkinson |
| 2004/0113183 A1 | 6/2004 | Karpov et al. |
| 2004/0130924 A1 | 7/2004 | Ma et al. |
| 2005/0052915 A1 | 3/2005 | Herner |
| 2005/0060500 A1 | 3/2005 | Luo et al. |
| 2005/0062110 A1 | 3/2005 | Dietz et al. |
| 2005/0110081 A1 | 5/2005 | Pendharkar |
| 2005/0124116 A1 | 6/2005 | Hsu et al. |
| 2005/0146962 A1 | 7/2005 | Schreck |
| 2005/0242386 A1 | 11/2005 | Ang |
| 2006/0072357 A1 | 4/2006 | Wicker |
| 2006/0092689 A1 | 5/2006 | Braun et al. |
| 2006/0104111 A1 | 5/2006 | Tripsas et al. |
| 2006/0120148 A1 | 6/2006 | Kim et al. |
| 2006/0129782 A1 | 6/2006 | Bansal et al. |
| 2006/0215440 A1 | 9/2006 | Cho et al. |
| 2006/0244099 A1 | 11/2006 | Kurjanowicz |
| 2007/0004160 A1 | 1/2007 | Voldman |
| 2007/0008776 A1 | 1/2007 | Scheuerlein et al. |
| 2007/0030026 A1 | 2/2007 | Hsu et al. |
| 2007/0057323 A1 | 3/2007 | Furukawa et al. |
| 2007/0058422 A1 | 3/2007 | Phillips |
| 2007/0081377 A1 | 4/2007 | Zheng et al. |
| 2007/0133341 A1 | 6/2007 | Lee et al. |
| 2007/0138549 A1 | 6/2007 | Wu et al. |
| 2007/0183213 A1 | 8/2007 | Kusakabe |
| 2007/0218665 A1 | 9/2007 | Sutardja |
| 2007/0223266 A1 | 9/2007 | Chen |
| 2007/0279978 A1 | 12/2007 | Ho et al. |
| 2007/0284656 A1 | 12/2007 | Radigan |
| 2008/0025067 A1 | 1/2008 | Scheuerlein et al. |
| 2008/0025068 A1 | 1/2008 | Scheuerlein et al. |
| 2008/0028134 A1 | 1/2008 | Matsubara et al. |
| 2008/0044959 A1 | 2/2008 | Cheng et al. |
| 2008/0067601 A1 | 3/2008 | Chen |
| 2008/0105878 A1 | 5/2008 | Ohara |
| 2008/0137401 A1 | 6/2008 | Philipp |
| 2008/0144354 A1 | 6/2008 | Choi |
| 2008/0151612 A1 | 6/2008 | Pellizzer et al. |
| 2008/0170429 A1 | 7/2008 | Bertin et al. |
| 2008/0175060 A1 | 7/2008 | Liu et al. |
| 2008/0185568 A1 | 8/2008 | Kwon |
| 2008/0220560 A1 | 9/2008 | Klersy |
| 2008/0225567 A1 | 9/2008 | Burr et al. |
| 2008/0280401 A1 | 11/2008 | Burr et al. |
| 2008/0316852 A1 | 12/2008 | Matsufuji et al. |
| 2009/0039420 A1 | 2/2009 | Trivedi |
| 2009/0055617 A1 | 2/2009 | Bansal et al. |
| 2009/0115021 A1 | 5/2009 | Moriwaki |
| 2009/0168493 A1 | 7/2009 | Kim et al. |
| 2009/0172315 A1 | 7/2009 | Iyer et al. |
| 2009/0180310 A1 | 7/2009 | Shimomura et al. |
| 2009/0194839 A1 | 8/2009 | Bertin et al. |
| 2009/0213660 A1 | 8/2009 | Pikhay et al. |
| 2009/0219756 A1 | 9/2009 | Schroegmeier et al. |
| 2009/0269932 A1 | 10/2009 | Chen |
| 2009/0273964 A1* | 11/2009 | Yamazaki .......... G11C 13/0007 365/148 |
| 2009/0309089 A1 | 12/2009 | Hsia et al. |
| 2010/0002501 A1 | 1/2010 | Leuschner |
| 2010/0027326 A1 | 2/2010 | Kim et al. |
| 2010/0034016 A1 | 2/2010 | Liu et al. |
| 2010/0061136 A1 | 3/2010 | Koyama et al. |
| 2010/0085798 A1 | 4/2010 | Lu et al. |
| 2010/0091546 A1 | 4/2010 | Liu et al. |
| 2010/0103721 A1 | 4/2010 | Guha |
| 2010/0142254 A1 | 6/2010 | Choi et al. |
| 2010/0157651 A1 | 6/2010 | Kumar et al. |
| 2010/0171086 A1 | 7/2010 | Lung et al. |
| 2010/0177547 A1 | 7/2010 | Shen |
| 2010/0201410 A1 | 8/2010 | Illegems |
| 2010/0219392 A1* | 9/2010 | Awaya ................ H01L 27/0688 257/3 |
| 2010/0232203 A1 | 9/2010 | Chung et al. |
| 2010/0238701 A1 | 9/2010 | Tsukamoto et al. |
| 2010/0246237 A1 | 9/2010 | Borot et al. |
| 2010/0250974 A1 | 9/2010 | Ristic |
| 2010/0277967 A1 | 11/2010 | Lee et al. |
| 2010/0301304 A1 | 12/2010 | Chen et al. |
| 2010/0321976 A1 | 12/2010 | Jung |
| 2011/0022648 A1 | 1/2011 | Harris et al. |
| 2011/0051491 A1 | 3/2011 | Takizawa |
| 2011/0062557 A1 | 3/2011 | Bandyopadhyay et al. |
| 2011/0108926 A1 | 5/2011 | Bahl |
| 2011/0127627 A1 | 6/2011 | Hoofman |
| 2011/0128772 A1 | 6/2011 | Kim et al. |
| 2011/0145777 A1 | 6/2011 | Iyer et al. |
| 2011/0175199 A1 | 7/2011 | Lin et al. |
| 2011/0186990 A1 | 8/2011 | Mawatari |
| 2011/0222330 A1 | 9/2011 | Lee et al. |
| 2011/0260289 A1 | 10/2011 | Oyamada |
| 2011/0267869 A1 | 11/2011 | Hoefler |
| 2011/0286261 A1* | 11/2011 | Sakaguchi ......... G11C 13/0004 365/148 |
| 2011/0297912 A1 | 12/2011 | Samachisa et al. |
| 2011/0310655 A1 | 12/2011 | Kreupl et al. |
| 2011/0312166 A1 | 12/2011 | Yedinak et al. |
| 2012/0032303 A1 | 2/2012 | Elkareh et al. |
| 2012/0039107 A1 | 2/2012 | Chung |
| 2012/0044736 A1 | 2/2012 | Chung |
| 2012/0044737 A1 | 2/2012 | Chung |
| 2012/0044738 A1 | 2/2012 | Chung |
| 2012/0044739 A1 | 2/2012 | Chung |
| 2012/0044740 A1 | 2/2012 | Chung |
| 2012/0044743 A1 | 2/2012 | Chung |
| 2012/0044744 A1 | 2/2012 | Chung |
| 2012/0044745 A1 | 2/2012 | Chung |
| 2012/0044746 A1 | 2/2012 | Chung |
| 2012/0044747 A1 | 2/2012 | Chung |
| 2012/0044748 A1 | 2/2012 | Chung |
| 2012/0044753 A1 | 2/2012 | Chung |
| 2012/0044756 A1 | 2/2012 | Chung |
| 2012/0044757 A1 | 2/2012 | Chung |
| 2012/0044758 A1 | 2/2012 | Chung |
| 2012/0047322 A1 | 2/2012 | Chung |
| 2012/0074460 A1 | 3/2012 | Kitagawa |
| 2012/0106231 A1 | 5/2012 | Chung |
| 2012/0120707 A1 | 5/2012 | Kim |
| 2012/0147653 A1 | 6/2012 | Chung |
| 2012/0147657 A1 | 6/2012 | Sekar et al. |
| 2012/0182783 A1 | 7/2012 | Bedeschi |
| 2012/0209888 A1 | 8/2012 | Chung |
| 2012/0224406 A1 | 9/2012 | Chung |
| 2012/0224413 A1 | 9/2012 | Zhang et al. |
| 2012/0256292 A1 | 10/2012 | Yu et al. |
| 2012/0257435 A1 | 10/2012 | Lin |
| 2012/0268980 A1* | 10/2012 | Awaya ................ G11C 13/0007 365/148 |
| 2012/0287730 A1 | 11/2012 | Kim |
| 2012/0314472 A1 | 12/2012 | Chung |
| 2012/0314473 A1 | 12/2012 | Chung |
| 2012/0320656 A1 | 12/2012 | Chung |
| 2012/0320657 A1 | 12/2012 | Chung |
| 2013/0006559 A1 | 1/2013 | Grosjean |
| 2013/0135503 A1 | 5/2013 | Park |
| 2013/0148409 A1 | 6/2013 | Chung |
| 2013/0161780 A1 | 6/2013 | Kizilyalli et al. |
| 2013/0189829 A1 | 7/2013 | Mieczkowski et al. |
| 2013/0200488 A1 | 8/2013 | Chung |
| 2013/0201745 A1 | 8/2013 | Chung |

(56) References Cited

U.S. PATENT DOCUMENTS

| | | |
|---|---|---|
| 2013/0201746 A1 | 8/2013 | Chung |
| 2013/0201748 A1 | 8/2013 | Chung |
| 2013/0201749 A1 | 8/2013 | Chung |
| 2013/0208526 A1 | 8/2013 | Chung |
| 2013/0215663 A1 | 8/2013 | Chung |
| 2013/0235644 A1 | 9/2013 | Chung |
| 2013/0268526 A1 | 10/2013 | John et al. |
| 2013/0268727 A1 | 10/2013 | Sohn |
| 2013/0286710 A1 | 10/2013 | Hall |
| 2013/0294136 A1 | 11/2013 | Siau |
| 2013/0307821 A1 | 11/2013 | Kogo |
| 2013/0308366 A1 | 11/2013 | Chung |
| 2014/0010032 A1 | 1/2014 | Seshadri et al. |
| 2014/0016394 A1 | 1/2014 | Chung et al. |
| 2014/0071726 A1 | 3/2014 | Chung |
| 2014/0092674 A1 | 4/2014 | Chung |
| 2014/0124871 A1 | 5/2014 | Ko et al. |
| 2014/0124895 A1 | 5/2014 | Salzman et al. |
| 2014/0126266 A1 | 5/2014 | Chung |
| 2014/0131710 A1 | 5/2014 | Chung |
| 2014/0131711 A1 | 5/2014 | Chung |
| 2014/0131764 A1 | 5/2014 | Chung |
| 2014/0133056 A1 | 5/2014 | Chung |
| 2014/0160830 A1 | 6/2014 | Chung |
| 2014/0211567 A1 | 7/2014 | Chung |
| 2014/0269135 A1 | 9/2014 | Chung |
| 2014/0340954 A1 | 11/2014 | Chung |
| 2014/0369133 A1 | 12/2014 | Lee et al. |
| 2015/0003142 A1 | 1/2015 | Chung |
| 2015/0003143 A1 | 1/2015 | Chung |
| 2015/0009743 A1 | 1/2015 | Chung |
| 2015/0014785 A1 | 1/2015 | Chung |
| 2015/0021543 A1 | 1/2015 | Chung |
| 2015/0029777 A1 | 1/2015 | Chung |
| 2015/0078060 A1 | 3/2015 | Chung |
| 2015/0130509 A1 | 5/2015 | He |
| 2015/0137258 A1 | 5/2015 | Mittal |
| 2015/0194433 A1 | 7/2015 | Ponoth |
| 2015/0206586 A1 | 7/2015 | Chang |
| 2015/0249428 A1 | 9/2015 | Huynh |
| 2015/0276500 A1 | 10/2015 | Walker |
| 2015/0380103 A1 | 12/2015 | Braun et al. |
| 2016/0003880 A1 | 1/2016 | Deschildre |
| 2016/0034351 A1 | 2/2016 | Michael |
| 2016/0071582 A1 | 3/2016 | Chung |
| 2016/0268002 A1 | 9/2016 | Chen |
| 2016/0276043 A1 | 9/2016 | Chung |
| 2016/0329810 A1 | 11/2016 | Lee et al. |
| 2016/0336062 A1 | 11/2016 | Buchanan |
| 2016/0358648 A1 | 12/2016 | Park |
| 2017/0053708 A1 | 2/2017 | Wong |
| 2017/0076733 A1 | 3/2017 | Noguchi |
| 2017/0103699 A1 | 4/2017 | Lin |
| 2017/0110170 A1 | 4/2017 | Kong |
| 2017/0110512 A1 | 4/2017 | Chung |
| 2017/0149395 A1 | 5/2017 | Patel |
| 2017/0199537 A1 | 7/2017 | Duong |
| 2017/0365360 A1 | 12/2017 | Fackenthal |
| 2018/0005703 A1 | 1/2018 | Nguyen |
| 2018/0059958 A1 | 3/2018 | Ryan |
| 2018/0095489 A1 | 4/2018 | Fang |
| 2018/0097447 A1 | 4/2018 | Iorio |

FOREIGN PATENT DOCUMENTS

| | | |
|---|---|---|
| CN | 101057330 A | 10/2007 |
| CN | 101083227 A | 12/2007 |
| CN | 101188140 A | 5/2008 |
| CN | 101271881 A | 9/2008 |
| CN | 101483062 A | 7/2009 |
| CN | 101728412 A | 6/2010 |
| CN | 10238593 A | 3/2012 |
| CN | 102385932 A | 3/2012 |
| CN | 10261027 A | 7/2012 |
| CN | 102610272 A | 7/2012 |
| EP | 1367596 A1 | 12/2003 |
| JP | 03-264814 | 11/1991 |
| TW | I309081 | 10/2007 |

OTHER PUBLICATIONS

U.S. Appl. No. 13/026,650, filed Feb. 14, 2011.
U.S. Appl. No. 13/026,656, filed Feb. 14, 2011.
U.S. Appl. No. 13/026,664, filed Feb. 14, 2011.
U.S. Appl. No. 13/026,678, filed Feb. 14, 2011.
U.S. Appl. No. 13/026,692, filed Feb. 14, 2011.
U.S. Appl. No. 13/026,704, filed Feb. 14, 2011.
U.S. Appl. No. 13/026,717, filed Feb. 14, 2011.
U.S. Appl. No. 13/026,725, filed Feb. 14, 2011.
U.S. Appl. No. 13/026,752, filed Feb. 14, 2011.
U.S. Appl. No. 13/026,771, filed Feb. 14, 2011.
U.S. Appl. No. 13/026,783, filed Feb. 14, 2011.
U.S. Appl. No. 13/026,835, filed Feb. 14, 2011.
U.S. Appl. No. 13/026,840, filed Feb. 14, 2011.
U.S. Appl. No. 13/026,852, filed Feb. 14, 2011.
U.S. Appl. No. 13/214,198, filed Aug. 21, 2011.
U.S. Appl. No. 13/590,044, filed Aug. 20, 2012.
U.S. Appl. No. 13/590,047, filed Aug. 20, 2012.
U.S. Appl. No. 13/590,049, filed Aug. 20, 2012.
U.S. Appl. No. 13/590,050, filed Aug. 20, 2012.
U.S. Appl. No. 13/214,183, filed Aug. 20, 2011.
U.S. Appl. No. 13/288,843, filed Nov. 3, 2011.
U.S. Appl. No. 13/314,444, filed Dec. 8, 2011.
U.S. Appl. No. 13/397,673, filed Feb. 15, 2012.
U.S. Appl. No. 13/571,797, filed Aug. 10, 2012.
U.S. Appl. No. 13/678,539, filed Nov. 15, 2012.
U.S. Appl. No. 13/678,544, filed Nov. 15, 2012.
U.S. Appl. No. 13/678,541, filed Nov. 15, 2012.
U.S. Appl. No. 13/678,543, filed Nov. 15, 2012.
Ahn, S.J. et al, "Highly Reliable 50nm Contact Cell Technology for 256Mb PRAM," IEEE VLSI Tech Symp., Jun. 2005, pp. 98-99.
Alavi, Mohsen, et al., "A PROM Element Based on Salicide Allgomeration of Poly Fuses in a CMOS Logic Process," IEEE IEDM, 97, pp. 855-858.
Andre, T. W. et al., "A 4-Mb 0.18um 1T1MTJ Toggle MRAM With Balanced Three Input Sensing Scheme and Locally Mirrored Uni-directional Write Drivers," IEEE J. of Solid-State Circuits, vol. 40, No. 1, Jan. 2005, pp. 301-309.
Ang, Boon et al., "NiSi Polysilicon Fuse Reliability in 65nm Logic CMOS Technology," IEEE Trans. on Dev. Mat. Rel. vol. 7, No. 2, Jun. 2007, pp. 298-303.
Aziz, A. et al., "Lateral Polysilicon n+p Diodes: Effect of the Grain boundaries and of the p-Implemented Doping Level on the I-V and C-V Characteristics," Springer Proceedings in Physics, vol. 54, 1991, pp. 318-322.
Aziz, A. et al., "Lateral Polysilicon PN Diodes: Current-Voltage Characteristics Simulation Between 200K and 400K a Numerical Approach," IEEE Trans. on Elec. Dev., vol. 41, No. 2, Feb. 1994, pp. 204-211.
Banerjee, Kaustav et al., "High Current Effects in Silicide Films for Sub-0.25um VLSI Technologies," IEEE 36th IRPS, 1998, pp. 284-292.
Bedeschi, F. et al., "4-Mb MOSFET-Selected uTrench Phase-Change Memory Experimental Chip," IEEE J. of Solid-State Circuits, vol. 40, No. 7, Jul. 2005, pp. 1557-1565.
Bedeschi, F. et al., "A Bipolar-Selected Phase Change Memory Featuring Multi-Level Cell Storage," IEEE J. Sol. Stat. Cir., vol. 44, No. 1, Jan. 2009, pp. 217-227.
Bedeschi, F. et al., "A Fully Symmetrical Sense Amplifier for Non-volatile Memories," IEEE. Int. Symp. On Circuits and Systems, (ISCAS), vol. 2, 2004, pp. 625-628.
Bedeschi, F. et al., "An 8Mb Demonstrator for High-Density 1.8V Phase-Change Memories," VLIS Cir. Symp, Jun. 2004, pp. 442-445.
Bedeschi, F. et al., "SET and RESET Pulse Characterization in BJT-Selected Phase-Change Memory," IEEE Int. Symp. On Circuits and Systems (ISCAS), 2005, pp. 1270-1273.

(56) References Cited

OTHER PUBLICATIONS

Braganca, P. M. et al., "A Three-Terminal Approach to Developing Spin-Torque Written Magnetic Random Access Memory Cells," IEEE Trans. on Nano. vol. 8, No. 2, Mar. 2009, pp. 190-195.

Cagli, C. et al., "Evidence for threshold switching in the set process of NiO-based RRAM and physical modeling for set, reset, retention and disturb prediction," IEEE IEDM, 2008, pp. 1-4.

Chan, W. T. et al., "CMOS Compatible Zero-Mask One-Time Programmable (OTP) Memory Design," Proc. Int. Conf. Solid State Integr. Cir. Tech., Beijing, China, Oct. 20-23, 2008. pp. 861-864.

Chan, Wan Tim, et al., "CMOS Compatible Zero-Mask One Time Programmable Memory Design", Master Thesis, Hong-Kong University of Science and Technologies, 2008.

Chang, Meng-Fan et al., "Circuit Design Challenges in Embedded Memory and Resistive RAM (RRAM) for Mobile SoC and 3D-IC", Design Automation Conference (ASP-DAC), 16th Asia and South Pacific, 2011, pp. 197-203.

Cheng, Yu-Hsing et al., "Failure Analysis and Optimization of Metal Fuses for Post Package Trimming," IEEE 45th IRPS, 2007, pp. 616-617.

Chiu, Pi-Feng et al., "A Low Store Energy, Low VDDmin, Nonvolatile 8T2R SRAM with 3D Stacked RRAM Devices for Low Power Mobile Applications," IEEE VLSI Cir./Tech Symp., Jun. 2010, pp. 229-230.

Cho, Woo Yeong et al., "A 0.18um 3.0V 64Mb Non-Volatile Phase-Transition Random-Access Memory (PRAM)," ISSCC, Feb. 2004, Sec. 2-1.

Choi, Sang-Jun et al., "Improvement of CBRAM Resistance Window by Scaling Down Electrode Size in Pure-GeTe Film," IEEE Elec. Dev., vol. 30, No. 2, Feb. 2009, pp. 120-122.

Choi, Youngdon et al., "A 20nm 1.8V 8Gb PRAM with 40MB/s Program Bandwidth," IEEE ISSCC, 2012, pp. 46-47.

Chung, S. et al., "A 1.25um2 Cell 32Kb Electrical Fuse Memory in 32nm CMOS with 700mV Vddmin and Parallel/Serial Interface," VLSI Cir. Symp., Jun. 2009, pp. 30-31.

Chung, S. et al., "A 512x8 Electrical Fuse Memory with 15um2 Cells Using 8-sq Asymmetrical Fuse and Core Devices in 90nm CMOS," VLSI Cir. Symp., Jun. 2007, pp. 74-75.

Crowley, Matthew et al., "512Mb PROM with 8 Layers of Antifuse/Diode Cells," IEEE ISSCC 2003, Sec. 16.4.

De Sandre, Guido et al., "A 4Mb LV MOS-Selected Embedded Phase Change Memory in 90nm Standard CMOS Technology," IEEE J. Sol. Stat. Cir, vol. 46. No. 1, Jan. 2011, pp. 52-63.

De Sandre, Guido et al., "A 90nm 4Mb Embedded Phase-Change Memory with 1.2V 12ns Read Access Time and 1MB/s Write Throughput," ISSCC 2010, Sec. 14.7.

Desikan, Rajagopalan et al., "On-Chip MRAM as a High-Bandwidth Low-Latency Replacement for DRAM Physical Memories," Tech Report TR-02-47, Dept. of Computer Science, University of Texas, Austin, Sep. 27, 2002, 18 pages.

Dietrich, Stefan et al., "A Nonvolatile 2-Mbit CBRAM Memory Core Featuring Advanced Read and Program Control," IEEE J. of Solid-Stat Cir., vol. 42, No. 4, Apr. 2007, pp. 839-845.

Dion, Michael J., "Reservoir Modeling for Electromigration Improvement of Metal Systems with Refractory Barriers," IEEE 39th IRPS, 2001, pp. 327-333.

Doorn, T. S. et al., "Ultra-fast Programming of Silicided Polysilicon Fuses Based on New Insights in the Programming Physics," IEEE IEDM, 2005, pp. 667-670.

Doorn, T. S., "Detailed Qualitative Model for the Programming Physics of Silicided Polysilicon Fuses," IEEE Trans. on Elec. Dev. vol. 54, No. 12, Dec. 2007, pp. 3285-3291.

Durlam, M. et al., "A 1-Mbit MRAM Based on 1T1MTJ Bit Cell Integrated With Copper Interconnects," IEEE J. of Solid-State Circuits, vol. 38, No. 5, May 2003, pp. 769-773.

Engel, B. et al., "The Science and Technology of Magnetoresistive Tunnel Memory," IEEE Tran. on Nanotechnology, vol. 1, No. 1, Mar. 2002, pp. 32-38.

Engel, B.N. et al., "A 4Mb Toggle MRAM Based on a Novel bit and Switching Method," IEEE Trans. on Mag. vol. 41, No. 1, Jan. 2005, pp. 132-136.

Fellner, Johannes, et al., "Lifetime Study for a Poly Fuse in a 0.35um Polycide CMOS Process," IEEE 43rd IRPS, 2005, pp. 446-449.

Gao, B. et al., "Oxide-Based RRAM: Uniformity Improvement Using a New Material-Oriented Methodology," IEEE VLSI Tech. Symp., Jun. 2009, pp. 30-31.

Gao, B. et al., "Oxide-Based RRAM Switching Mechanism: A New Ion-Transport-Recombination Model," IEDM, Dec. 2008, pp. 563-566.

Gill, M. et al., "Ovonic Unified Memory—A High Performance Nonvolatile Memory Technology for Stand-Alone Memory and Embedded Applications," IEEE, ISSCC Dig. of Tech. Paper, Feb. 2002, pp. 202-203.

Gogl, D. et al., "A 16-Mb MRAM Featuring Bootstrapped Write Drivers," IEEE J. of Solid-State Circuits, vol. 40, No. 4, Apr. 2005, pp. 902-908.

Gopalan, C. et al., Demonstration of Conductive Bridging Random Access Memory (CBRAM) in Logic CMOS Process, IEEE Int. Memory Workshop, 2010, pp. 1-4.

Ha, Daewon and Kim, Kinam, "Recent Advances in High Density Phase Change Memory (PRAM)," IEEE VLSI Tech. Symp. Jun. 2007.

Hosoi, Y. et al., "High Speed Unipolar Switching Resistance RAM (RRAM) Technology," IEEE IEDM, Dec. 2006, pp. 1-4.

Hosomi, M. et al., "A Novel Nonvolatile Memory with Spin Torque Transfer Magnetization Switching: Spin-RAM," IEEE IEDM Dig. of Tech. Paper, Dec. 2005, pp. 459-463.

Huang, Chia-En et al., "A New CMOS Logic Anti-Fuse Cell with Programmable Contact," IEEE IEDM Tech. Dig. 2007, pp. 48-51.

Im, Jay et al., "Characterization of Silicided Polysilicon Fuse Implemented in 65nm CMOS Technology," 7th Annual Non-Volatile Memory Technology Symp, (NVMTS) 2006, pp. 55-57.

Jin, Li-Yan et al., "Low-Area 1-Kb Multi-Bit OTP IP Design," IEEE 8th Int. Conf. on ASIC (ASICON), 2009. pp. 629-632.

Johnson, Mark et al., "512Mb PROM with a Three-Dimensional Array of Diode/Antifuse Memory Cells," IEEE J. of Sol. Stat. Cir., vol. 38, No. 11, Nov. 2003, pp. 1920-1928.

Kalnitsy, Alexander et al., "CoSi2 Integrated Fuses on Poly Silicon for Low Voltage 0.18um CMOS Applications," IEEE IEDM 1999, pp. 765-768.

Kang, Han-Byul et al., "Electromigration of NiSi Poly Gated Electrical Fuse and Its Resistance Behaviors Induced by High Temperature," IEEE IRPS, 2010, pp. 265-270.

Kang, Sangbeom et al., "A 0.1um 1.8V 256Mb Phase-Change Random Access Memory (PRAM) with 66Mhz Synchronous Burst-Read," IEEE J. of Sol. Stat. Cir. vol. 42. No. 1, Jan. 2007, pp. 210-218.

Kawahara, T. et al., "2Mb Spin-Transfer Torque RAM (SPRAM) with Bit-by-Bit Bidirectional Current Write and Parallelizing-Direction Current Read," IEEE ISSCC Dig. of Tech. Paper, Feb. 2007, pp. 480-481.

Ker, Ming-Dou et al., "High-Current Characterization of Polysilicon Diode for Electrostatic Discharge Protection in Sub-Quarter-Micron Complementary Metal Oxide Semiconductor Technology," Jpn. J. Appl. Phys. vol. 42 (2003) pp. 3377-3378.

Ker, Ming-Dou et al., "Ultra-High-Voltage Charge Pump Circuit in Low-Voltage Bulk CMOS Processes With Polysilicon Diodes," IEEE Trans. on Cir. and Sys.—II: Exp. Brief., vol. 54, No. 1, Jan. 2007, pp. 47-51.

Kim, Deok-Kee et al., "An Investigation of Electrical Current Induced Phase Transitions in the NiPtSi/Polysilicon System," J. App. Phy. 103, 073708 (2008).

Kim, I. S. et al., "High Performance PRAM Cell Scalable to sub-20nm Technology with below 4F2 Cell Size, Extendable to DRAM Applications," IEEE VLSI Tech Symp., Jun. 2010, pp. 203-204.

Kim, Jinbong et al., "3-Transistor Antifuse OTP ROM Array Using Standard CMOS Process," IEEE VLSI Cir. Symposium, Jun. 2003, pp. 239-242.

(56) References Cited

OTHER PUBLICATIONS

Kim, O. et al., "CMOS trimming circuit based on polysilicon fusing," Elec. Lett. vol. 34, No. 4, pp. 355-356, Feb. 1998.
Klee, V. et al., "A 0.13um Logic-Based Embedded DRAM Technology with Electrical Fuses, Cu Interconnect in SiLK, sub-7ns Random Access Time and its Extension to the 0.10um Generation," IEEE IEDM, 2001, pp. 407-410.
Kothandaramam, C. et al., "Electrically programmable fuse (eFUSE) using electromigration in silicides," IEEE Elec. Dev. Lett., vol. 23, No. 9, pp. 523-525, Sep. 2002.
Kulkarni, S. et al., "High-Density 3-D Metal-Fuse Prom Featuring 1.37um2 1T1R Bit Cell in 32nm High-K Metal-Gate CMOS Technology," VLSI Cir. Symp., Jun. 2009 pp. 28-29.
Kulkarni, S. et al., "A 4Kb Metal-Fuse OTP-ROM Macro Featuring a 2V Programmable 1.37um2 1T1R Bit Cell in 32nm High-K Metal-Gate CMOS," IEEE J. of Sol. Stat. Cir, vol. 45, No. 4, Apr. 2010, pp. 863-868.
Kund, Michael et al., "Conductive Bridging RAM (CBRAM): An Emerging Non-Volatile Memory Technology Scalable to Sub 20nm," IEEE IEDM 2005, pp. 754-757.
Lai, Han-Chao et al., "A 0.26um2 U-Shaped Nitride-Based Programming Cell on Pure 90nm CMOS Technology," IEEE Elec. Dev. Lett. vol. 28, No. 9, Sep. 2007, pp. 837-839.
Lai, S., "Current Status of the Phase Change Memory and Its Future," IEEE IEDM Dig. of Tech. Paper, Dec. 2003, pp. 255-258.
Lee, H. Y. et al., "Low Power and High Speed Bipolar Switching with a Thin Reactive Ti Buffer Layer in Robust HfO2 Based RRAM," IEEE IEDM, 2008, pp. 1-4.
Lee, K.J., et al., "A 90nm 1.8V 512Mb Diode-Switch PRAM with 266MB/s Read Throughout," IEEE ISSCC, Dig. of Tech. Paper, Feb. 2007, 3 pgs.
Lee, Kwang-Jin et al., "A 90nm 1.8V 512Mb Diode-Switch PRAM with 266MB/s Read Throughput," IEEE J. of Sol. Stat. Cir., vol. 43, No. 1, Jan. 2008, pp. 150-162.
Lee, M.-J. et al., "Stack Friendly all-Oxide 3D RRAM Using GaInZnO Peripheral TFT Realized Over Glass Substrates," IEDM, Dec. 2008. pp. 1-4.
Lee, Man Chiu et al., "OTP Memory for Low Cost Passive RFID Tags," IEEE Conf. on Electron Devices and Solid-State Circuits (EDSSC), 2007, pp. 633-636.
Liaw, Corvin et al., "The Conductive Bridging Random Access Memory (CBRAM): A Non-volatile Multi-Level Memory Technology," 37th European Solid-State Device Research Conference (ESSDERC), 2007, pp. 226-229.
Lim, Kyunam et al., "Bit Line Coupling Scheme and Electrical Fuse Circuit for Reliable Operation of High Density DRAM," IEEE VLSI Cir. Symp. Jun. 2001, pp. 33-34.
Maffitt, T. et al., "Design Considerations for MRAM," IBM J. Res. & Dev., vol. 50, No. 1, Jan. 2006, pp. 25-39.
Meng, X.Z. et al., "Reliability Concept for Electrical Fuses," IEE Proc.-Sci Meas. Technol., vol. 144, No. 2, Mar. 1997, pp. 87-92.
Min, Byung-Jun et al., "An Embedded Non-volatile FRAM with Electrical Fuse Repair Scheme and One Time Programming Scheme for High Performance Smart Cards," IEEE CICC, Nov. 2005, pp. 255-258.
Mojumder, N. N. et al., "Three-Terminal Dual-Pillar STT-MRAM for High Performance Robust Memory Applications," IEEE Trans. Elec. Dev. vol. 58. No. 5, May, 2011, pp. 1508-1516.
Morimoto, T. et al., "A NiSi Salicide Technology for Advanced Logic Devices," IEEE IEDM, Dec. 1991, pp. 653-656.
Neale, Ron, "PCM Progress Report No. 6 Afterthoughts," http://www.eetimes.com/General/PrintView/4236240, Feb. 13, 2012, 5 pages.
Nebashi, R. et al., "A 90nm 12ns 32Mb 2T1MTJ MRAM," IEEE ISSCC Dig. of Tech. Paper, Sess. 27.4, Feb. 2009, 3 pages.
Ng, K.P. et al., "Diode-Base Gate Oxide Anti-Fuse One-Time Programmable Memory Array in Standard CMOS Process," IEEE Int. Conf. of Elect. Dev. & Solid-Stat Cir. (EDSSC), Dec. 2009, pp. 457-460.

Ohbayashi, Shigeki et al., "A 65nm Embedded SRAM With Wafer Level Burn-In Mode, Leak-Bit Redundancy and Cu E-Trim Fuse for Known Good Die," IEEE J. of Solid. Stat. Cir., vol. 43, No. 1, Jan. 2008, pp. 96-108.
Oh, G. H. et al., "Parallel Multi-Confined (PMC) Cell Technology for High Density MLC PRAM," IEEE VLSI Tech. Symp., Jun. 2009, pp. 220-221.
Oh, J. H. et al., "Full Integration of Highly Manufacturable 512Mb PRAM Based on 90nm Technology," IEEE IEDM Dig. of Tech. Paper, Dec. 2006, pp. 1-4.
Osada, K. et al., "Phase Change RAM Operated with 1.5V CMOS as Low Cost Embedded Memory," IEEE CICC, Nov. 2005, pp. 431-434.
Park, Don et al., "Study on Reliability of Metal Fuse for Sub-100nm Technology," IEEE Int. Symp. on Semiconductor Manufacturing (ISSM), 2005, pp. 420-421.
Park, Jongwoo et al., "Phase Transformation of Programmed NiSi Electrical Fuse: Diffusion, Agglomeration, and Thermal Stability," 18th IEEE Int. Symp. on Physical and Failure Analysis of Integrated Circuits, (IPFA), 2011, pp. 1-7.
Park, Young-Bae et al., "Design of an eFuse OTP Memory of 8 Bits Based on a 0.35um BCD Process," Mobile IT Convergence (ICMIC), 2011 Int. Conf. on, pp. 137-139.
Pellizzer, F. et al., "Novel uTrench Phase-Change Memory Cell for Embedded and Stand-alone Non-Volatile Memory Applications," IEEE VLSI Tech Symp. Jun. 2004, pp. 18-19.
Peng, J. et al., "A Novel Embedded OTP NVM Using Standard Foundry CMOS Logic Technology," IEEE 21st Non-Volatile Semiconductor Memory Workshop (NVSMW) 2006, pp. 24-26.
Rizzolo, R. F. et al., "IBM System z9 eFUSE applications and methodology," IBM J. Res. & Dev. vol. 51 No. ½ Jan./Mar. 2007, pp. 65-75.
Robson, Norm et al., "Electrically Programmable Fuse (eFuse) from Memory Redundancy to Autonomic Chips," IEEE CICC, 2007, pp. 799-804.
Russo, U. et al., "Conductive-Filament Switching Analysis and Self-Accelerated Thermal Dissolution Model for Reset in NiO-based RRAM," IEDM, Dec. 2007, pp. 775-778.
Safran, J. et al., "A Compact eFUSE Programmable Array Memory for SOI CMOS," VLSI Cir. Symp. Jun. 2007, pp. 72-73.
Sasaki, Takahiko et al., "Metal-Segregate-Quench Programming of Electrical Fuse," IEEE 43rd IRPS, 2005, pp. 347-351.
Schrogmeier, P. et al., "Time Discrete Voltage Sensing and Iterative Programming Control for a 4F2 Multilevel CBRAM," VLSI Cir. Symp., Jun. 2007, pp. 186-187.
Sheu, Shyh-Shyuan et al., "A 5ns Fast Write Multi-Level Non-Volatile 1K-bits RRAM Memory with Advance Write Scheme," VLSI Cir. Symp., Jun. 2009, pp. 82-83.
Sheu, Shyh-Shyuan et al., "Fast-Write Resistive RAM (RRAM) for Embedded Applications," IEEE Design & Test of Computers, Jan./Feb. 2011, pp. 64-71.
Shi, Min et al., "Zero-Mask Contact Fuse for One-Time-Programmable Memory in Standard CMOS Processes," IEEE Dev. Lett. vol. 32, No. 7, Jul. 2011, pp. 955-957.
Song, Y. J. et al., "Highly Reliable 256Mb PRAM with Advanced Ring Contact Technology and Novel Encapsulating Technology," IEEE VLSI Tech Symp., Jun. 2006, pp. 153-154.
Suto, Hiroyuki et al., "Programming Conditions for Silicided Poly-Si or Copper Electrically Programmable Fuses," IEEE IIRW Final Report, 2007, pp. 84-89.
Suto, Hiroyuki et al., "Study of Electrically Programmable Fuses Through Series of I-V Measurements," IEEE IIRW Final Report, 2006, pp. 83-86.
Suto, Hiroyuki et al., "Systematic Study of the Dopant-Dependent Properties of Electrically Programmable Fuses With Silicide Poly-Si Links Through a Series of I-V Measurements," IEEE Trans. on Dev. Mat. Rel. vol. 7, No. 2, Jun. 2007, pp. 285-297.
Takaoka, H. et al., A Novel Via-fuse Technology Featuring Highly Stable Blow Operation with Large On-off Ratio for 32nm Node and Beyond, IEDM, 2007, pp. 43-46.
Tehrani, S. et al., "Magnetoresistive Random Access Memory Using Magnetic Tunnel Junction," Proc. of IEEE, vol. 91, No. 5, May 2003, pp. 703-714.

(56) References Cited

OTHER PUBLICATIONS

Tehrani, S., "Status and Outlook of MRAM Memory Technology," IEEE IEDM Dig. of Tech Paper., Dec. 2006, pp. 1-4.
Teichmann, J. et al., "One Time Programming (OTP) with Zener Diodes in CMOS Processes," 33rd Conf. on European Solid-State Device Research (ESSDERC), 2003, pp. 433-436.
Tian, C. et al., "Reliability Investigation of NiPtSi Electrical Fuse with Different Programming Mechanisms," IEEE IIRW Final Report, 2007, pp. 90-93.
Tian, C. et al., "Reliability Qualification of CoSi2 Electrical Fuse for 90nm Technology," IEEE 44th IRPS, 2006, pp. 392-397.
Tian, Chunyan et al., "Reliability Investigation of NiPtSi Electrical Fuse with Different Programming Mechanisms," IEEE Trans. On Dev. Mat. Rel. vol. 8, No. 3, Sep. 2008, pp. 536-542.
Tonti, W. R. et al., "Product Specific Sub-Micron E-Fuse Reliability and Design Qualification," IEEE IIRW Final Report, 2003, pp. 36-40.
Tonti, W. R., "Reliability and Design Qualification of a Sub-Micro Tungsten Silicide E-Fuse," IEEE IRPS Proceedings, 2004, pp. 152-156.
Tonti, W. R., "Reliability, Design Qualification, and Prognostic Opportunity of in Die E-Fuse," IEEE Conference on Prognostics and Health Management (PHM), 2011, pp. 1-7.
Ueda, T. et al., "A Novel Cu Electrical Fuse Structure and Blowing Scheme utilizing Crack-assisted Mode for 90-45nm-node and beyond," IEEE VLSI Tech. Sym., Jun. 2006, 2 pages.
Ulman, G. et al., "A Commercial Field-Programmable Dense eFUSE Array Memory with 00.999% Sense Yield for 45nm SOI CMOS", ISSCC 2008/ Session 22 / Variation Compensation and Measurement/ 22.4, 2008 IEEE International Solid-State Circuits Conference, pp. 406-407.
Vimercati, Daniele et al., "A 45nm 1Gbit 1.8V PCM for Wireless and Embedded Applications," IEEE ISSCC Feb. 2010, 26 pages.
Vinson, J. E., "NiCr Fuse Reliability—A New Approach," Southcon/94, Conference Record, 1994, pp. 250-255.
Walko, J., "Ovshinsky's Memories," IEE Review, Issue 11, Nov. 2005, pp. 42-45.
Wang, J. P. et al., "The Understanding of Resistive Switching Mechansim in HfO2-Based Resistive Random Access Memory," IEDM, 2011, pp. 12.1.1-12.1.4.
Wikipedia, "Programmable read-only memory", http://en.wikipedia.org/wiki/Programmable_read-only_memory, downloaded Jan. 31, 2010, 4 pages.
Worledge, D.C., "Single-Domain Model for Toggle MRAM," IBM J. Res. & Dev. vol. 50, No. 1, Jan. 2006, pp. 69-79.
Wu, Kuei-Sheng et al., "The Improvement of Electrical Programmable Fuse with Salicide-Block Dielectrical Film in 40nm CMOS Technology," Interconnect Technology Conference (IITC), 2010 Int. pp. 1-3.
Wu, Kuei-Sheng et al., "Investigation of Electrical Programmable Metal Fuse in 28nm and beyond CMOS Technology," IEEE International Interconnect Technology Conference and 2011 Materials for Advanced Metallization (IITC/MAM), 2011, pp. 1-3.
Yin, M. et al., "Enhancement of Endurance for CuxO based RRAM Cell," 9th Int. Conf. on Solid-State and Integrated-Circuit Technology (ICSICT) 2008, pp. 917-920.
Zhu, Jian-Gang, "Magnetoresistive Random Access Memory: The Path to Competitiveness and Scalability," Proc. of IEEE, vol. 96, No. 11, Nov. 2008, pp. 1786-1798.
Zhuang, W. W. et al., "Novell Colossal Magnetonresistive Thin Film Nonvolatile Resistance Random Access Memory (RRAM)," IEEE IEDM 2002, pp. 193-196.
Notice of Allowance for U.S. Appl. No. 13/026,664 dated Sep. 18, 2012.
Office Action for U.S. Appl. No. 13/471,704 dated Jul. 31, 2012.
Notice of Allowance for U.S. Appl. No. 13/471,704 dated Oct. 18, 2012.
Notice of Allowance for U.S. Appl. No. 13/026,678 dated Sep. 19, 2012.
Office Action for U.S. Appl. No. 13/026,783 dated Sep. 27, 2012.
Office Action for U.S. Appl. No. 13/026,717 dated Oct. 25, 2012.
Office Action for U.S. Appl. No. 13/026,650 dated Nov. 9, 2012.
Office Action for U.S. Appl. No. 13/026,692 dated Nov. 9, 2012.
Office Action for U.S. Appl. No. 13/026,752 dated Nov. 9, 2012.
Office Action for U.S. Appl. No. 13/026,656 dated Nov. 13, 2012.
Office Action for U.S. Appl. No. 13/026,704 dated Nov. 23, 2012.
Office Action for U.S. Appl. No. 13/397,673, dated Dec. 18, 2012.
Office Action for U.S. Appl. No. 13/026,840, dated Dec. 31, 2012.
Office Action for U.S. Appl. No. 13/026,852, dated Jan. 14, 2013.
Restriction Requirement for U.S. Appl. No. 13/026,835, dated Dec. 12, 2012.
Notice of Allowance for U.S. Appl. No. 13/026,717, dated Feb. 12, 2013.
Office Action for U.S. Appl. No. 13/471,704, dated Jan. 25, 2013.
U.S. Appl. No. 13/761,048, filed Feb. 6, 2013.
U.S. Appl. No. 13/761,057, filed Feb. 6, 2013.
U.S. Appl. No. 13/761,097, filed Feb. 6, 2013.
U.S. Appl. No. 13/761,045, filed Feb. 6, 2013.
Office Action for U.S. Appl. No. 13/026,678, dated Feb. 20, 2013.
Notice of Allowance for U.S. Appl. No. 13/026,783, dated Mar. 4, 2013.
Notice of Allowance for U.S. Appl. No. 13/026,692, dated Mar. 15, 2013.
Notice of Allowance for U.S. Appl. No. 13/026,835, dated Mar. 20, 2013.
Notice of Allowance for U.S. Appl. No. 13/026,664, dated Apr. 22, 2013.
Notice of Allowance for U.S. Appl. No. 13/026,656, dated Apr. 22, 2013.
Jagasivamani et al., "Development of a Low-Power SRAM Compiler", IEEE Press, 2001, pp. 498-501.
Liu et al., "A Flexible Embedded SRAM Compiler", IEEE Press, 2002, 3 pgs.
Sundrararajan, "OSUSPRAM: Design of a Single Port SRAM Compiler in NCSU FREEPDK45 Process", Mater of Science in Electrical Engineering, Oklahoma State University, Jul. 2010, 117 pgs.
Notice of Allowance for U.S. Appl. No. 13/026,835, dated Apr. 18, 2013.
Notice of Allowance for U.S. Appl. No. 13/026,704, dated Apr. 30, 2013.
Notice of Allowance for U.S. Appl. No. 13/026,852, dated May 10, 2013.
Notice of Allowance for U.S. Appl. No. 13/026,717, dated May 15, 2013.
Notice of Allowance for U.S. Appl. No. 13/471,704, dated May 22, 2013.
Notice of Allowance for U.S. Appl. No. 13/026,678, dated May 28, 2013.
Notice of Allowance for U.S. Appl. No. 13/026,650, dated May 30, 2013.
Restriction Requirement for U.S. Appl. No. 13/314,444, dated Jun. 7, 2013.
Restriction Requirement for U.S. Appl. No. 13/214,198, dated Jun. 13, 2013.
Notice of Allowance for U.S. Appl. No. 13/026,840, dated Jun. 13, 2013.
Restriction Requirement for U.S. Appl. No. 13/026,771, dated Jun. 13, 2013.
Notice of Allowance for U.S. Appl. No. 13/026,752, dated Jul. 1, 2013.
Restriction Requirement for U.S. Appl. No. 13/678,543, dated Jul. 8, 2013.
Office Action for U.S. Appl. No. 13/026,725, dated Jul. 19, 2013.
Notice of Allowance for U.S. Appl. No. 13/026,664, dated Jul. 22, 2013.
Notice of Allowance for U.S. Appl. No. 13/026,692, dated Jul. 23, 2013.
Notice of Allowance for U.S. Appl. No. 13/397,673, dated Jul. 30, 2013.
Notice of Allowance for U.S. Appl. No. 13/026,704, dated Aug. 2, 2013.

(56) References Cited

OTHER PUBLICATIONS

Notice of Allowance for U.S. Appl. No. 13/026,783, dated Aug. 5, 2013.
Office Action for U.S. Appl. No. 13/214,198, dated Aug. 6, 2013.
Office action for Chinese Patent Application No. 201110279954.7, dated Jul. 1, 2013.
Shen et al., "High-K Metal Gate Contact RRAM (CRRAM) in Pure 28 nm CMOS Logic Process", Electron Devices Meeting (IEDM), 2012 IEEE International, Dec. 2012, 4 pgs.
Tseng et al., "A New High-Density and Ultrasmall-Cell Size Contact RRAM (CR-RAM) with Fully CMOS-Logic-Compatible Technology and Circuits", IEEE Transactions on Electron Devices, vol. 58, Issue 1, Jan. 2011, 6 pgs.
Office Action for U.S. Appl. No. 13/026,783, dated Sep. 9, 2013.
Office Action for U.S. Appl. No. 13/314,444, dated Sep. 9, 2013.
Office Action for U.S. Appl. No. 13/026,771, dated Sep. 9, 2013.
Notice of Allowance for U.S. Appl. No. 13/026,852, dated Sep. 18, 2013.
Office Action (Ex Parte) for U.S. Appl. No. 13/678,543, dated Sep. 20, 2013.
Office Action for U.S. Appl. No. 13/835,308, dated Sep. 27, 2013.
Notice of Allowance for U.S. Appl. No. 13/026,717, dated Oct. 1, 2013.
Office Action for U.S. Appl. No. 13/954,831, dated Oct. 1, 2013.
Notice of Allowance for U.S. Appl. No. 13/026,656, dated Oct. 4, 2013.
Office Action for U.S. Appl. No. 13/214,183, dated Oct. 25, 2013.
Chua, "Many Times Programmable z8 Microcontroller", e-Gizmo.cim, Nov. 21, 2006, pp. 1-5.
Forum, Intel Multi-byte Nops, asmcommunity.net, Nov. 21, 2006, pp. 1-5.
CMOS Z8 OTP Microcontrollers Product Specification, Zilog Inc., May 2008, Revision 1, pp. 1-84.
OTP Programming Adapter Product User Guide, Zilog Inc., 2006, pp. 1-3.
Notice of Allowance for U.S. Appl. No. 13/026,852, dated Nov. 15, 2013.
Notice of Allowance for U.S. Appl. No. 13/026,835, dated Nov. 22, 2013.
Notice of Allowance for U.S. Appl. No. 13/026,725, dated Dec. 10, 2013.
Office Action for U.S. Appl. No. 13/026,783, dated Dec. 23, 2013.
Notice of Allowance for U.S. Appl. No. 13/026,771, dated Jan. 15, 2014.
Office Action for Chinese Patent Application No. 201110244362.1, dated Sep. 29, 2013.
Office Action for Chinese Patent Application No. 201110235464.7, dated Oct. 8, 2013.
Office Action for Chinese Patent Application No. 201110244400.3, dated Nov. 5, 2013.
Office Action for Chinese Patent Application No. 201110244342.4, dated Oct. 31, 2013.
Restriction Requirement for U.S. Appl. No. 13/678,541, dated Feb. 28, 2014.
Notice of Allowance for U.S. Appl. No. 13/026,840, dated Mar. 6, 2014.
Notice of Allowance for U.S. Appl. No. 13/026,840, dated Mar. 10, 2014.
Notice of Allowance of U.S. Appl. No. 13/678,543, dated Dec. 13, 2013.
Notice of Allowance for U.S. Appl. No. 13/835,308, dated Mar. 14, 2014.
Notice of Allowance for U.S. Appl. No. 13/026,835, dated Mar. 14, 2014.
Notice of Allowance for U.S. Appl. No. 13/026,725, dated Mar. 31, 2014.
Notice of Allowance for U.S. Appl. No. 13/026,852, dated Mar. 20, 2014.
Notice of Allowance for U.S. Appl. No. 13/026,771, dated Mar. 18, 2014.

Final Office Action for U.S. Appl. No. 13/214,183, dated Apr. 17, 2014.
"Embedded Systems/Mixed C and Assembly Programming", Wikibooks, Aug. 6, 2009, pp. 1-7.
Notice of Allowance for U.S. Appl. No. 13/761,097, dated Jul. 15, 2014.
Office Action for U.S. Appl. No. 13/571,797, dated Apr. 24, 2014.
Notice of Allowance for U.S. Appl. No. 13/590,044, dated Apr. 29, 2014.
Notice of Allowance for U.S. Appl. No. 13/954,831, dated May 27, 2014.
Notice of Allowance of U.S. Appl. No. 13/833,044, dated May 29, 2014.
Notice of Allowance for U.S. Appl. No. 13/761,048, dated Jun. 10, 2014.
Office Action for Taiwanese Patent Application No. 100129642, dated May 19, 2014 (with translation).
Office Action for U.S. Appl. No. 13/072,783, dated Nov. 7, 2013.
Notice of Allowance for U.S. Appl. No. 13/026,840, dated Jun. 24, 2014.
Notice of Allowance for U.S. Appl. No. 13/214,198, dated Jun. 23, 2014.
Notice of Allowance for U.S. Appl. No. 13/590,044, dated Jun. 23, 2014.
Ker et al., "MOS-bounded diodes for on-chip ESD protection in a 0.15μ shallow-trench-isolation salicided CMOS Process" International Symposium on VLSI Technology, Systems and Applications, 2003, 5 pgs.
Notice of Allowance for U.S. Appl. No. 13/840,965, dated Jun. 25, 2014.
Office Action for U.S. Appl. No. 13/970,562, dated Jun. 27, 2014.
Office Action for U.S. Appl. No. 13/835,308, dated Jun. 27, 2014.
Notice of Allowance for U.S. Appl. No. 13/288,843, dated Jul. 8, 2014.
Restriction Requirement for U.S. Appl. No. 13/678,539, dated Jul. 1, 2014.
Notice of Allowance for U.S. Appl. No. 14/231,413, dated Jul. 18, 2014.
Notice of Allowance for U.S. Appl. No. 13/590,044, dated Jul. 23, 2014.
Restriction Requirement for U.S. Appl. No. 13/833,067, dated Jul. 11, 2014.
Notice of Allowance for U.S. Appl. No. 13/954,831, dated Aug. 4, 2014.
Restriction Requirement for U.S. Appl. No. 13/678,544, dated Aug. 1, 2014.
Notice of Allowance for U.S. Appl. No. 13/761,097, dated Jul. 25, 2014.
Ex parte Quayle for U.S. Appl. No. 13/761,057, dated Aug. 8, 2014.
Final Office Action for U.S. Appl. No. 13/314,444, dated May 14, 2014.
Corrected Notice of Allowability for U.S. Appl. No. 13/288,843, dated Aug. 19, 2014.
Office Action for U.S. Appl. No. 13/590,049, dated Aug. 29, 2014.
Ex Parte Quayle for U.S. Appl. No. 13/590,047, dated Aug. 29, 2014.
Ex Parte Quayle for U.S. Appl. No. 13/590,050, dated Sep. 3, 2014.
Office Action for U.S. Appl. No. 13/678,544, dated Sep. 12, 2014.
Office Action for U.S. Appl. No. 13/678,539, dated Sep. 10, 2014.
Notice of Allowance for U.S. Appl. No. 13/288,843, dated Sep. 18, 2014.
Notice of Allowance for U.S. Appl. No. 13/761,057, dated Sep. 26, 2014.
Notice of Allowance for U.S. Appl. No. 13/833,044, dated Sep. 24, 2014.
Notice of Allowance for U.S. Appl. No. 13/314,444, dated Sep. 24, 2014.
Office Action for U.S. Appl. No. 13/761,045, dated Sep. 30, 2014.
Notice of Allowance for U.S. Appl. No. 13/835,308, dated Oct. 10, 2014.
Notice of Allowance for U.S. Appl. No. 13/571,797, dated Oct. 14, 2014.
Office Action for U.S. Appl. No. 13/833,067, dated Oct. 20, 2014.

(56) References Cited

OTHER PUBLICATIONS

Notice of Allowance for U.S. Appl. No. 14/085,228, dated Oct. 23, 2014.
Office Action for U.S. Appl. No. 13/842,824, dated Oct. 29, 2014.
Herner et al., "Vertical p-i-n Polysilicon Diode with Antifuse for stackable Field-Programmable ROM", IEEE Electron Device Letters, vol. 25, No. 5, pp. 271-273, May 2004.
Notice of Allowance for U.S. Appl. No. 13/590,049, dated Nov. 25, 2014.
Notice of Allowance for U.S. Appl. No. 13/590,047, dated Nov. 24, 2014.
Office Action for U.S. Appl. No. 13/590,044, dated Dec. 9, 2014.
Notice of Allowance for U.S. Appl. No. 13/590,050, dated Dec. 18, 2014.
Office Action for U.S. Appl. No. 14/042,392, dated Dec. 31, 2014.
Office Action for U.S. Appl. No. 14/071,957, dated Dec. 29, 2014.
International Search Report and Written Opinion for International Patent Application No. PCT/US/2014/056676, dated Dec. 19, 2014.
Office Action for U.S. Appl. No. 14/493,083, dated Jan. 8, 2015.
Office Action for Chinese Patent Application No. 2011102443903, dated Dec. 16, 2014 (with translation).
Notice of Allowance for U.S. Appl. No. 13/970,562, dated Jan. 23, 2015.
Notice of Allowance for U.S. Appl. No. 14/493,069, dated Feb. 17, 2015.
Notice of Allowance for U.S. Appl. No. 14/085,228, dated Feb. 18, 2015.
Notice of Allowance for U.S. Appl. No. 13/761,045, dated Feb. 18, 2015.
Notice of Allowance for U.S. Appl. No. 14/231,404, dated Jan. 22, 2015.
Notice of Allowance for U.S. Appl. No. 14/021,990, dated Dec. 9, 2014.
Final Office Action for U.S. Appl. No. 13/678,544, dated Feb. 15, 2015.
Office Action for U.S. Appl. No. 14/101,125, dated Mar. 6, 2015.
Hassan, "Argument for anti-fuse non-volatile memory in 28nm high-k metal gate", Feb. 15, 2011, wwwl.eeetimes.com publication.
Office Action for U.S. Appl. No. 13/026,783, dated Mar. 5, 2015.
Final Office Action for U.S. Appl. No. 13/678,539, dated Apr. 1, 2015.
Office Action for U.S. Appl. No. 14/636,155, dated Apr. 10, 2015.
Notice of Allowance for U.S. Appl. No. 14/021,990, dated Apr. 14, 2015.
Notice of Allowance for U.S. Appl. No. 13,842,824, dated Apr. 14, 2015.
Notice of Allowance for U.S. Appl. No. 14/071,957, dated Apr. 14, 2014.
Notice of Allowance for U.S. Appl. No. 14/231,404, dated Apr. 17, 2015.
Notice of Allowance for U.S. Appl. No. 13/590,444, dated May 12, 2015.
Notice of Allowance for U.S. Appl. No. 13/072,783, dated May 13, 2015.
Notice of Allowance for U.S. Appl. No. 13/833,067, dated Jun. 5, 2015.
Office Action for U.S. Appl. No. 13/314,444, dated Dec. 10, 2014.
Final Office Action for U.S. Appl. No. 13/026,783, dated Jul. 30, 2015.
Notice of Allowance for U.S. Appl. No. 14/553,874, dated Aug. 10, 2015.
Office Action for U.S. Appl. No. 14/500,743, dated Aug. 17, 2015.
Notice of Allowance for U.S. Appl. No. 14/042,392, dated Aug. 21, 2015.
Office Action for U.S. Appl. No. 14/485,696, dated Aug. 20, 2015.
Notice of Allowance for U.S. Appl. No. 14/493,083, dated Aug. 27, 2015.
Office Action for U.S. Appl. No. 13/678,539, dated Sep. 16, 2015.
Office Action for U.S. Appl. No. 14/507,691, dated Oct. 30, 2015.
Final Office Action for U.S. Appl. No. 14/101,125, dated Nov. 17, 2015.
Notice of Allowance for U.S. Appl. No. 13/072,783, dated Oct. 27, 2015.
Office Action for U.S. Appl. No. 14/792,479, dated Aug. 28, 2015.
Notice of Allowance for U.S. Appl. No. 14/500,743, dated Dec. 2, 2015.
Notice of Allowance for U.S. Appl. No. 14/636,155, dated Dec. 4, 2015.
Notice of Allowance for U.S. Appl. No. 14/071,957, dated Dec. 4, 2015.
Notice of Allowance for U.S. Appl. No. 13/678,544, dated Feb. 12, 2016.
Office Action for U.S. Appl. No. 14/749,392, dated Feb. 25, 2016.
Office Action for U.S. Appl. No. 14/940,012, dated Feb. 26, 2016.
Notice of Allowance for U.S. Appl. No. 14/485,698, dated Mar. 1, 2016.
Notice of Allowance for U.S. Appl. No. 14/507,691, dated Mar. 15, 2016.
Final Office Action for U.S. Appl. No. 13/314,444, dated Dec. 8, 2011.
Final Office Action for U.S. Appl. No. 13/678,539, dated Apr. 8, 2016.
Notice of Allowance for U.S. Appl. No. 14/545,775, dated Apr. 12, 2016.
Final Office Action for U.S. Appl. No. 14/101,125, dated Apr. 21, 2016.
Notice of Allowance for U.S. Appl. No. 14/500,743, dated Apr. 26, 2016.
Notice of Allowance for U.S. Appl. No. 14/749,392, dated Jun. 27, 2016.
Notice of Allowance for U.S. Appl. No. 14/940,012, dated Jul. 15, 2016.
Office Action for U.S. Appl. No. 14/985,095, dated Jul. 21, 2016.
Notice of Allowance for U.S. Appl. No. 13/314,444, dated Aug. 5, 2016.
Notice of Allowance for U.S. Appl. No. 14/485,696, dated Sep. 21, 2016.
Notice of Allowance for U.S. Appl. No. 15/076,460, dated Dec. 5, 2016.
Final Office Action for U.S. Appl. No. 14/101,125, dated Dec. 14, 2016.
Office Action for U.S. Appl. No. 15/297,922, dated Dec. 23, 2016.
Office Action for U.S. Appl. No. 15/270,287, dated Dec. 23, 2016.
Final Office Action for U.S. Appl. No. 13/678,539, dated Feb. 8, 2017.
Notice of Allowance for U.S. Appl. No. 15/076,460, dated Mar. 15, 2017.
Office Action for U.S. Appl. No. 15/422,266, dated Mar. 17, 2017.
Office Action for U.S. Appl. No. 15/365,584, dated Apr. 21, 2017.
Notice of Allowance for U.S. Appl. No. 14/485,696, dated May 25, 2017.
Notice of Allowance for U.S. Appl. No. 14/101,125, dated Jul. 10, 2017.
Notice of Allowance for U.S. Appl. No. 15/076,460, dated Jul. 20, 2017.
Final Office Action for U.S. Appl. No. 14/485,698, dated Jul. 24, 2017.
Renewed Final Office Action for U.S. Appl. No. 14/485,698, dated Aug. 2, 2017.
Office Action for Taiwanese Patent Application No. 102145000, dated Jul. 7, 2017. (with translations).
Office Action for Chinese Patent Application No. 102610272 A, dated Jul. 10, 2017. (with translations).
Final Office Action for U.S. Appl. No. 15/422,266, dated Sep. 12, 2017.
Notice of Allowance for U.S. Appl. No. 15/365,584, dated Sep. 13, 2017.
Notice of Allowance for U.S. Appl. No. 14/485,698, dated Oct. 16, 2017.
Final Office Action for U.S. Appl. No. 15/422,266, dated Jan. 22, 2018.

(56) References Cited

OTHER PUBLICATIONS

Notice of Allowance for U.S. Appl. No. 14/485,698, dated Feb. 15, 2018.
Extended Search Report for EP Application No. 14901820, dated Jun. 23, 2017.
Office Action for U.S. Appl. No. 15/884,362, dated May 4, 2018.
Extended European Search Report for EP Application No. 18151106.4, dated Apr. 6, 2018.
Tonti, "Reliability, design qualification, and prognostic opportunity of in due E-Fuse" Prognostics and Heath Management IEEE Conference Jun. 20, 2011, pp. 1-7.
Office Action for U.S. Appl. No. 15/805,109, dated May 29, 2018.
Office Action for U.S. Appl. No. 14/485,698, dated Jun. 21, 2018.
Notice of Allowance for U.S. Appl. No. 15/884,362 dated Sep. 19, 2018.
Notice of Allowance for U.S. Appl. No. 15/708,116 dated Oct. 26, 2018.
Notice of Allowance for U.S. Appl. No. 14/485,698 dated Dec. 10, 2018.
Office Action for U.S. Appl. No. 15/953,422, dated Jan. 28, 2019.

\* cited by examiner

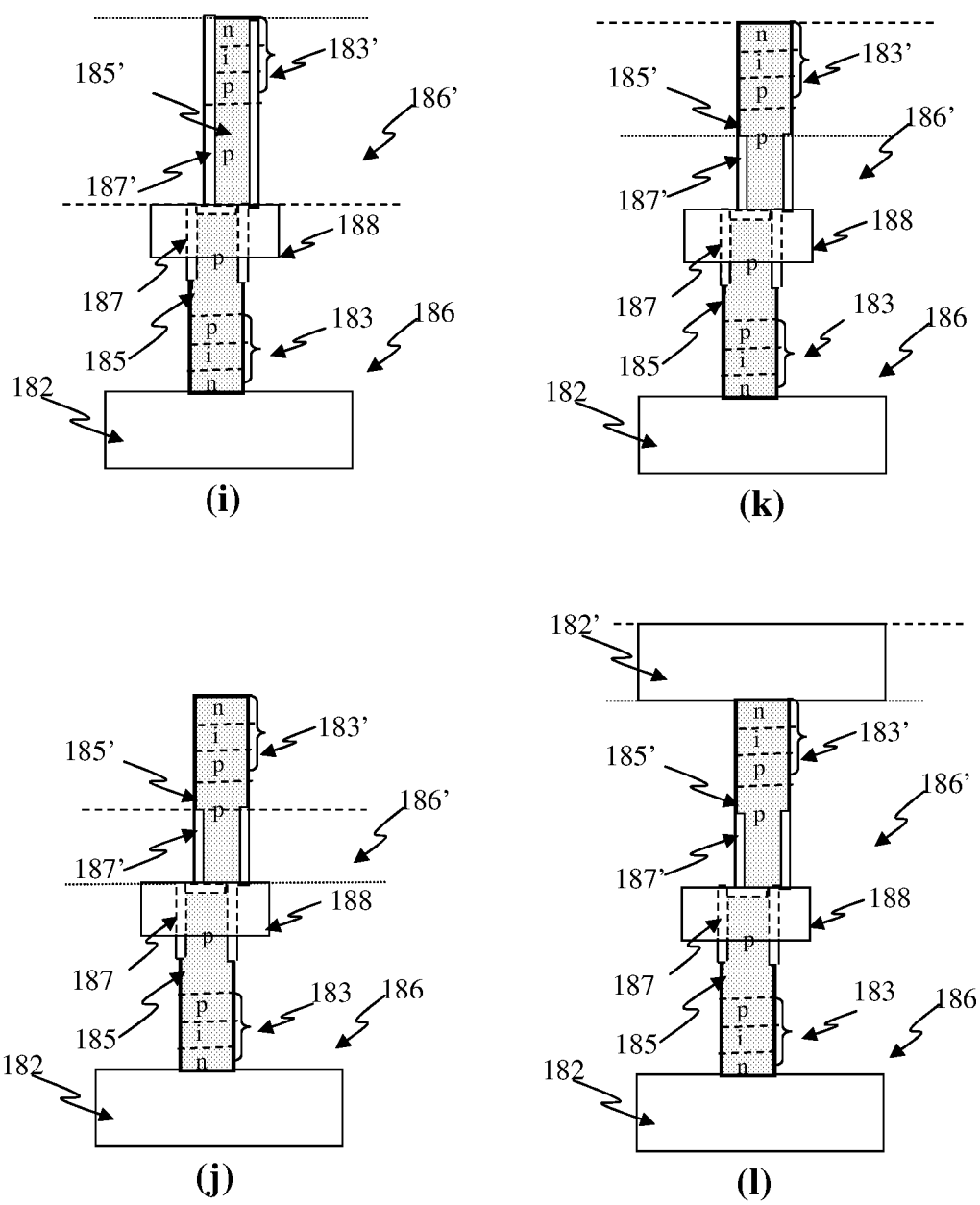
FIG. 11 (Con't)

PROGRAMMABLE RESISTIVE DEVICE AND MEMORY USING DIODE AS SELECTOR

CROSS-REFERENCE TO RELATED APPLICATIONS

This application is a continuation of U.S. patent application Ser. No. 14/101,125, filed on Dec. 9, 2013 and entitled "PROGRAMMABLE RESISTIVE DEVICE AND MEMORY USING DIODE AS SELECTOR," which is hereby incorporated herein by reference, and which in turn claims priority benefit of: (i) U.S. Provisional Patent Application No. 61/734,945, filed on Dec. 7, 2012 and entitled "CIRCUIT AND SYSTEM OF 3D PROGRAMMABLE RESISTIVE DEVICE AND MEMORY USING DIODE AS SELECTOR," which is hereby incorporated herein by reference; and (ii) U.S. Provisional Patent Application No. 61/880,916, filed on Sep. 21, 2013 and entitled "CIRCUIT AND SYSTEM OF USING JUNCTION DIODE AS PROGRAM SELECTOR FOR ELECTRICAL FUSES WITH EXTENDED AREA FOR ONE-TIME PROGRAMMABLE DEVICES," which is hereby incorporated herein by reference.

BACKGROUND OF THE INVENTION

A programmable resistive device is generally referred to a device with a resistance state that may change by means of programming. Resistance states can also be determined by resistance values. For example, a resistive device can be a One-Time Programmable (OTP) device, such as electrical fuse, and the programming means can apply a high voltage to induce a high current to flow through the OTP element. When a high current flows through an OTP element by turning on a program selector, the OTP element can be programmed, or burned into a high or low resistance state (depending on either fuse or anti-fuse).

An electrical fuse is a common OTP element which is a programmable resistive device that can be constructed from a segment of interconnect, such as polysilicon, silicided polysilicon, silicide, metal, metal alloy, or some combination thereof. The metal can be aluminum, copper, or other transition metals. One commonly used electrical fuse is a CMOS gate, fabricated in silicided polysilicon, used as an interconnect. The electrical fuse can also be one or more contacts or vias instead of a segment of interconnect. A high current may blow the contact(s) or via(s) into a very high resistance state. The electrical fuse can be an anti-fuse, where a high voltage makes the resistance lower, instead of higher. The anti-fuse can consist of one or more contacts or vias with an insulator in between. The anti-fuse can also be a CMOS gate coupled to a CMOS body with a thin gate oxide as insulator.

A programmable resistive device can be a reversible resistive device that can be programmed into a digital logic value "0" or "1" repetitively and reversibly. The programmable resistive device can be fabricated from phase change material, such as Germanium (Ge), Antimony (Sb), and Tellurium (Te) with composition $Ge_2Sb_2Te_5$ (GST-225) or GeSbTe-like materials including compositions of Indium (In), Tin (Sn), or Selenium (Se). Another phase change material can include a chalcogenide material such as AgInSbTe. The phase change material can be programmed into a high resistance amorphous state or a low resistance crystalline state by applying a short and high voltage pulse or a long and low voltage pulse, respectively.

Another type of reversible resistive device is a class of memory called Resistive RAM (RRAM), which is a normally insulating dielectric, but can be made conducting through filament, defects, metal migration, etc. The dielectric can be binary transition metal oxides such as NiO or $TiO2$, perovskite materials such as $Sr(Zr)TiO3$ or PCMO, organic charge transfer complexes such as CuTCNQ, or organic donor-acceptor systems such as Al AIDCN. As an example, RRAM can have cells fabricated from metal oxides between electrodes, such as Pt/NiO/Pt, TiN/TiOx/HfO2/TiN, TiN/ZnO/Pt, or W/TiN/SiO2/Si, etc. The resistance states can be changed reversibly and determined by polarity, magnitude, duration, voltage/current-limit, or the combinations thereof to generate or annihilate conductive filaments. Another programmable resistive device similar to RRAM is a Conductive Bridge RAM (CBRAM) that is based on electro-chemical deposition and removal of metal ions in a thin solid-state electrolyte film. The electrodes can be an oxidizable anode and an inert cathode and the electrolyte can be Ag- or Cu-doped chalcogenide glass such as GeSe, $Cu2S$, or GeS, etc. The resistance states can be changed reversibly and determined by polarity, magnitude, duration, voltage/current-limit, or combinations thereof to generate or annihilate conductive bridges. The programmable resistive device can also be an MRAM (Magnetic RAM) with cells fabricated from magnetic multi-layer stacks that construct a Magnetic Tunnel Junction (MTJ). In a Spin Transfer Torque MRAM (STT-MRAM) the direction of currents applied to an MTJ determines parallel or anti-parallel states, and hence low or high resistance states.

A conventional programmable resistive memory cell 10 is shown in FIG. 1(a). The cell 10 consists of a Programmable Resistive Element (PRE) 11 and an NMOS program selector 12. The resistive element 11 is coupled to the drain of the NMOS 12 at one end, and coupled to a high voltage V+ at the other end. The gate of the NMOS 12 is coupled to a select signal (Sel), and the source is coupled to a low voltage V−. When a high voltage is applied to V+ and a low voltage to V−, the resistive cell 10 can be programmed by raising the select signal (Sel) to turn on the NMOS 12. One of the most common resistive elements is a silicided polysilicon, the same material and fabricated at the same time as a MOS gate. The size of the NMOS 12, as program selector, needs to be large enough to deliver the required program current for a few microseconds. The program current for a silicided polysilicon is normally between a few milliamps for a fuse with width of 40 nm to about 20 mA for a fuse with width about 0.6 um. As a result, the cell size of an electrical fuse using silicided polysilicon tends to be very large. The resistive cell 10 can be organized as a two-dimensional array with all Sel's and V−'s in a row coupled as wordlines (WLs) and a ground line, respectively, and all V+'s in a column coupled as bitlines (BLs).

Another programmable resistive device 20 is shown in FIG. 1(b). The programmable resistive cell 20 has a Programmable Resistive Element (PRE) 21 and a diode as selector 22. The PRE 21 is coupled between an anode of the diode 22 and a high voltage V+. A cathode of the diode 22 is coupled to a low voltage V−. By applying a proper voltage between V+ and V− for a proper duration of time, the PRE 21 can be programmed into high or low resistance states, depending on voltage and duration. The programmable resistive cell 20 can be organized as a two dimensional array with all V−'s in a row coupled as wordline bars (WLBs), and all V+'s in a column coupled as bitlines (BLs).

FIG. 1(c) shows one embodiment of a conventional MRAM cell 310 using diodes 317 and 318 as program selectors in accordance with one embodiment. The MRAM cell 310 in FIG. 1(c) is a three-terminal MRAM cell. The MRAM cell 310 has an MTJ 311, including a free layer stack 312, a fixed layer stack 313, and a dielectric film 319 in between, and the two diodes 317 and 318. The free layer stack 312 is coupled to a supply voltage V, and coupled to the fixed layer stack 313 the dielectric film 319 which can be through a metal oxide such as $Al_2O_3$ or MgO. The diode 317 has the N terminal coupled to the fixed layer stack 313 and the P terminal coupled to V+ for programming a 1. The diode 318 has the P terminal coupled to the fixed layer stack 313 and the N terminal coupled to V− for programming a 0. If V+ voltage is higher than V, a current flows from V+ to V to program the MTJ 311 into state 1. Similarly, if V− voltage is lower than V, a current flows from V to V− to program the MTJ 311 into state 0. During programming, the other diode is supposedly cutoff. For reading, V+ and V− can be both set to 0V and the resistance between node V and V+/V− can be sensed to determine whether the MTJ 311 is in state 0 or 1. The cathode of diode 318 can be coupled to the anode of the diode 317 to constitute a two-terminal MRAM cell in another embodiment.

FIG. 2 shows a conventional 3D structure of anti-fuse cells built in a pillar of a cross-over between two layers of conductors in a vertical structure. See S. B. Herner et al, "Vertical p-i-n Polysilicon Diode with Anti-fuse for Stackable Field-Programmable ROM," IEEE Elec. Dev. Lett. Vol. 25, No. 5, May, 2004. There are three layers of conductors running in approximately perpendicular directions. A pillar is built at a cross-over of two adjacent conductors. A p-i-n diode and a thin dielectric film of SiO2 are built inside the pillar to act as an anti-fuse. The fabrication processes involve building very complicated p-i-n diodes, dielectric stacks, and patterning. Special metals such as Tungsten are used in each layer of the conductors. The processing technology is quite different from the standard logic process. Moreover, the anti-fuse requires very high program voltage with large current to breakdown dielectrics, has wide postprogram resistance distribution, and sometimes has reliability issues. In the advanced CMOS technologies beyond 40 nm, the nanometer devices cannot sustain voltage higher than 4.0V, not to mention about requiring large areas to build high voltage devices and charge pumps.

Therefore, there is a need for an invention to build high density programmable resistive devices that provide improved coupling between Programmable Resistive Devices (PRDs) with more reliability, lower voltage, and more CMOS compatible processes.

SUMMARY

Embodiments of Programmable Resistive Device (PRD) cells with coupling between PRDs built in the contact pillars of crossovers of multiple-layer conductor arrays are disclosed. The programmable resistive devices can be fabricated in standard CMOS logic compatible processes with minimum mask increments to reduce cell size and cost.

A Programmable Resistive Device (PRD) includes one Programmable Resistive Element (PRE) and one diode selector built in a contact/via pillar at a crossover of two conductor lines. In one embodiment, the Programmable Resistive Element (PRE) or diode of one 3D PRD can be coupled to a PRE or diode of another PRD in a single-diode PRD cell. In another embodiment, a PRE can be shared between two PRDs in a vertical or horizontal direction in a 3D PRD array to create a dual-diode PRD cell. The two diodes can conduct currents in the opposite directions for programming 0 and 1, respectively. The former can be applied to electrical fuse, PCRAM (Phase-Change RAM), or unipolar-switch RRAM (Resistive RAM). The latter can be applied to MRAM (Magnetic RAM) or bipolar-switch RRAM. A Programmable Resistive Device (PRD) can use a p-i-n or P/N diode as selector and a Programmable Resistive Element (PRE) built vertically inside a contact pillar. Contact pillars can be constructed in the crossovers of at least two conductor arrays in at least two vertical planes running in substantially perpendicularly directions. There can be more than two conductor layers to construct a plural of memory arrays on top of each other in a single integrated circuit. The programmable resistive element (PRE) can be an electrical fuse for One-Time Programmable (OTP) memory, or can be a phase-change material or resistance change film for building Phase Change RAM (PCRAM) or Resistive RAM (RRAM), respectively, or can be a Magnetic Tunnel Junction (MTJ) for building Magnetic RAM (MRAM). Because the cell size only depends on the pitches of two cross-over conductors (i.e. 4F2 cell where F stands for Figure size), and the conductors can be stacked vertically in multiple layers (i.e. k+1 layers), the effective cell size is 4F2/k for single-diode PRD cells and 4F2/(2k) for dual-diode PRD cells, thus, costs can be reduced substantially for variously applications, such as embedded applications.

The invention can be implemented in numerous ways, including as a method, system, device, or apparatus (including computer readable medium). Several embodiments of the invention are discussed below.

As a Programmable Resistive Device (PRD) memory, one embodiment can, for example, include a plurality of PRD cells. At least one of the PRD cells comprises at least one PRD structure including at least a diode and/or a Programmable Resistive Element (PRE) fabricated in a contact hole at crossovers of a plurality of first conductor lines and a plurality of second conductor lines located in more than two vertical layers.

As a programmable resistive memory, one embodiment can, for example, include a plurality of programmable resistive devices built at a cross-over of at least two arrays of conductors lines stacked in at least two vertical layers. At least one PRE or diode of at least one PRD can be coupled to a PRE or diode of another PRD in at least one PRD cell in one embodiment. At least one PRE of one PRD can be shared between two PRDs to create a functional PRD cell in another embodiment. With a shared PRE, the two diodes in two PRDs can conduct current in the opposite directions to construct a dual-diode PRD cell. At least one of the programmable resistive devices can include a programmable resistive element coupled to a first conductor line, and a diode including at least a first active region and a second active region. The first active region can have a first type of dopant and the second region can have a second type of dopant. The first active region can provide a first terminal of the diode and the second active region can provide a second terminal of the diode. One terminal of the diode can be coupled to the programmable resistive element and the other terminal of the diode can be coupled to a second or a third conductor line. Both the diode and the programmable resistive element can reside in a contact pillar at a cross-over of the first and second conductor lines. At least one of the conductor lines can share the same metal scheme as in a circuit outside of the memory array in CMOS processes. Between the first and second regions of the diode can be built with a layer of material (e.g., a layer of unintentionally doped or slightly doped with the first or second type of dopant) to increase a diode's breakdown voltage. The resistive element can be configured to be programmable by applying voltages to the first, second, and/or third supply voltage lines to thereby change the resistance into a different logic state.

As an electronics system, one embodiment can, for example, include at least a processor, and a programmable resistive memory operatively connected to the processor. The programmable resistive memory can include at least a plurality of programmable resistive devices, where at least one of the programmable resistive devices includes at least a diode and a Programmable Resistive Element (PRE) being fabricated in a contact hole at crossovers of a plurality of first conductor lines and a plurality of second conductor lines located in more than two vertical layers.

As an electronics system, one embodiment can, for example, include at least a processor, and a programmable resistive memory operatively connected to the processor. The programmable resistive memory can include at least a plurality of programmable resistive device cells (PRD cells) for providing data storage built at a cross-over of at least two arrays of conductor lines stacked in at least two vertical layers. At least one PRE or diode of the at least one PRD can be coupled to a PRE or diode of another PRD in at least one PRD cell according to one embodiment. At least one PRE of one PRD can be shared between two PRDs to create a functional PRD cell in another embodiment. With a shared PRE, the two diodes in two PRDs can conduct current in the opposite directions for programming into 0 or 1, respectively, to construct a dual-diode PRD cell. Each of the programmable resistive devices (PRDs) can include at least a programmable resistive element coupled to a first conductor line, and a diode including at least a first active region and a second active region. The first active region can have a first type of dopant and the second region can have a second type of dopant. The first active region can provide a first terminal of the diode and the second active region can provide a second terminal of the diode. One active region can be coupled to the programmable resistive element and the other active region can be coupled to a second or a third conductor line. At least one of the conductor lines can share the same metal scheme as in a circuit outside of the memory array in CMOS processes. Both the diode and the programmable resistive element can reside in a contact pillar at the cross-over of the first and second/third conductor lines. Between the first and second regions of the diode can be built with a layer of material (e.g., a layer of unintentionally doped or slightly doped with the first or second type of dopants) to increase the diode's breakdown voltage. The programmable resistive element can be configured to be programmable by applying voltages to the first, second and/or the third conductor lines to thereby change the resistance into a different logic state.

As a method for providing a programmable resistive memory, one embodiment can, for example, include at least providing a plurality of programmable resistive device (PRD) cells built at the cross-over of at least two arrays of conductor lines stacked in at least two vertical layers, and programming a logic state into at least one of the Programmable Resistive Device (PRD) cells by applying voltages to conductor lines. The at least one of the programmable resistive device cells can include at least (i) a programmable resistive element coupled to a first conductor line in one end and coupled to at least one diode in another end, (ii) the at least one diode including at least a first active region and a second active region, having a first and second types of dopant, respectively, and coupled to a second or third conductor line, and (iii) at least one Programmable Resistive Element (PRE) coupled to a diode or PRE of another PRD in a single-diode PRD cell or shared between two PRDs with the diodes conducting currents in the opposite directions for programming into 0 or 1, respectively, in a dual-diode PRD cell. At least one of the conductor lines can share the same metal scheme as in a circuit outside of the memory arrays in CMOS processes. Both the diode and the programmable resistive element can reside in a contact pillar at the cross-over of the first and second/third conductor lines. Between the first and the second active region of the diode, there can be a layer of material (e.g., a layer of unintentionally doped or slightly doped with the first or second type of dopant) to increase the diode's breakdown voltage.

As a programmable memory device, one embodiment can, for example, include an electrical fuse, where the electrical fuse is configured to be programmable by applying a plurality of voltage or current pulses to with progressive resistance changes, so as to change the electrical fuse to a different logic state.

As a method for programming an electrical fuse for a programmable memory device, one embodiment can, for example, include at least: determining a program current to program the electrical fuse, wherein the program current is less than a critical current level that would cause rupture of the electrical fuse; and programming the electrical fuse using a plurality of pulses of the program current or a voltage derived therefrom.

BRIEF DESCRIPTION OF THE DRAWINGS

The present invention will be readily understood by the following detailed descriptions in conjunction with the accompanying drawings, wherein like reference numerals designate like structural elements, and in which.

DETAILED DESCRIPTION OF EMBODIMENTS OF THE INVENTION

The present invention relates to programmable memory devices, such as programmable resistive devices for use in memory arrays, built in contact pillars at the cross-over of multiple-layer conductors.

Embodiments disclosed herein can use at least two arrays of conductor lines in at least two vertical layers to build a Programmable Resistive Device (PRD) in at least one crossover of the conductor lines. The conductor lines can run in substantially perpendicular directions in alternative layers. A programmable resistive device can be built at the cross-over (i.e. contact) of two conductor lines in two vertical layers. A programmable resistive device has a programmable resistive element (PRE) coupled to one terminal of a diode built vertically and another end coupled to a first conductor. At least one PRE of one PRD can be coupled to a diode or PRE of another PRD in a single-diode PRD cell according to one embodiment. At least one PRE of two PRDs can be shared to create a dual-diode PRD cell in another embodiment. With a shared PRE, the diodes in two PRDs can conduct currents in opposite directions for programming into 0 or 1, respectively. The diode can have at least a first and a second active region, coupled to the first and second terminals of the diode, respectively. The diode can have a second terminal coupled to a second or a third conductor. The first and the second active regions can be separated by an unintentionally doped or slightly doped with a first or second type of dopants. The diode can be constructed from a semiconductor such as silicon, polysilicon, germanium, SiGe, Silicon Carbon, III-V or II-VI compounds. The PRE can be programmed only once, such as in One-Time Programmable (OTP), or can be programmed reversibly and repetitively such as in PCRAM or RRAM in single-diode PRD cells, or can be programmed based on the directions of current flow such as in MRAM, CBRAM, or some kinds of RRAM, etc. in dual-diode PRD cells. At least one of the conductor lines can share the same metal scheme as the peripheral circuits in standard CMOS processes. The process technologies are compatible with standard CMOS logic process with minimum additional masks or process steps to save costs. The programmable resistive device can also be included within an electronic system.

Figure 1A:
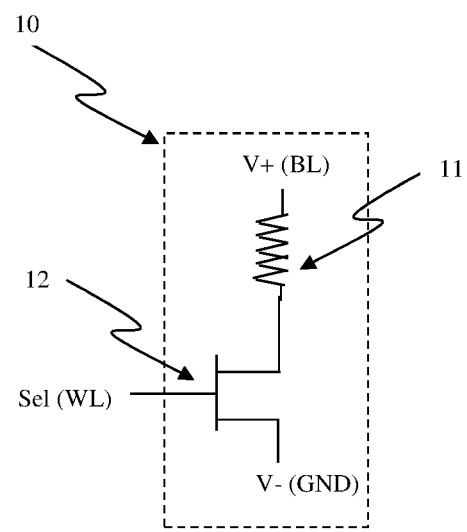
FIG. 1(a) shows a conventional programmable resistive memory cell using MOS as selector.
Figure 1B:
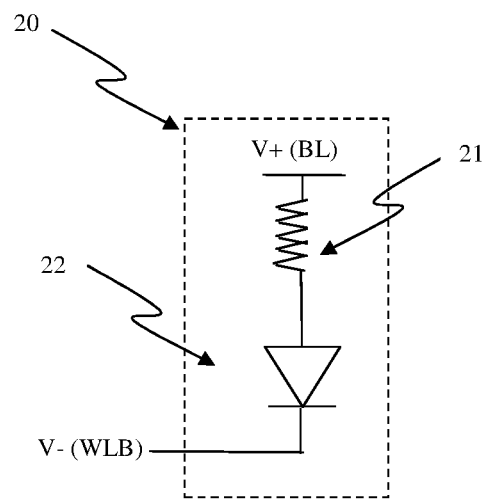
FIG. 1(b) shows another conventional programmable resistive memory cell using diode as selector.
Figure 1C:
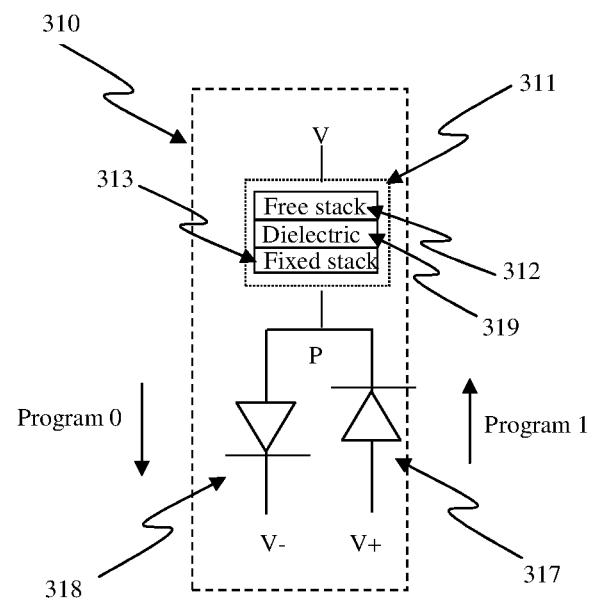
FIG. 1(c) shows a schematic of a conventional Magnetic Tunnel Junction (MTJ) in a MRAM cell using two diodes as program selectors for program 0 and 1.
Figure 2:
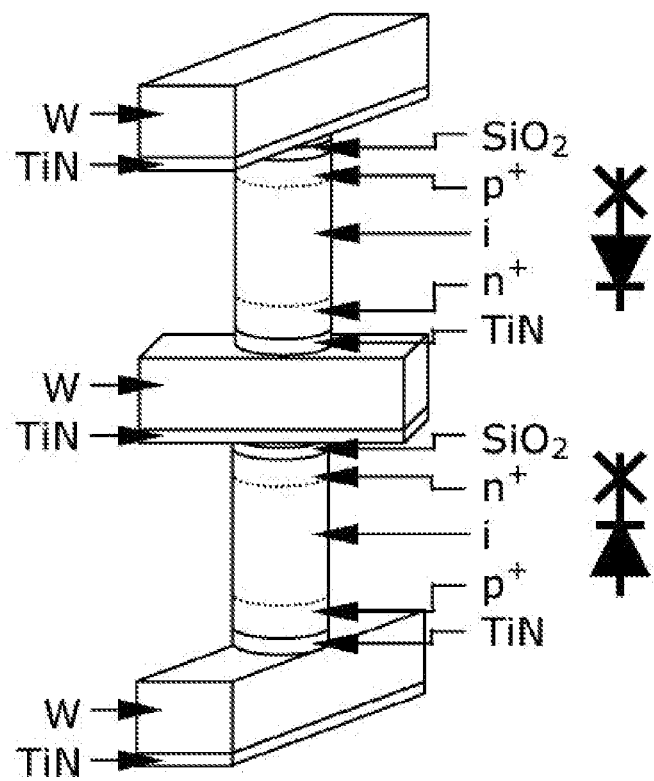
FIG. 2 shows a conventional 3D structure of anti-fuses built between two conductor layers.
Figure 3:
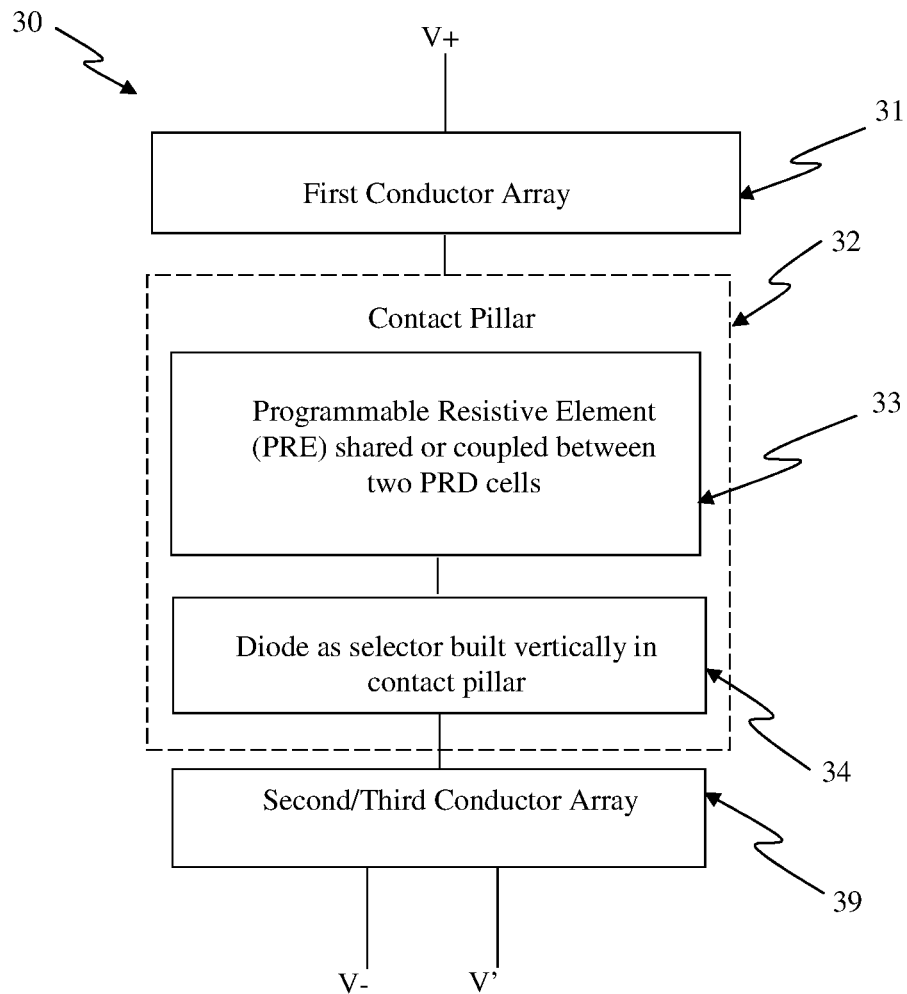
FIG. 3 shows a block diagram of a portion of a programmable resistive memory cell built in contact/via pillars with programmable resistive element shared or coupled to another programmable resistive device, according to one embodiment.

FIG. 3 shows a block diagram of a programmable resistive device cell 30 constructed from at least two conductor arrays 31 and 39 in at least two vertical layers above a silicon substrate. The conductor arrays 31 and 39 can be oriented in different directions, such as running at substantially perpendicular directions. At least one conductor layer can be fabricated at the same time as a conductor layer for the peripheral circuits of the memory. At least one contact pillar 32 can be built at the cross-over of two conductors in two conductor arrays 31 and 39. In at least one contact pillar 32, a programmable resistive element (PRE) 33 and a vertical diode 34 as selector are provided. The PRE 33 can be coupled to one conductor in the first conductor array 31. The diode has a first active region and a second active region. The first active region has a first type of dopant to serve as a first terminal of the diode. The second active region has a second type of dopant to serve as a second terminal of a diode. Between the first and the second active regions, there can be a layer of unintentionally doped or slightly doped with the first or second type of dopant to reduce the breakdown voltage or leakage current of the diode. One terminal of the diode is coupled to the PRE 33 and the other terminal is coupled to one conductor in the second or third conductor array 39.

In one embodiment, the PRE 33 of two Programmable Resistive Devices (PRDs) in vertical or horizontal direction can be coupled to a PRE or diode of another PRD. In another embodiment, the PRE 33 of two Programmable Resistive Devices (PRDs) can be shared to create a dual-diode PRD cell. The two diodes in two PRDs can conduct currents in opposite directions for programming into 0 and 1, respectively.

The PRE 33 can be a polysilicon coated with silicide on part or full of the surface. The PRE 33 can also be a layer of barrier metals, such as Ti, Ta, TaSN, TiN or TaN or full silicide. The PRE 33 can also be a thin film of phase-change material or resistance-change material to construct a PCRAM or RRAM cell in single-diode PRD cells. The PRE 33 can also be multiple-layer stacks of magnetic material to build Magnetic Tunnel Junction (MTJ) shared between two diodes in an MRAM cell to construct a dual-diode PRD cell. One conductor in the first conductor array 31 can be coupled to a first voltage supply V+ and one conductor in the second conductor array 39 can be coupled to a second voltage supply V−. In another embodiment, there can be a third conductor line in a dual-diode PRD cell that can be coupled to a third voltage supply V' in a dual-diode PRD cell. By applying a proper voltage between V+, V−, and/or V', the programmable resistive element 33 can be programmed into a different resistance state, depending on the magnitude, polarity, duration, current/voltage compliance, or combination thereof, thereby programming the memory cell 30 to store a data value (e.g., bit of data).

To reduce the costs of the 3D programmable resistive memory, at least one of the conductor lines can be fabricated at the same time as a conductor line for the peripheral circuits in FIG. 3. The first and the second/third conductor lines can be running in substantially perpendicular directions (i.e. X- and Y-directions respectively). The spaces between the first or the second conductor lines can be less than the spaces between the first or the second conductor lines for the circuits outside of the memory arrays. The spaces between at least two conductor lines in at least one conductor layer can be unequal in other embodiment. The contact holes can be substantially close to circles in the final silicon. The contact opening can be smaller than the contact opening for the circuits outside of the memory array. Two contact holes in three different vertical layers can be aligned in the same spot or can be displaced slightly in a vertical direction. In some embodiments, the PRE can be placed outside of the contact holes, though the diode as program selector can be still within the contact hole. The connectivity of the diode and the PRE can be interchangeable. The direction of the current flow in the diode can be upward or downward in other embodiments. The sharing of two programmable resistive devices can be in vertical direction or in the same plane.

Figure 4:
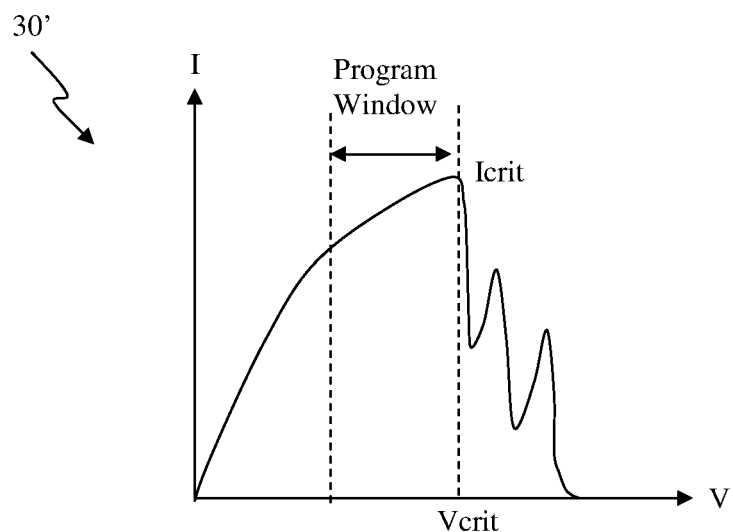
FIG. 4 shows an I-V characteristic of programming an electrical fuse built in a contact/via pillar, according to one embodiment.

An electrical fuse cell can be used as an example to illustrate the key concepts of a coupled programmable resistive device cell according to one embodiment. FIG. 4 shows an I-V characteristic 30' of programming an electrical fuse according to one embodiment. The I-V characteristic shows a voltage applied to an electrical fuse in the X-axis and the responding current is shown in the Y-axis. When the current is very low, the slope of the curve is the inversion of the initial resistance. As the current is increased, the resistance is increased due to Joule heat so that the curve bends toward the X-axis if the temperature coefficient is positive. After a critical current, Icrit, the resistance of the electrical fuse changes drastically due to rupture, decomposition, or melt. The conventional way of programming an electrical fuse is by applying a current higher than Icrit such that the programming behavior is like an explosion and the resultant resistance is highly unpredictable. On the other hand, if a programming current is below Icrit, the programming mechanism is based on electromigration solely such that the programming behavior is very controllable and deterministic. As a result, programming an electrical fuse in this method can be very reliable. The program status, whether the electrical fuse is programmed or not, is not detectable by optical microscopes or scanning electron microscopes. The window of programming an electrical fuse reliably is marked in FIG. 4. In this controlled programming method, electrical fuses can be programmable by multiple current or voltage pulses with progressive resistance changes until a satisfactory high resistance state can be reached.

In one embodiment, the fuse of one PRD can be coupled to another fuse or diode of another PRD. The PRE as a fuse element in a PRD cell can be silicon, polysilicon, silicided polysilicon, silicide, SiGe, barrier metal, or even metal. Barrier metals, such as Ti, Ta, TiSiN, TiN or TaN, can be formed between silicon and metal to prevent silicon or dopants from inter-diffusing and can also provide adhesive to the interface. Moreover, the barrier metals have low sheet resistance of 4 to 10 ohm/sq, which is a very desirable material as a fuse element in 3D PRD cells. Using full silicide, such as CoSi2, TiSi2, or NiSi2, as a fuse element is also a very desirable material in another embodiment.

FIG. 5(*a*) shows a schematic 50 of 2×2×2 fuse cell arrays in perspective view according to one embodiment. There are 8 fuse cells 54 built at the crossovers of the lines 51-1,2, 52-1,2, and 53-1,2. Lines 51-1,2 run in the X-direction, lines 52-1,2 run in the Y-direction but in a plane above the plane of lines 51-1,2, and lines 53-1,2 run in the Y-direction but in a plane below the plane of the lines 51-1,2. One of the fuse cell 54 has a fuse element 55 coupled to the line 51-2 and to the anode of a diode 56. The diode 56 has a cathode coupled to the line 52-1. To program this fuse cell 54, a high voltage can be applied to the line 51-2, and a low voltage can be applied to the line 52-1 to conduct a current flowing through the fuse element 55 and the diode 56 to program the fuse cell 54 accordingly. In one embodiment, as shown in FIG. 5(*a*), the fuse element 55 in the PRD cell 54 can be coupled to another fuse or diode in another PRD cell in the 53-1 and 53-2 plane.

FIG. 5(*b*) shows a 3D structure 50' of 2×2×2 fuse cell arrays in perspective view, corresponding to FIG. 5(*a*), according to another embodiment. There are 8 fuse cells built in the contact pillars at the crossovers of the conductor lines 51'-1,2, 52'-1,2, and 53'-1,2 in three vertical planes. Conductor lines 51'-1,2 run in the X-direction, conductor lines 52'-1,2 run in the Y-direction but in a plane above the plane of conductor lines 51'-1,2, and conductor lines 53'-1,2 run in the Y-direction but in a plane below the plane of the conductor lines 51'-1,2. As illustrated, one of the fuses cells 54' has a fuse element 55' coupled to the conductor line 51'-2 and to the anode of a diode 56'. The diode 56' has a cathode coupled to the conductor line 52'-1. To program this fuse cell 54', a high voltage can be applied to the conductor line 51'-2, and a low voltage can be applied to the conductor line 52'-1 to conduct a current flowing through the fuse element 55' and the diode 56' to program the fuse cell 54' accordingly. In one embodiment, the fuse element 55' in the PRD cell 54' can be coupled to another fuse or diode in another PRD cell in the 53'-1 and 53'-2 plane.

Figure 5A:
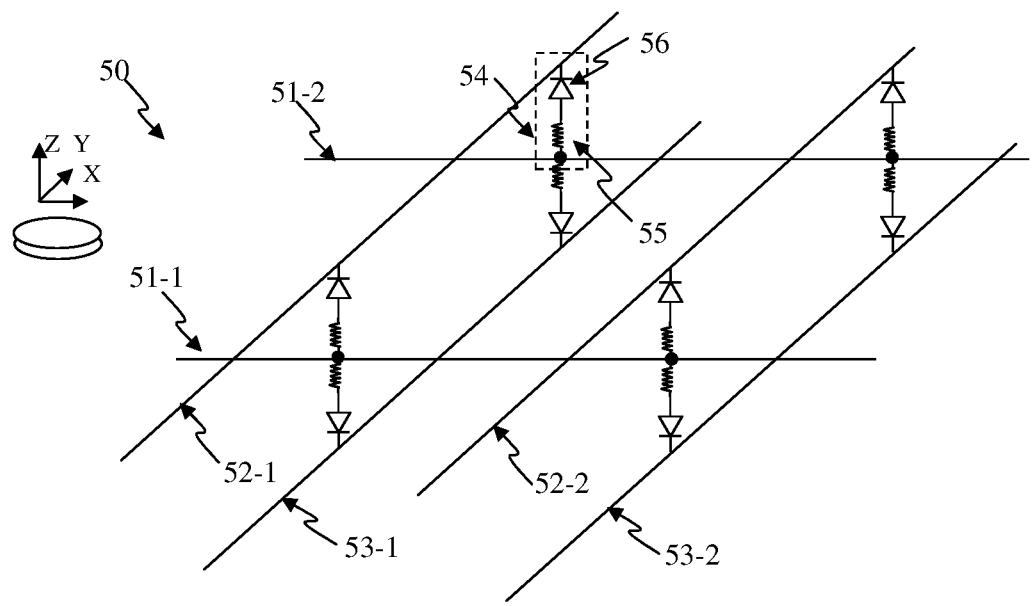
FIG. 5(a) shows a schematic in perspective view of 2×2×2 programmable resistive device cells built at the cross-over of three vertical planes, according to one embodiment.
Figure 5B:
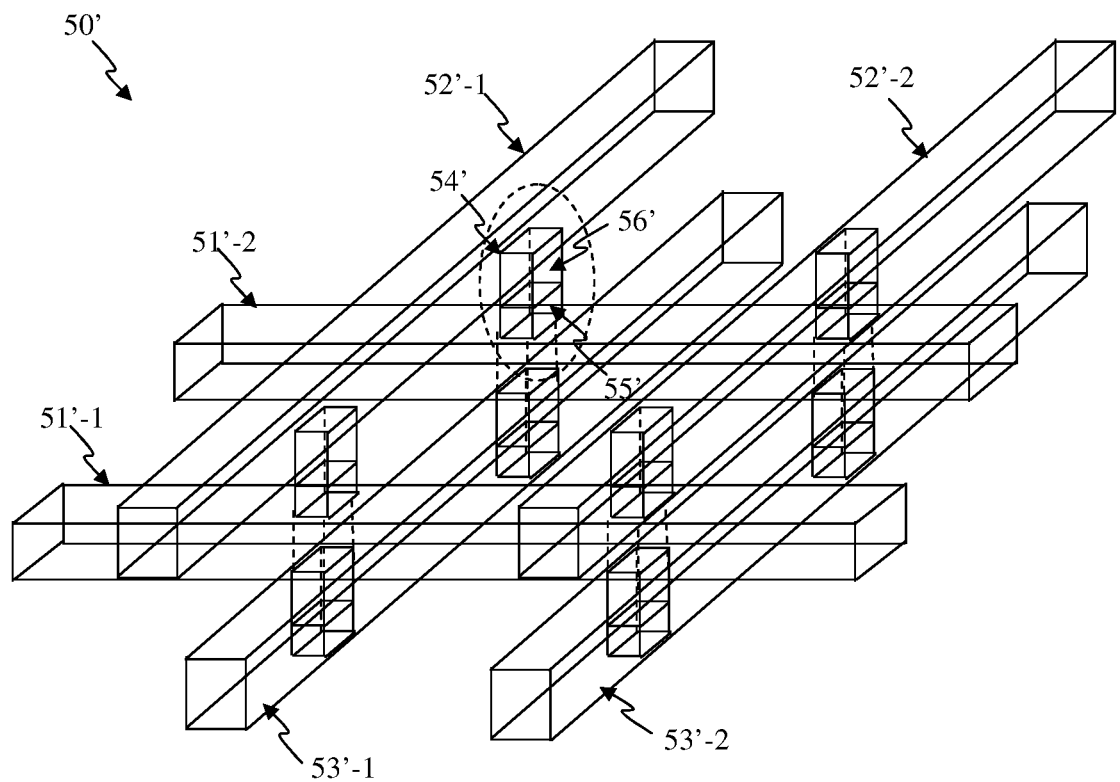
FIG. 5(b) shows a structure in perspective view of 2×2×2 programmable resistive device cells built at the cross-over of three vertical conductor layers, corresponding to FIG. 5(a), according to one embodiment.
Figure 5C:
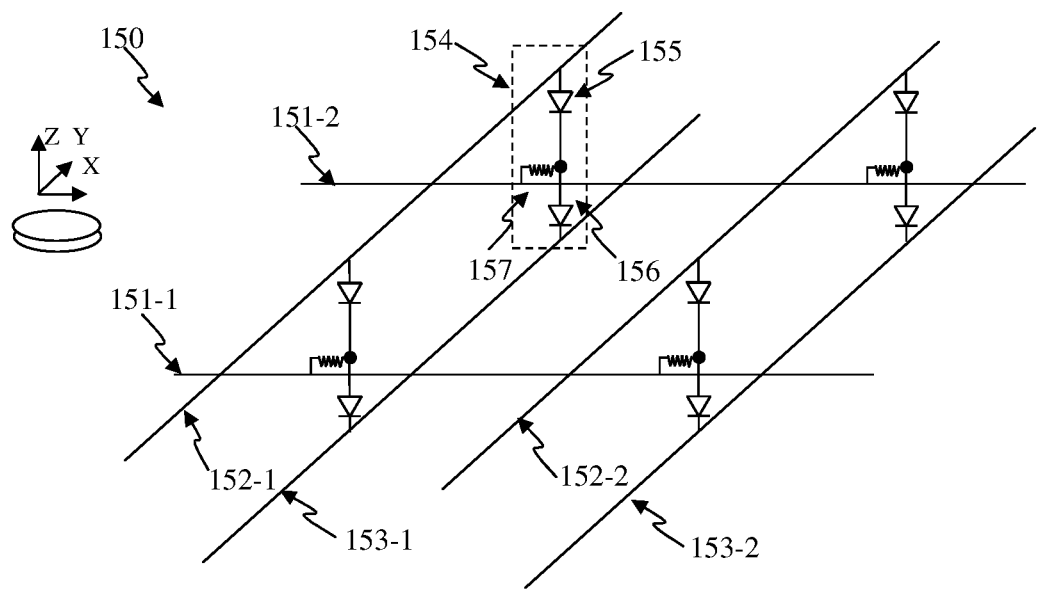
FIG. 5(c) shows a schematic in perspective view of 2×2 dual-diode programmable resistive device cells (e.g. MRAM cells) built at the cross-over of contact pillars using two vertical diodes in one cell, according to one embodiment.
Figure 5D:
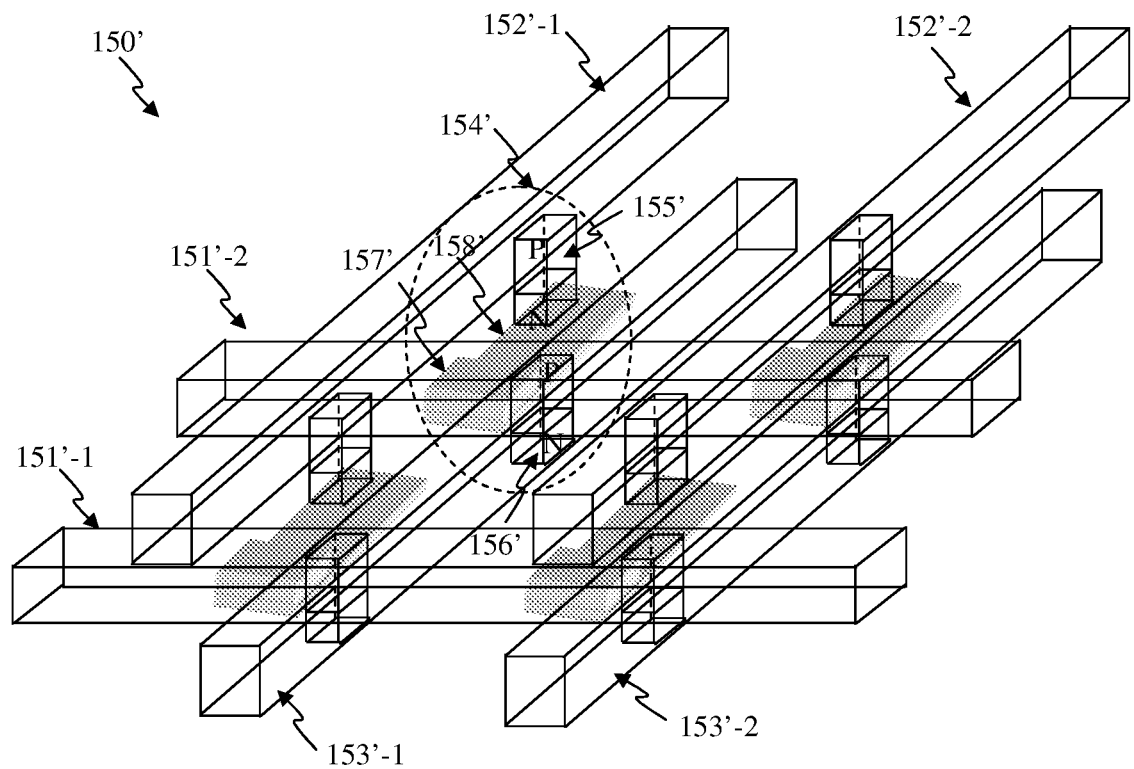
FIG. 5(d) shows a structure in perspective view of 2×2 dual-diode programmable resistive device cells (e.g. MRAM cells) built at the cross-over of contact pillars using two vertical diodes in one cell, corresponding to FIG. 5(c), according to one embodiment.

Using two diodes as program selectors for writing 0 and 1 respectively in a MRAM cell can be built inside two vertical contact pillars between three conductor layers as shown in FIGS. 5(c) and 5(d). FIG. 5(c) shows a schematic 150 in perspective view of 2×2 MRAM cell arrays according to one embodiment. The MRAM cell uses two contact pillars aligned vertically to build two diodes as program selectors for one MTJ cell. In the schematic 150, there are 4 MRAM cells built in four pairs of contact pillars at the crossovers of three arrays of lines 151-1,2, 152-1,2, and 153-1,2. The lines 151-1,2 run in the X-direction, while the lines 152-1,2 run in the Y-direction but on a plane above the plane of lines 151-1,2. The lines 153-1,2 run in the Y-direction but on a plane below the plane of lines 151-1,2. One of the MRAM cells 154 has an MTJ 157 coupled to the line 151-2 and to the anode of a diode 156 and to the cathode of a diode 155. The anode of the diode 155 is coupled to the line 152-1. The cathode of the diode 156 is coupled to the line 153-1. To program the MRAM cell 154 into a 0, a high voltage can be applied to the line 151-2, and a low voltage can be applied to the line 153-1 to conduct a current flowing through the MTJ 157 to the diode 156 to program the MTJ 157 accordingly. To program the MRAM cell 154 into a 1, a high voltage can be applied to the line 152-1, and a low voltage can be applied to the line 151-2 to conduct a current flowing through the diode 155 to the MTJ 157 to program the MTJ 157 accordingly. The MTJ 157 can be built inside the contact holes or outside of the contact holes but beneath a conductor line in other embodiment.

FIG. 5(d) shows a perspective view of a 3D structure 150' of 2×2 MRAM cell arrays according to one embodiment, corresponding to FIG. 5(c). This cell uses two contact pillars aligned vertically to build two diodes as program selectors for writing 0 and 1 respective in one MTJ cell. There are 4 MRAM cells built in four pairs of contact pillars at the crossovers of three arrays of lines 151'-1,2, 152'-1,2, and 153'-1,2. The lines 151'-1,2 run in the X-direction, while the lines 152'-1,2 run in the Y-direction but on a plane above the plane of lines 151'-1,2. The lines 153'-1,2 run in the Y-direction but on a plane below the plane of lines 151'-1,2. One of the MRAM cells 154' has an MTJ 157' coupled to the line 151'-2 and to an interconnect 158'. The interconnect 158' is coupled to the anode of a diode 156' and to the cathode of a diode 155'. The anode of the diode 155' is coupled to the line 152'-1. The cathode of the diode 156' is coupled to the line 153'-1. To program the MRAM cell 154' into a 0, a high voltage can be applied to the line 151'-2, and a low voltage can be applied to the line 153'-1 to conduct a current flowing through the MTJ 157' to the diode 156' to program the MTJ 157' accordingly. To program the MRAM cell 154' into a 1, a high voltage can be applied to the line 152'-1, and a low voltage can be applied to the line 151'-2 to conduct a current flowing through diode 155' to the MTJ 157' to program the MTJ 157' accordingly.

Figure 6A:
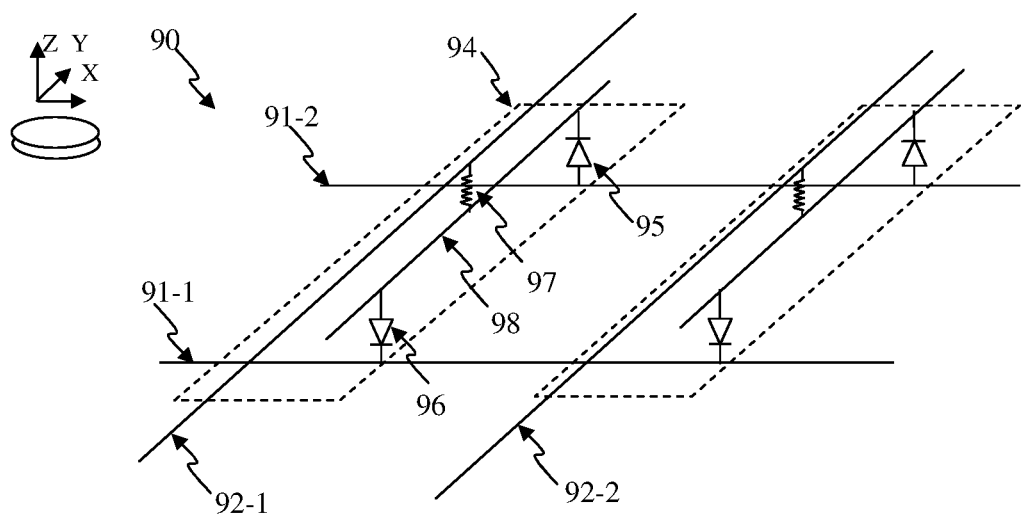
FIG. 6(a) shows a schematic in perspective view of 2×1 programmable resistive device cells (e.g. MRAM cells) using two diodes in the same plane, according to one embodiment.

FIG. 6(a) shows a schematic 90 in perspective view of 2×1 MRAM cell arrays built inside contact pillars according to one embodiment. This cell uses two contact pillars on the same horizontal plane to build two diodes as program selectors for one MTJ cell. There are 2 MRAM cells built in four contact pillars at the crossovers of two arrays of lines 91-1,2 and 92-1,2. The lines 91-1,2 run in the X-direction, while the lines 92-1,2 run in the Y-direction but on a plane above the plane of lines 91-1,2. One of the MRAM cells 94 has an MTJ 97 coupled to the line 92-1 and to an interconnect 98. The interconnect 98 is further coupled to the cathode of a diode 95 and to the anode of the diode 96. The anode of the diode 95 is coupled to the line 91-2. The cathode of the diode 96 is coupled to the line 91-1. To program the MRAM cell 94 into a 0, a high voltage can be applied to the line 92-1, and a low voltage can be applied to the line 91-1 to conduct a current flowing through the MTJ 97 to the diode 96 to program the MTJ 97 accordingly. To program the MRAM cell 94 into a 1, a high voltage can be applied to the line 91-2, and a low voltage can be applied to the line 92-1 to conduct a current flowing through the diode 95 to the MTJ 97 to program the MTJ 97 accordingly.

Figure 6B:
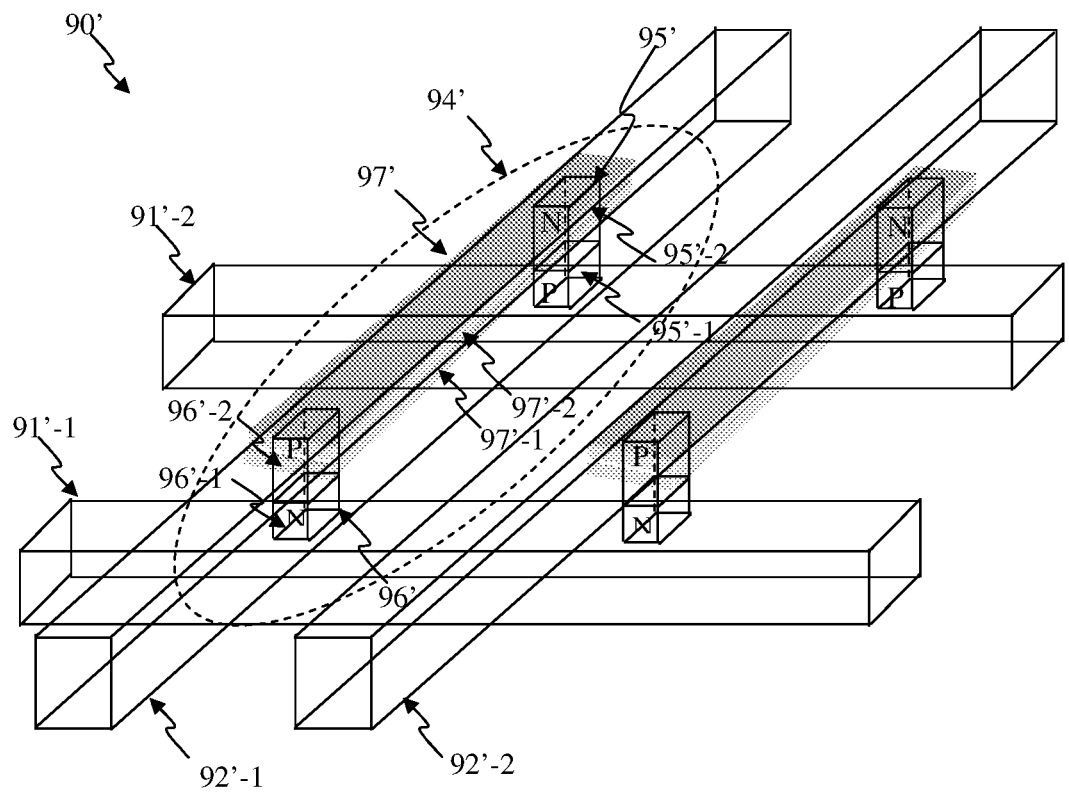
FIG. 6(b) shows a structure in perspective view of 2×1 programmable resistive device cells (e.g. MRAM cells) using two diodes in the same plane, corresponding to FIG. 6(a), according to one embodiment.

FIG. 6(b) shows a perspective view of a 3D structure 90' of 2×1 MRAM cell arrays according to one embodiment, corresponding to FIG. 6(a). This cell uses two contact pillars in the same horizontal plane to build two diodes as program selectors for one MTJ cell. There are 2 MRAM cells built in four contact pillars at the crossovers of two arrays of conductor lines 91'-1,2 and 92'-1,2. The conductor lines 91'-1,2 run in the X-direction, while the conductor lines 92'-1,2 run in the Y-direction but on a plane above the plane of conductor lines 91'-1,2. One of the MRAM cells 94' has an MTJ 97' coupled to the conductor line 92'-1. The MTJ 97' has a multiple-layer stack of free layer 97'-2 on top and another multiple-layer stack of fixed layer 97'-1 underneath. Between the free layer 97'-2 and the fixed layer 97'-1, there is a thin film of dielectric, such as Al2O3 or MgO in a sandwich structure. The fixed layer 97'-1 is further coupled to the cathode 95'-2 of a diode 95' and to the anode 96'-2 of the diode 96'. The anode 95'-1 of the diode 95' is coupled to the conductor line 91'-2. The cathode 96'-1 of the diode 96' is coupled to the conductor line 91'-1. To program the MRAM cell 94' into a 0, a high voltage can be applied to the conductor line 92'-1, and a low voltage can be applied to the conductor line 91'-1 to conduct a current flowing through the MTJ 97' to the diode 96' to program the MTJ 97' accordingly. To program the MRAM cell 94' into a 1, a high voltage can be applied to the conductor line 91'-2, and a low voltage can be applied to the conductor line 92'-1 to conduct a current flowing through diode 95' to the MTJ 97' to program the MTJ 97' accordingly.

Figure 7A:
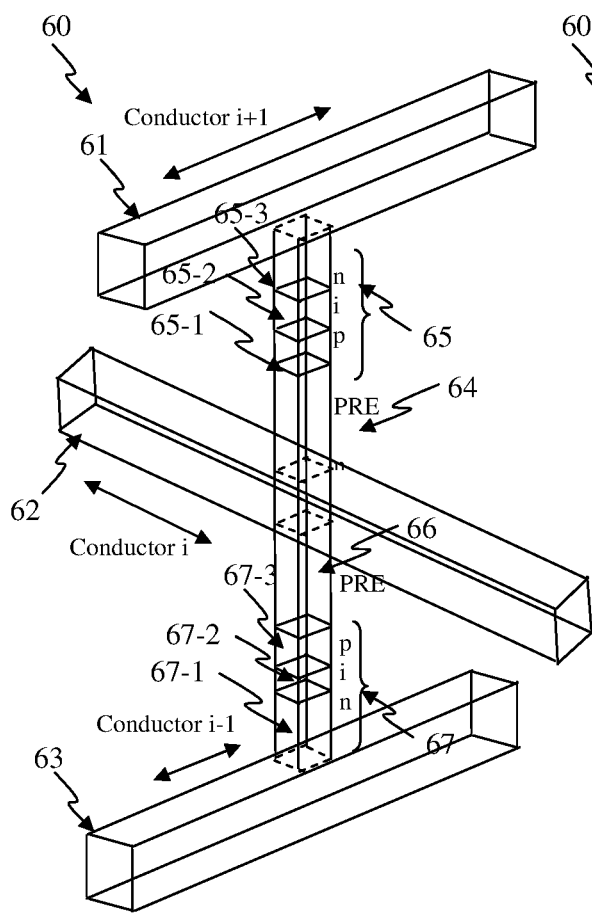
FIG. 7(a) shows a structure in perspective view of two coupled programmable resistive device cells built in two contact pairs at a cross-over of three conductor lines, according to one embodiment.

FIG. 7(a) shows a 3D perspective view of two fuse cells 60 built in contact pillars between three conductors 61, 62, and 63, corresponding to fuse arrays in FIGS. 5(a) and 5(b), according to one embodiment. In one embodiment, the conductors 61, 62, and 63 are in three vertically separated planes. The conductors 61 and 63 can run in substantially the same direction, while the conductor 62 can run in substantially perpendicular direction to the conductors 61 and 63. Two fuse cells are built in the contact pillars at the crossovers of the conductors 61 and 62, and 62 and 63, respectively. In the contact pillar of conductors 61 and 62, there builds a PRE 64 coupled to the conductor 62 and to an P+ region 65-1 of a diode 65. The diode 65 has an N+ region 65-3 coupled to a conductor 61. Between the N+ region 65-3 and P+ region 65-1, there is a region 65-2 that can be unintentionally doped or can be slightly doped with N or P type of dopant. In the contact pillar of conductors 62 and 63, there builds a PRE 66 coupled to the conductor 62 and to a P+ region 67-3 of a diode 67. The diode 67 has an N+ region 67-1 coupled to another conductor 63. Between the N+ region 67-1 and P+ region 67-3, there is a region 67-2 that can be unintentionally doped or can be slightly doped with N or P type of dopant. In this embodiment, the PRE 66 of the bottom cell coupled to the PRE 64 of the top cell to improve programming performance.

Figure 7B:
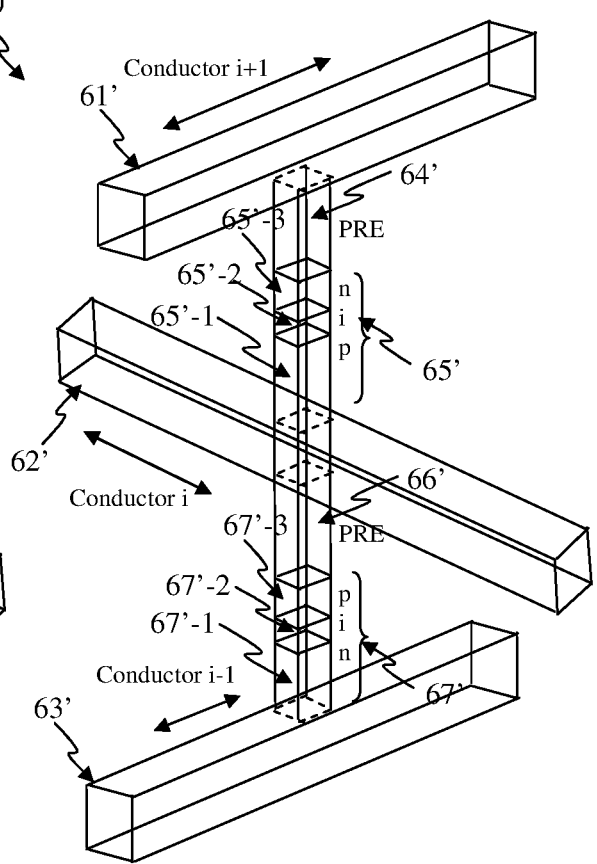
FIG. 7(b) shows a structure in perspective view of two coupled programmable resistive device cells built in two contact pairs at a cross-over of three conductor lines, according to another embodiment.

FIG. 7(b) shows a 3D perspective view of two fuse cells 60' built in contact pillars between three conductors 61', 62', and 63' according to another embodiment. The conductors 61', 62', and 63' are in three vertically separated planes. The conductors 61' and 63' run in substantially the same direction, while the conductor 62' runs in substantially perpendicular direction to the conductors 61' and 63'. Two fuse cells are built in the contact pillars at the crossovers of the conductors 61' and 62', and 62' and 63', respectively. In the contact pillar of conductors 61' and 62', there builds a PRE 64' coupled to the conductor 61' and to an N+ region 65'-3 of a diode 65'. The diode 65' has a P+ region 65'-1 coupled to a conductor 62'. Between the N+ region 65'-3 and P+ region 65'-1, there is a region 65'-2 that can be unintentionally doped or can be slightly doped with N or P type of dopant. In the contact pillar of conductors 62' and 63', there builds a PRE 66' coupled to the conductor 62' and to a P+ region 67'-3 of a diode 67'. The diode 67' has an N+ region 67'-1 coupled to another conductor 63'. Between the P+ region 67'-3 and N+ region 67'-1, there is a region 67'-2 that can be unintentionally doped or can be slightly doped with N or P type of dopant. In this embodiment, the PRE 66' of the bottom cell coupled to the diode 65' of the top cell to improve programming performance.

Figures 8A, 8B:
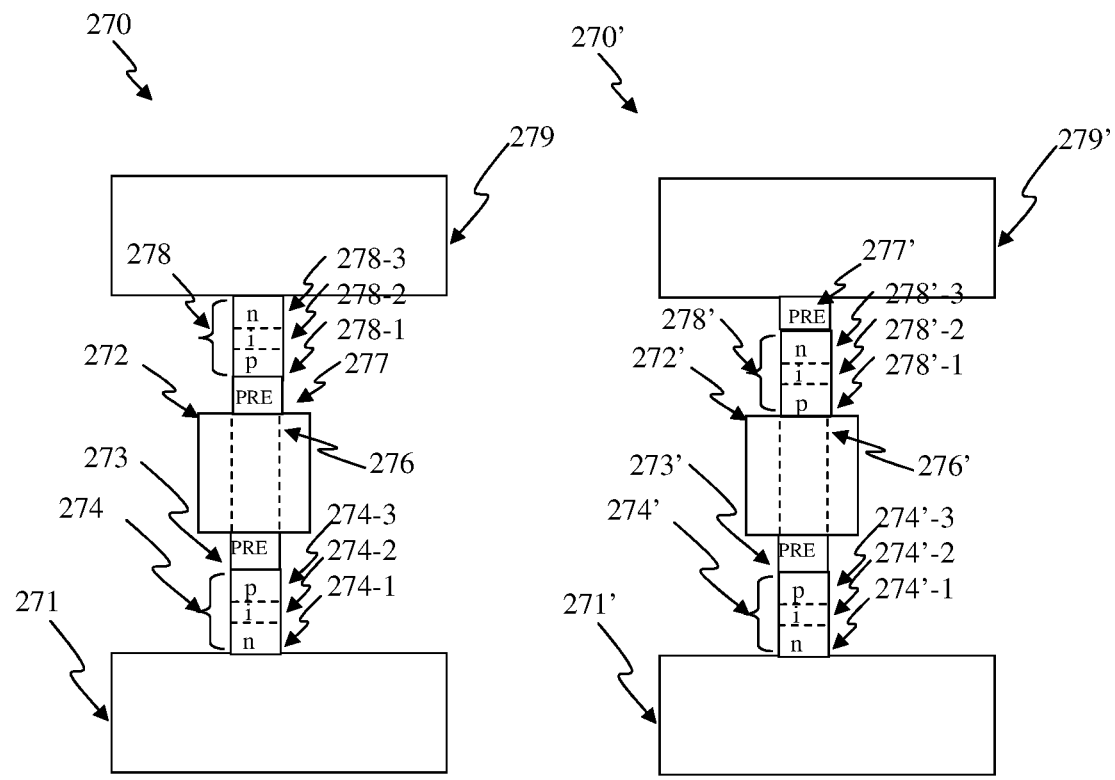
FIG. 8(a) shows a cross section of two vertical programmable resistive device cells built in contact pillars with a programmable resistive element coupled to another programmable resistive element, corresponding to FIG. 7(a), according to one embodiment.
FIG. 8(b) shows a cross section of two vertical programmable resistive devices built in contact pillars with a programmable resistive element coupled to another diode, corresponding to FIG. 7(b), according to another embodiment.

FIG. 8(a) shows a cross section of two PRE cells 270 in two vertical contact pillars, corresponding to FIG. 7(a), according to one embodiment. Three conductors 271, 272, and 279 are in three vertical planes. Conductor 271 and 279 can run in substantially parallel direction, while the conductor 272 can run in substantially perpendicular direction. There are two PRE cells built between conductors 271/272 and 272/279, respectively. A bottom PRE cell with a PRE 273 and a diode 274 is built inside the bottom contact pillar. The diode 274 has a P type dopant 274-3, N type dopant 274-1 and a layer of unintentionally doped or slightly doped N or P type of dopant 274-2 in between. The diode 274 has a P+ anode 274-3 coupled to the PRE 273 and has an N+ cathode coupled to the bottom conductor 271. Similarly, a top PRE cell with a PRE 277 and a diode 278 is built inside the top contact pillar. The diode 278 has a P type dopant 278-1, N type dopant 278-3 and a layer of unintentionally doped or slightly doped N or P type of dopant 278-2 in between. The diode 278 has the P+ anode 278-1 coupled to PRE 277 and has a N+ cathode 278-3 coupled to the top conductor 279. The PRE 273 of the bottom cell has an extension 276 penetrating into the middle conductor 272 to reach the PRE 277 of the top cell in this embodiment.

FIG. 8(b) shows a cross section of two PRE cells 270' in two vertical contact pillars, corresponding to FIG. 7(b), according to one embodiment. Three conductors 271', 272', and 279' are in three vertical planes. Conductor 271' and 279' can run in substantially parallel direction, while the conductor 272' can run in substantially perpendicular direction. There are two PRE cells built between conductors 271'/272' and 272'/279', respectively. A bottom PRE cell with a PRE 273' and a diode 274' is built inside the bottom contact pillar. The diode 274' has a P type dopant 274'-3, N type dopant 274'-1 and a layer of unintentionally doped or slightly doped N or P type of dopant 274'-2 in between. The diode 274' has a P+ anode 274'-3 coupled to the PRE 273' and has an N+ cathode coupled to the bottom conductor 271'. Similarly, a top PRE cell with a PRE 277' and a diode 278' is built inside the top contact pillar. The diode 278' has a P type dopant 278'-1, N type dopant 278'-3 and a layer of unintentionally doped or slightly doped N or P type of dopant 278'-2 in between. The diode 278' has the P+ anode 278'-1 coupled to the middle conductor 272' and has a N+ cathode 278'-3 coupled to the PRE 277'. The PRE 273' of the bottom cell has an extension 276' penetrating into the middle conductor 272' to reach the P+ anode 278'-1 of the top cell in this embodiment.

FIGS. 5(a)-5(d), 6(a)-6(b), 7(a)-7(b), and 8(a)-8(b) only illustrate key conceptions of building a programmable resistive cell in a contact pillar at the cross over of at least two conductors. There are various and equivalent embodiments. For example, the number and/or orientation of conductor lines in rows or columns in a plane can vary. The number of conductor layers can vary. The conductors can be made of any materials such as silicon, silicide, metal, or metal alloy. The order of the diode and the PRE in a contact pillar can be interchangeable. The order of P+ and N+ layers in a diode can be interchangeable too. The order of the P+ and N+ layers in the vertical direction can be the same for all layers, or alternative between layers. The PRE of a PRD can be coupled to another PRE, P+. or N+ layer or to another PRD with current flowing upward or downward. The PRE can be built outside of the contact pillar but above or underneath a conductor line. There are many varieties of embodiments and they are all within the scope of this invention for those skilled in the art.

Figure 9A:
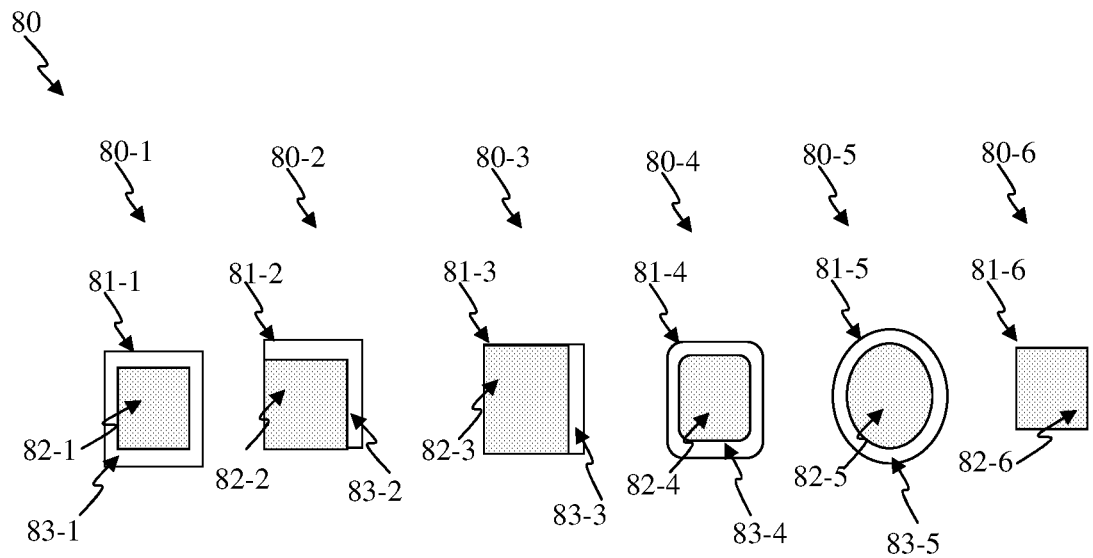
FIG. 9(a) shows top views of contact pillars with silicide coated on the surfaces of polysilicon or silicon fuses as programmable resistive elements according to various embodiments.

FIG. 9(a) shows various configurations 80 of using polysilicon or silicided polysilicon as fuse elements according to some embodiments. Top views 80-1 through 80-5 show various configurations of silicided polysilicon fuses with squares in 80-1 through 80-3, rounded square in 80-4, and circuit in 80-5. In the cores of the top views 80-1 through 80-5, there are polysilicon 82-1 through 82-5. Silicide 83-1 through 83-3 can be coated on 1, 2 or 4 sides of the polysilicon surfaces, or can be coated on the surface of rounded square 83-4 and circle 83-5. In the configuration 80-6, the polysilicon is not coated with silicide at all. The polysilicon or silicide in FIG. 9(a) is for illustration purposes. The cross sections of the contact pillar can be any shapes, such as square, rectangle, rounded rectangle, circle, oval, or even ellipse. The silicide can be on the polysilicon surface in part or in full of one side, in any sides or all sides. The silicide can be on the polysilicon surface in part or full through the length of the polysilicon in the vertical direction. In some embodiments, the polysilicon can be crystalline silicon or other semiconductor materials.

Figure 9B:
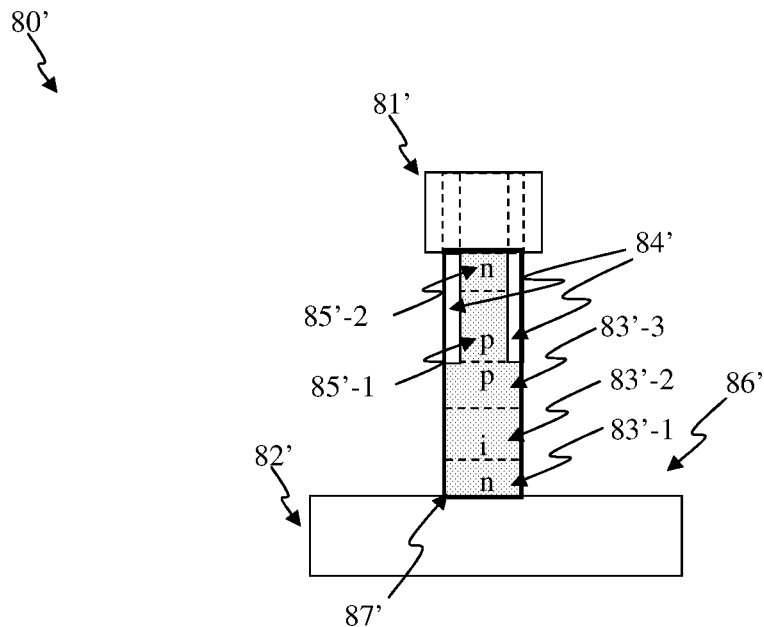
FIG. 9(b) shows a cross section of a contact pillar with silicide coated on the side wall of a programmable resistive element, corresponding to FIG. 9(a), according to one embodiment.

FIG. 9(b) shows a cross section of a fuse cell 80' using a polysilicon or silicided polysilicon as a fuse elements and a diode built in a contact pillar between two conductors 81' and 82', corresponding to FIG. 9(a). The diode 83' has a N, unintentional dope, and P type silicon layers, 83'-1, 83'-2, and 83'-3, respectively, built on a bottom conductor 82'. A fuse element 85' with P and N type dopants, 85'-1 and 85'-2, respectively, are built on top of the diode 83'. A thin layer of silicide 84' can be coated on the surface of the fuse element 85'. In this embodiment, the silicon for diode 83' and fuse element 85' can be fabricated on the contact hole through CVD (Chemical Vapor Deposition) with in-situ doping, namely, the dopants can be changed or adjusted (e.g., over time) as silicon is CVD fabricated into the contact hole. For example, when silicon is filling up the contact hole, the silicon can be N+ doped for a layer of 83'-1 and then switch to unintentionally doped or slightly N or P doped for a layer of 83'-2. After a while when the thickness of the layer 83'-2 reaches a target, the dopant can be switched to P+ type for another layer of 83'-3. Then, a thin layer of silicide 84' can be coated by sputtering, co-sputtering, depositing, or other methods, onto the inner surface of the contact hole. The fabrication of silicon inside the contact hole can continue with dopants changing from P+ type dopant for a layer of 85'-1 and then N+ type dopant for another layer of 85'-2. By using the in-situ doping, the fabrication process can be simpler by continuing depositing silicon while changing the types and doses of dopants at fixed time intervals or reaching certain thickness targets.

The discussions as shown in FIGS. 9(a) and 9(b) are for illustrative purposes. The silicon can be polysilicon or crystalline silicon, SiGe, or even germanium. The fabrication method can be Chemical Vapor Deposition (CVD), sputtering, epitaxial, or selective epitaxial, as long as good diode and fuse characteristics can be achieved. The diode 83' can be built with N-i-P or P-i-N layers coupled to the bottom or top conductor in different embodiments, where the "i" layer can be unintentionally doped or slightly N or P type doped. The fuse element 85' can be all N, all P, part N and part P, or part P and part N from bottom to top layers in other embodiments. The silicide can be built to provide low resistance for the fuse element. It is very desirable to build P/N type of silicon as a fuse element to behave like a reverse biased diode when the silicide on the fuse surface is depleted after being programmed. If the silicide layer 84' can be omitted, diode and fuse element can be fabricated by changing doses and/or types of dopants in-situ continuously during the CVD process in one process step. This may be a desirable embodiment. Between silicon and the conductors, some barrier layers, such as TiN, Ti, Ta, TiSN, or TaN, can be built, to serve as diffusion barrier or adhesive layer. Alternatively, the diffusion barrier of adhesive layer can be used as a fuse element. The length to the width (or diameter) of a fuse element in a contact hole can be between 1.0 to 6.0 in one embodiment.

A portion of fabrication method to build a programmable resistive device (PRD) with a diode and a fuse element inside a contact hole is shown in FIGS. 10(a)-10(g) as follows: (a) building a bottom conductor line 82", (b) depositing an inter layer dielectric 86" and etching a contact hole, (c) depositing different dopants and doses of semiconductor layers to build diode layers 83"-1 to 83"-3 and two layers of fuse element 85"-1 to 85"-2, (d) etching back inter layer dielectric 86" partially until a portion of the fuse element 85"-2 and 85"-1 is exposed, (e) coating silicide 84" on the surface of the fuse element 85"-2 and 85"-1, (f) depositing interlayer dielectric 86" again to cover the top of the fuse element 85"-1 and 85"-2, and (g) building a top conductor line 81" surrounding the fuse element 85"-1 and 85"-2 partially by copper damascene. Damascene means a conductive film is deposited in grooves in an insulating layer and subsequent planarized. The dash lines show the level of interlayer dielectric after each process step and the fine dash lines indicate the level of interlayer dielectric in each immediately previous step Another portion of fabrication method to build two Programmable Resistive Devices (PRDs) 180 including a pair of diodes and fuse elements inside two contact holes is shown in FIGS. 11(a)-11(l) as follows: (a) building a bottom conductor line 182, (b) depositing an interlayer dielectric 186 and etching a contact hole, (c) depositing different dopants and doses of semiconductor material to build diode layers 183-1 to 183-3 and fuse element 185, (d) etching back interlayer dielectric partially until a portion of the fuse element 185 is exposed, (e) coating silicide 187 on the surface of the fuse element 185, (f) filling up the interlayer dielectric 186 again to cover the fuse element 187, (g) building a conductor line 188 surrounding the fuse element 185 using copper damascene process (where a conductive film is deposited in grooves in an insulating layer and subsequent planarized), (h) depositing another interlayer dielectric 186' on top of the metal 188, etching another contact hole, building another fuse element 185' and diode layers 183'-1 to 183'-3 inside the contact hole, (j) striping the dielectric interlayer to the top of the metal line 188 and coating silicide 187' on the surface of top fuse element 185', (j) etching the silicide 187' on the fuse element 185' partially until the diode 183' and a portion of fuse element 187' is exposed, (k) filling the top interlayer dielectric 186' again to the top of diode 183' level, and (l) building the top metal 182' on top of the diode 183' using copper damascene process. Damascene means a conductive film is deposited in grooves in an insulating layer and subsequent planarized. The dash lines show the level of interlayer dielectric after each process step and the fine dash lines indicate the level of interlayer dielectric after each immediately previous step.

Figure 10:
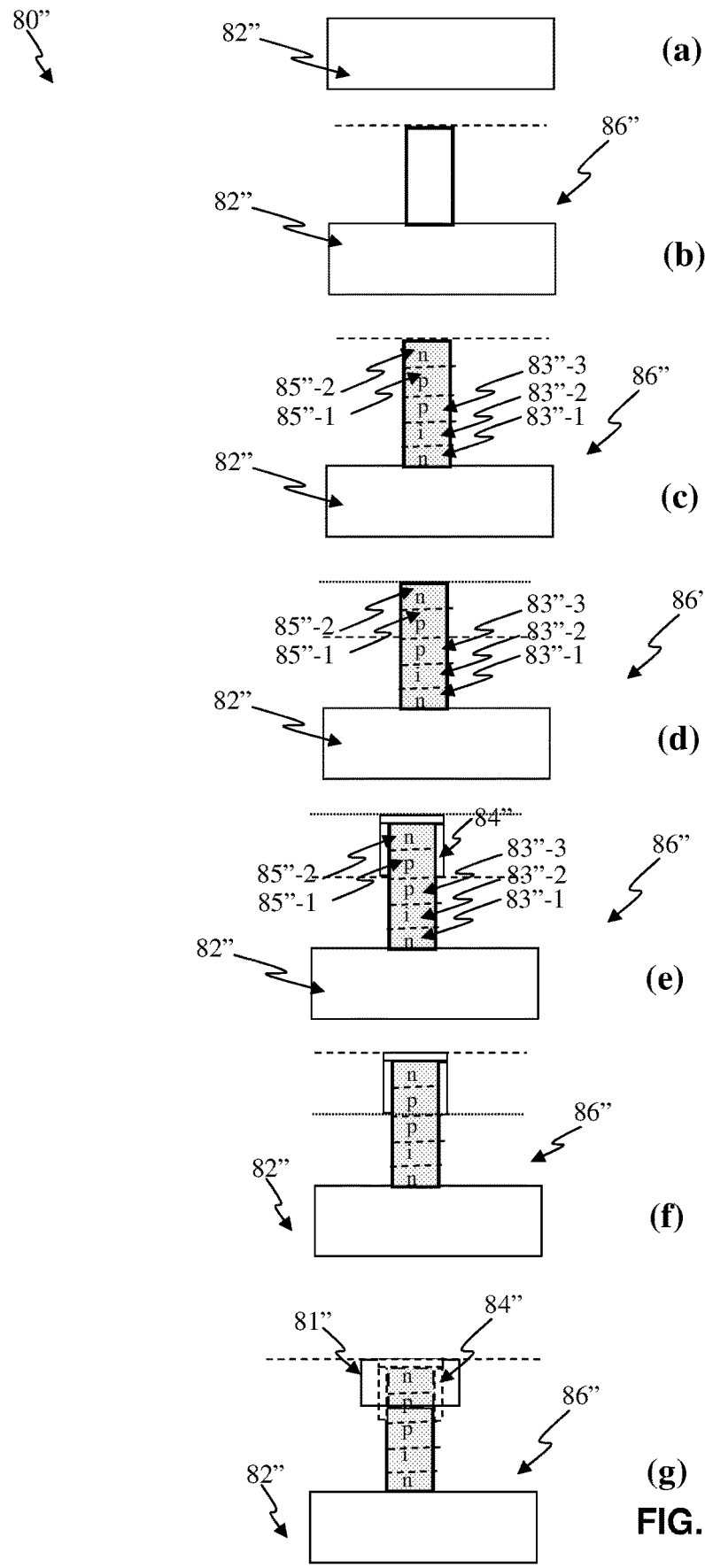
FIG. 10(a)-(g) shows a portion of fabrication method in diagrams about building diode and fuse element in a contact hole, according to one embodiment.
Figure 11:
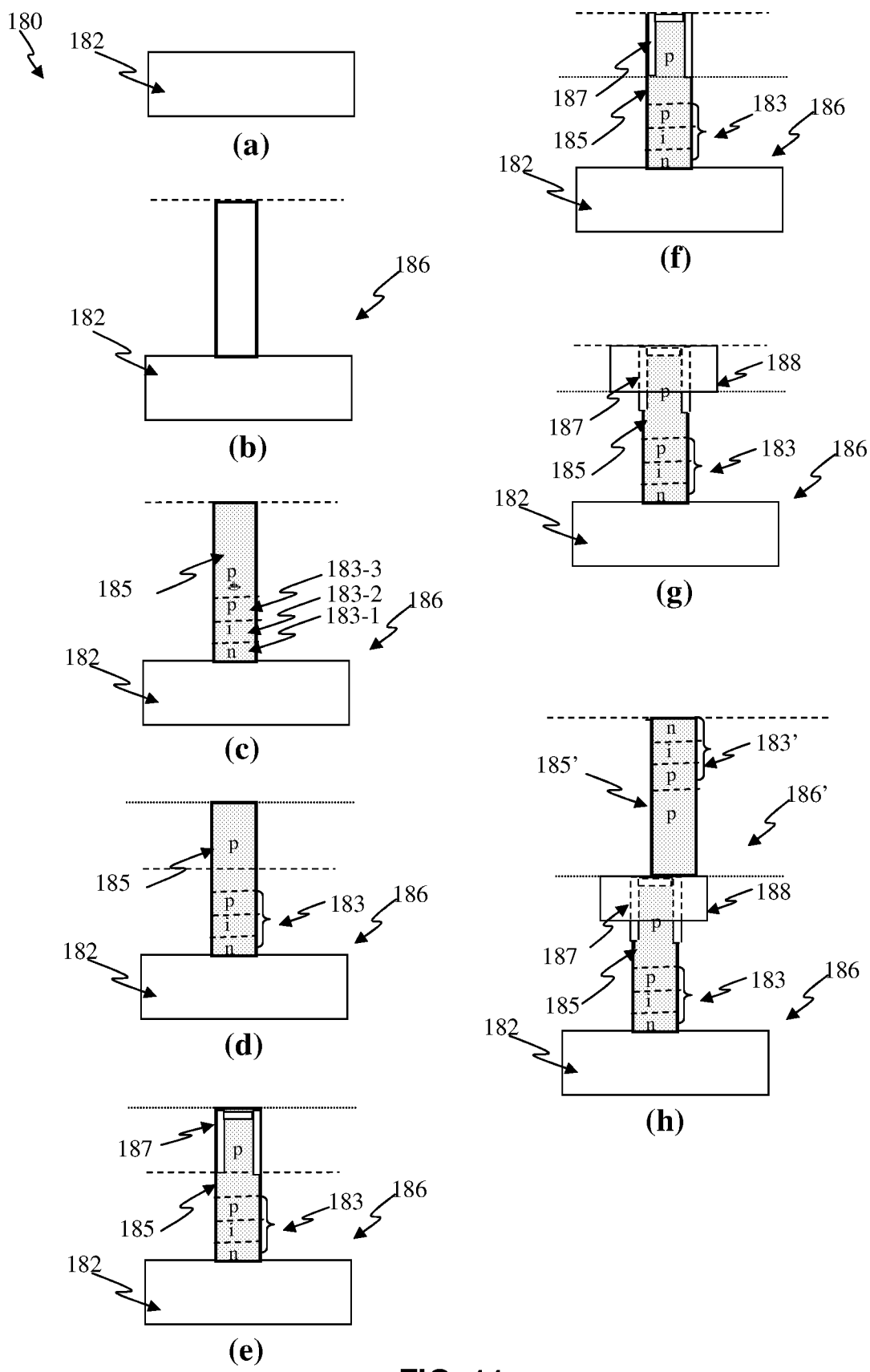
FIG. 11(a)-(l) shows a portion of fabrication method in diagrams about building diodes and fuse elements coupled between two contact holes, according to another embodiment.

FIGS. 10 and 11 are only to exemplify the key concepts of fabrication steps in building coupled programmable resistive devices in a 3D array. There can be many variations and equivalent embodiment for this invention. For example, there can be some adhesive layers or diffusion barriers, such as TiN, TaN, Ti, or Ta, built between semiconductor and the top/middle/bottom conductors. The Programmable Resistive Element (PRE) can be electrical fuse, anti-fuse, phase-change material, resistive RAM film, or magnetic tunnel junctions (MTJs). As for electrical fuse, the fuse element can be polysilicon, silicided polysilicon, silicide, refractory metal, metal alloy, barrier metal, or adhesive layer. The phase-change material can be a thin film of $G_2S_2T_5$, for example, that can be changed between crystalline and amorphous states reversibly and repetitively. The resistive RAM film can be a metal oxide between electrodes, or can be solid-state electrolyte between oxidizable anode and inert cathode. Conduction filaments can be generated or annihilated based on the magnitude, duration, voltage/current compliance, or polarity of current flowing between electrodes. The PRE can be built on top or beneath a diode as a selector. The PRE can also be built outside of the contact pillar as a thin film and can be coupled between at least one conductors and one diode. There can also be many variations and equivalent embodiments of fabricating a diode and programmable resistive element inside a contact hole and they are all within the scope of this invention.

Figure 12:
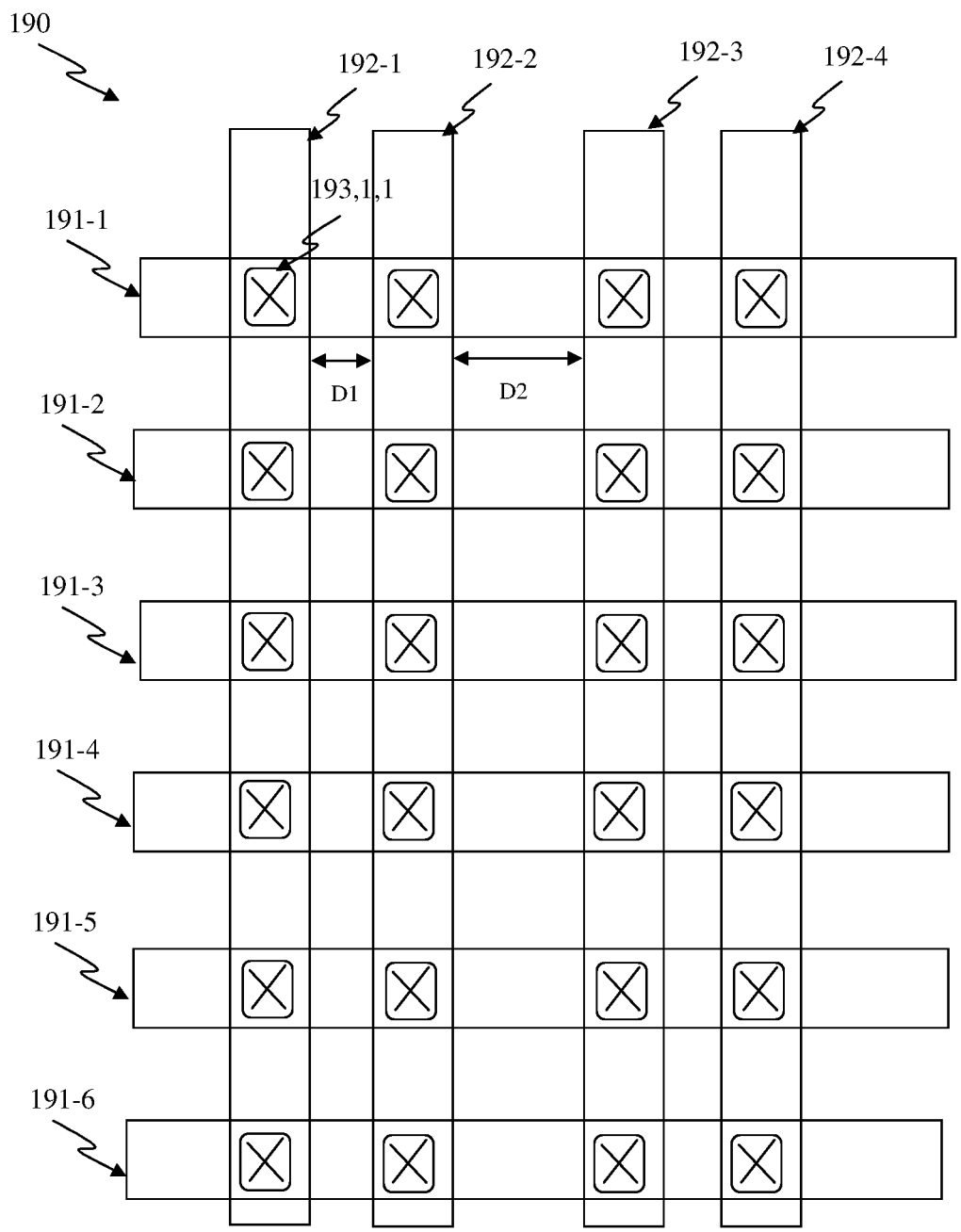
FIG. 12 shows a top view of at least two conductor arrays of 3D programmable resistive devices with unequal space in one dimension and/or in at least one layer, according to another embodiment.

FIG. 12 shows a top view of a portion of 3D Programmable Resistive Device (PRD) arrays 190 according to one embodiment. The PRD array 190 has a plurality of conductor lines 191-1 through 191-6 running in horizontal direction and a plurality of conductor lines 192-1 through 192-4 running in vertical direction. At the cross-over of the conductor lines 191-1 through 191-6 and 192-1 through 192-4, there builds a programmable resistive device. For example, a PRD cell 193-3,1 can be built at the cross-over of conductor lines 191-3 and 192-1. The PRD array 193-$i$,2 has a distance D1 to the PRD array 193-$i$,1 and another distance D2 to the PRD array 193-$i$,3, where i=1, 2, 3, , , etc. The spaces D1 and D2 can be different in this embodiment.

Figure 13:
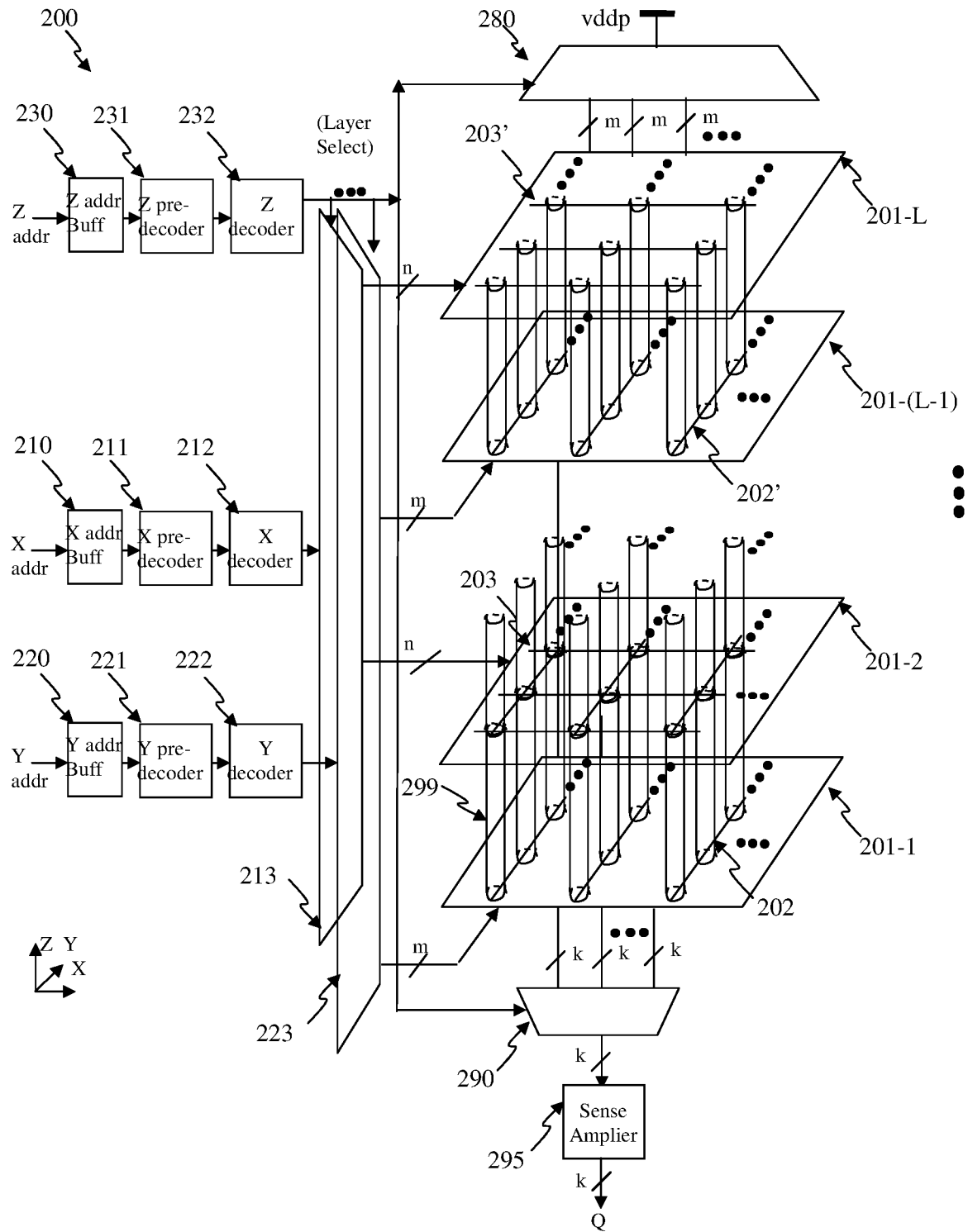
FIG. 13 shows a block diagram of a portion of a programmable resistive memory array in a multiple-layer structure built with peripheral circuit blocks, according to one embodiment.

FIG. 13 shows a block diagram of a portion of a 3D programmable resistive memory 200, according to one embodiment. The programmable resistive memory 200 has L layers of PRE arrays 201-1, 201-2, . . . , 201-L. Each layer has a plurality of conductor lines running in substantially perpendicular directions alternatively. For example, a plurality of bitlines 202 running in the Y-direction in layer 201-1 and another plurality of wordlines 203 running in the X-direction in layer 201-2. At a crossover of layers 201-1 and 201-2 a programmable resistive device (PRD) (e.g., PRD 299) is built between the two layers. A plurality of PRDs can be built between layers 201-2 and 201-3, . . . , or between 201-(L−1) and 201-L. Since the memory arrays are built in a three dimensional structure, three set of decoders, namely X, Y, and Z, are needed to select at least one desirable cell to program or read. X decoding consists of at least one X-address buffer 210, X-pre-decoder 211, and X-decoder 212. Y decoding consists of at least one Y-address buffer 220, Y-pre-decoder 221, and Y-decoder 222. Similarly, Z decoding consists of at least one Z-address buffer 230, Z pre-decoder 231, and Z-decoder 232. Assuming there are m bitlines in the Y-direction in layer 201-1 and n wordlines in the X-direction in layer 201-2, a cell can be selected by asserting one bitline out of m lines in layer 201-1, one wordline out of n lines in layer 201-2, and between any two adjacent layers from a layer number 1, 2, . . . , to L. In this example, there are total number of n*m*(L−1) programmable resistive cells in the 3D memory array. At least one cell can be selected for program or read simultaneously specified by the X, Y, and Z addresses. For read operations, k cells can be selected from n rows, m columns, by X and Y-multiplexes, 213 and 223, respectively, and by further multiplexing in 290 to select from (L−1) possible adjacent layers as inputs for sense amplifiers 295. For program operations, a high program voltage VDDP can be de-multiplexed in 280 to a plurality of bitlines to a desirable layer. At least one cell in the desirable bitline in the desirable layer can be further selected by asserting proper X-multiplex 213. A conduction path can be established from VDDP, de-mux 280, selected bitline in a selected layer, selected cell, selected wordline, and wordline driver to ground. Thus a high current can flow through the selected cell to program into a different resistance state accordingly. Each memory cell can include one PRD coupled to another PRD in a single-diode cell, or can include one PRE shared between two PRDs in a dual-diode cell. The numbers of row, column, or layer are arbitrary. The row, column, and layer are interchangeable. The numbers of cells to be program or read at the same time can be different and/or can be more than one. The peripheral circuits, such as X-, Y-, and Z-decoding or sensing circuits, can be built underneath the 3D memory arrays to reduce the memory size. There can be many variations and equivalent embodiments that are still within the scope of this invention for those skilled in the art.

Figure 14A:
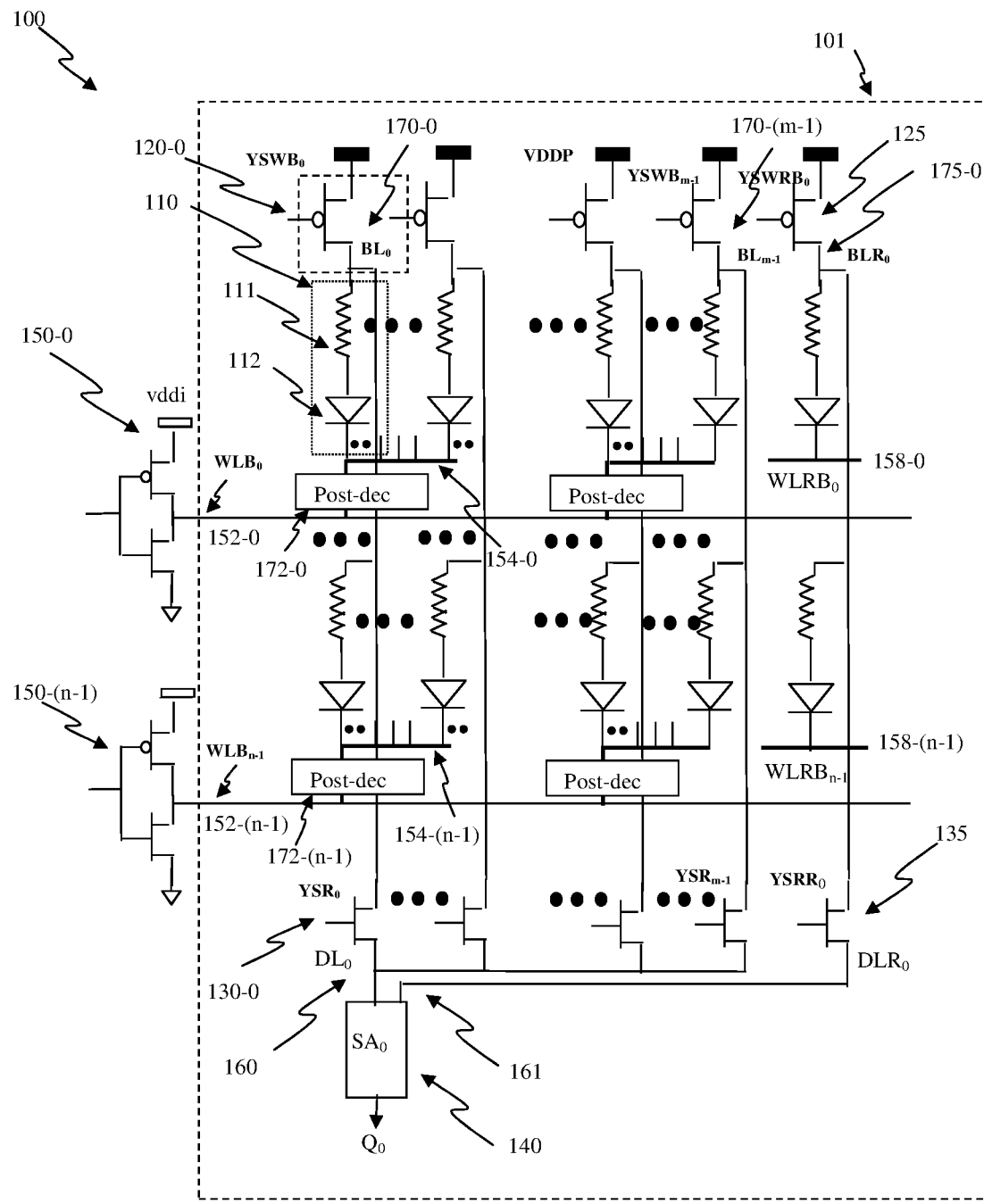
FIG. 14(a) shows a portion of a programmable resistive memory constructed by an array of n-row by (m+1)-column single-diode-as-program-selector cells and n wordline drivers in accordance with one embodiment.
Figure 14B:
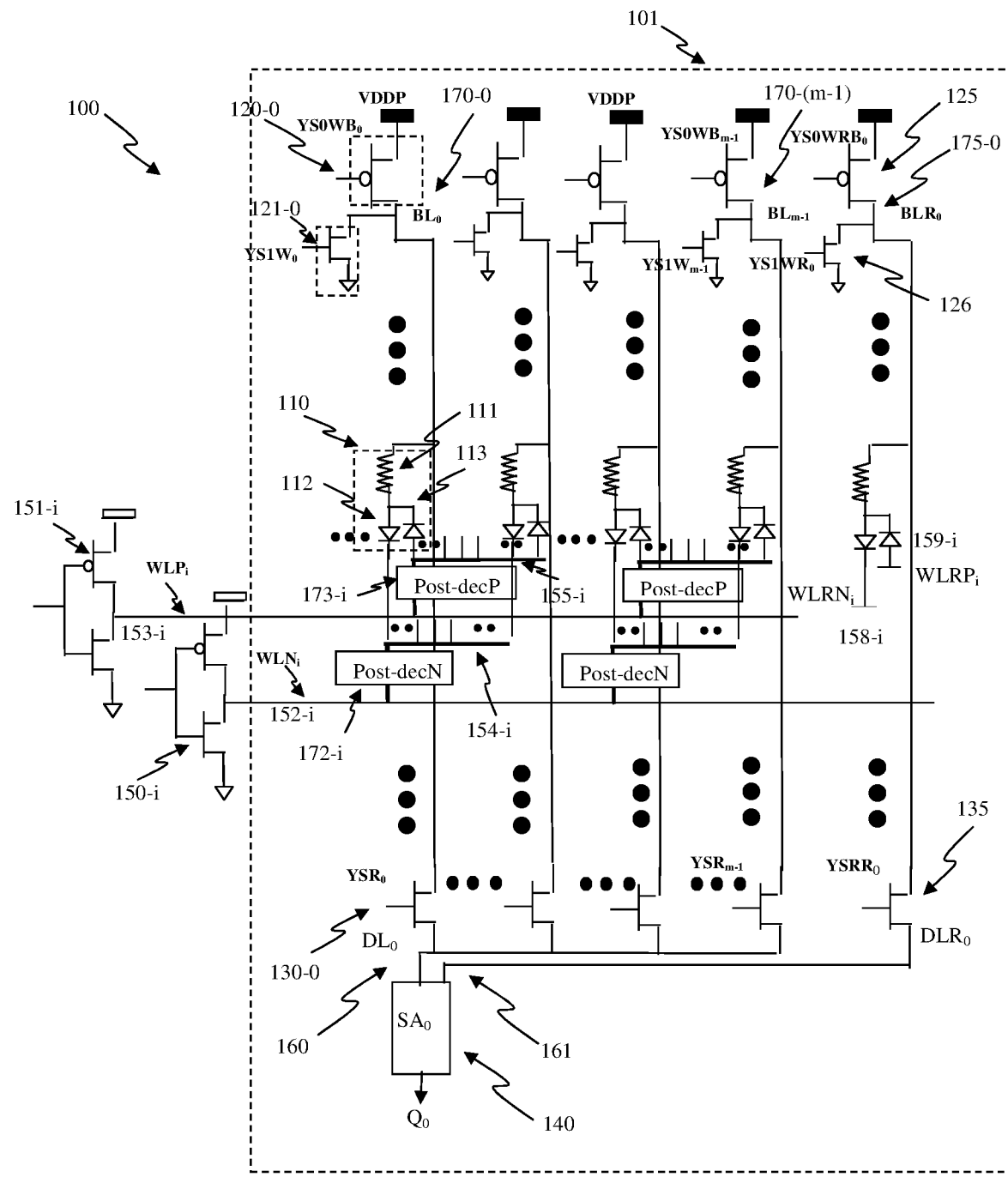
FIG. 14(b) shows a portion of a programmable resistive memory constructed by an array of n-row by (m+1)-column three-terminal dual-diode PRD cells (e.g. MRAM cells) and n wordline drivers in accordance with one embodiment.
Figure 14C:
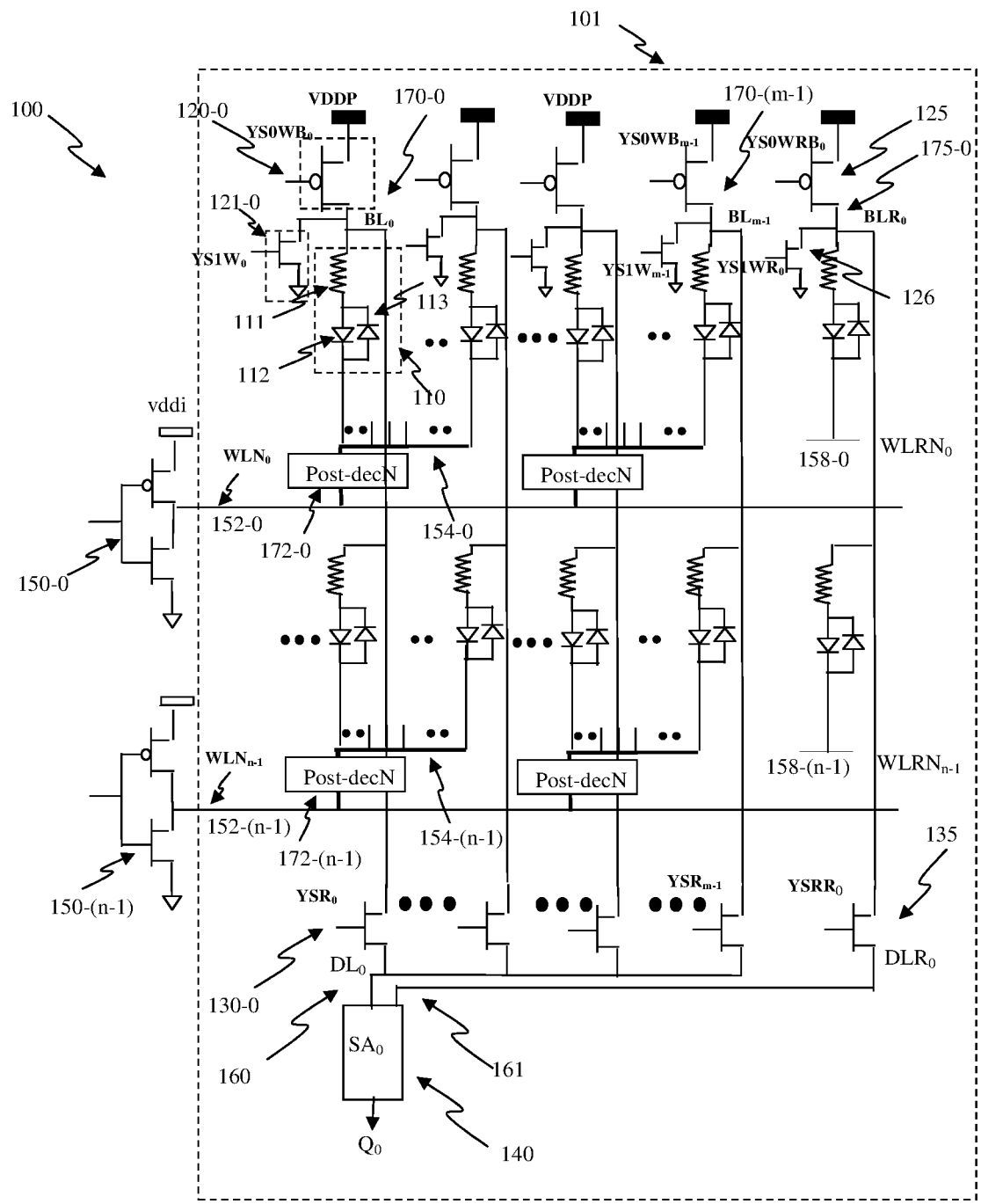
FIG. 14(c) shows a portion of a programmable resistive memory constructed by an array of n-row by (m+1)-column two-terminal dual-diode PRD cells (e.g. MRAM cells) and n wordline drivers in accordance with one embodiment.

The 3D programmable resistive devices can be used to construct a memory in accordance with one embodiment. FIG. 14(*a*) shows a portion of a programmable resistive memory 100 between two adjacent layers constructed by an array 101 of n-row by (m+1)-column single-diode-as-program-selector cells 110 and n wordline drivers 150-*i*, where i=0, 1, . . . , n−1, in accordance with one embodiment. The memory array 101 has m normal columns and one reference column for one shared sense amplifier 140 for differential sensing. Each of the memory cells 110 has a resistive element 111 coupled to the P terminal of a diode 112 as program selector and to a bitline BLj 170-*j* (j=0, 1, . . . , m−1) or reference bitline BLR0 175-0 for those of the memory cells 110 in the same column. The N terminal of the diode 112 is coupled to a wordline WLBi 152-*i* through a local wordline LWLBi 154-*i*, where i=0, 1, . . . , n−1, for those of the memory cells 110 in the same row. Each wordline WLBi is coupled to at least one local wordline LWLBi, where i=0, 1, . . . , n−1. The LWLBi 154-*i* is generally constructed by a high resistivity material or lower metal levels to connect cells, and then coupled to the WLBi (e.g., a low-resistivity metal WLBi) through conductive contacts or vias, buffers, or post-decoders 172-*i*, where i=0, 1, . . . , n−1. Buffers or post-decoders 172-*i* may be needed when using diodes as program selectors because there are currents flowing through the WLBi, especially when one WLBi drives multiple cells for program or read simultaneously in other embodiments. The wordline WLBi is driven by the wordline driver 150-*i* with a supply voltage vddi that can be switched between different voltages for program and read. Each BLj 170-*j* or BLR0 175-0 is coupled to a supply voltage VDDP through a Y-write pass gate 1201 or 125 for programming, where each BLj 170-*j* or BLR0 175-0 is selected by YSWBj (j=0, 1, . . . , m−1) or YSWRB0, respectively. The Y-write pass gate 120-*j* (j=0, 1, . . . , m−1) or 125 can be built by PMOS, though NMOS, diode, or bipolar devices can be employed in some embodiments. Each BLj or BLR0 is coupled to a dataline DLj or DLR0 through a Y-read pass gate 1301 or 135 selected by YSRj (j=0, 1, . . . , m−1) or YSRR0, respectively. In other embodiment, the dataline DL0 can be further multiplexed between different layers to generate a final dataline for sensing. In this portion of memory array 101, a normal dataline DL0 is connected to an input 160 of a sense amplifier 140. The reference dataline DLR0 provides another input 161 for the sense amplifier 140 (no multiplex is generally needed in the reference branch). The output of the sense amplifiers 140 is Q0.

To program a cell, the specific WLBi and YSWBj are turned on and a high voltage is supplied to VDDP, where i=0, 1, . . . n−1 and j=0, 1, . . . , m−1. In some embodiments, the reference cells can be programmed to 0 or 1 by turning on WLRBi, and YSWRB0, where i=0, 1, . . . , n−1. To read a cell, a data column 160 can be selected by turning on the specific WLBi and YSRj, where i=0, 1, . . . , n−1, and j=0, 1, . . . , m−1, and a reference cell coupled to the reference dataline DLR0 161 can be selected for the sense amplifier 140 to sense and compare the resistance difference between normal/reference BLs and ground, while disabling all YSWBj and YSWRB0 where j=0, 1, . . . , m−1.

The programmable resistive devices can be used to construct a memory in accordance with one embodiment. FIG. 14(*b*) shows a portion of a 3D programmable resistive memory 100 between two adjacent layers constructed by an array 101 of 3-terminal dual-diode PRD cells (e.g. MRAM cells) 110 as shown in FIG. 14(*b*) in n rows and m+1 columns and n pairs of wordline drivers 150-*i* and 151-*i*, where i=0, 1, . . . , n−1, according to one embodiment. The memory array 101 has m normal columns and one reference column for one shared sense amplifier 140 for differential sensing. Each of the memory cells 110 has a resistive element 111 coupled to the P terminal of a program-0 diode 112 and N terminal of a program-1 diode 113. The program-0 diode 112 and the program-1 diode 113 serve as program selectors. Each resistive element 111 is also coupled to a bitline BLj 1701 (j=0, 1, . . . , m−1) or reference bitline BLR0 175-0 for those of the memory cells 110 in the same column. The N terminal of the diode 112 is coupled to a wordline WLNi 152-*i* through a local wordline LWLNi 154-*i*, where i=0, 1, . . . , n−1, for those of the memory cells 110 in the same row. The P terminal of the diode 113 is coupled to a wordline WLPi 153-*i* through a local wordline LWLPi 155-*i*, where i=0, 1, . . . , n−1, for those cells in the same row. Each wordline WLNi or WLPi is coupled to at least one local wordline LWLNi or LWLPi, respectively, where i=0, 1, . . . , n−1. The LWLNi 154-*i* and LWLPi 155-*i* are generally constructed by a high resistivity material or low levels of metal layers to connect cells, and then coupled to the WLNi or WLPi (e.g., low-resistivity metal WLNi or WLPi) through conductive contacts or vias, buffers, or post-decoders 172-*i* or 173-*i* respectively, where i=0, 1, . . . , n−1. Buffers or post-decoders 172-*i* or 173-*i* may be needed when using diodes as program selectors because there are currents flowing through WLNi or WLPi, especially when one WLNi or WLPi drivers multiple cells for program or read simultaneously in some embodiments. The wordlines WLNi and WLPi are driven by wordline drivers 150-$i$ and 151-$i$, respectively, with a supply voltage vddi that can be switched between different voltages for program and read. Each BLj 170-$j$ or BLR0 175-0 is coupled to a supply voltage VDDP through a Y-write-0 pass gate 120-$j$ or 125 to program 0, where each BLj 1701 or BLR0 175-0 is selected by YS0WBj (j=0, 1, . . . , m−1) or YS0WRB0, respectively. Y-write-0 pass gate 120-$j$ or 125 can be built by PMOS, though NMOS, diode, or bipolar devices can be employed in other embodiments. Similarly, each BLj 170-$j$ or BLR0 175-0 is coupled to a supply voltage 0V through a Y-write-1 pass gate 121-$j$ or 126 to program 1, where each BLj 170-$j$ or BLR0 175-0 is selected by YS1Wj (j=0, 1, . . . , m−1) or YS1WR0, respectively. Y-write-1 pass gate 121-$j$ or 126 is can be built by NMOS, though PMOS, diode, or bipolar devices can be employed in other embodiments. Each BLj or BLR0 is coupled to a dataline DL0 or DLR0 through a Y-read pass gate 130-$j$ or 135 selected by YSRj (j=0, 1, . . . , m−1) or YSRR0, respectively. In some embodiment, the DL0 can be further multiplexed for different layers to generate a final dataline for sensing. In this portion of memory array 101, a normal datalines DL0 is connected to an input 160 of a sense amplifier 140. Reference dataline DLR0 provides another input 161 for the sense amplifier 140, except that no multiplex is generally needed in a reference branch. The output of the sense amplifier 140 is Q0.

To program a 0 into a cell, the specific WLNi, WLPi and BLj are selected by wordline drivers 150-$i$, 151-$i$, and Y-pass gate 120-$j$ by YS0WBj, respectively, where i=0, 1, . . . n−1 and j=0, 1, . . . , m−1, while the other wordlines and bitlines are also properly set. A high voltage is applied to VDDP. In some embodiments, the reference cells can be programmed into 0 by setting proper voltages to WLRNi 158-$i$, WLRPi 159-$i$ and YS0WRB0, where i=0, 1, . . . , n−1. To program a 1 to a cell, the specific WLNi, WLPi and BLj are selected by wordline driver 150-$i$, 151-$i$, and Y-pass gate 121-$j$ by YS1Wj, respectively, where i=0, 1, . . . n−1 and j=0, 1, . . . , m−1, while the other wordlines and bitlines are also properly set. In some embodiments, the reference cells can be programmed to 1 by setting proper voltages to WLRNi 158-$i$, WLRPi 159-$i$ and YS1WR0, where i=0, 1, . . . , n−1. To read a cell, a data column 160 can be selected by turning on the specific WLNi, WLPi and YSRj, where i=0, 1, . . . , n−1, and j=0, 1, . . . , m−1, and a reference cell coupled to the reference dataline DLR 161 for the sense amplifier 140 to sense and compare the resistance difference between normal/reference BLs and ground, while disabling all YS0WBj, YS0WRB0, YS1Wj and YS1WR0, where j=0, 1, . . . , m−1.

Another embodiment of constructing 3D programmable resistive memory with 2-terminal dual-diode PRD cells (e.g. MRAM cells) between two adjacent layers is shown in FIG. 14($c$) with two wordlines are merged into one, provided the voltage difference VDDP, between high and low states, is less than twice of the diode's threshold voltage Vd, i.e., VDDP<2*Vd. As shown in FIG. 14($c$), two wordlines per row WLNi 152-$i$ and WLPi 153-$i$ in FIG. 14($b$) can be merged into one wordline driver WLNi 152-$i$, where i=0, 1, . . . , n−1. Also, the local wordlines LWLNi 154-$i$ and LWLP 155-$i$ per row in FIG. 14($b$) can be merged into one local wordline LWLNi 154-$i$, where i=0, 1, . . . , n−1, as shown in FIG. 14($c$). Still further, two wordline drivers 150-$i$ and 151-$i$ in FIG. 14($b$) can be merged into one, i.e., wordline driver 150-$i$. The BLs and WLNs of the unselected cells are applied with proper program 1 and 0 conditions to program accordingly. Since half of wordlines, local wordlines, and wordline drivers can be eliminated in this embodiment, cell and macro areas can be reduced substantially.

FIGS. 14($a$), 14($b$), and 14($c$) show only a few embodiments of a portion of 3D programmable resistive memory in a simplified manner. The memory array 101 in FIGS. 14($a$), 14($b$), and 14($c$) can be replicated s times to read or program s-cells at the same time. In the case of differential sensing, the number of reference columns to normal columns may vary and the physical location can also vary relative to the normal data columns. Rows and columns are interchangeable. The numbers of rows, columns, or cells likewise may vary. For those skilled in the art understand that the above descriptions are for illustrative purpose. Various embodiments of array structures, configurations, and circuits are possible and are still within the scope of this invention.

The portions of 3D programmable resistive memories shown in FIGS. 14($a$), 14($b$), and 14($c$) can include different types of resistive elements. The resistive element can be an electrical fuse including a fuse fabricated from an interconnect, contact/via fuse, contact/via anti-fuse, or gate oxide breakdown anti-fuse. The interconnect fuse can be formed from at least one of the silicide, polysilicon, silicided polysilicon, polymetal, metal, metal alloy, local interconnect, thermally isolated active region, or some combination thereof, or can be constructed from a CMOS gate material. The resistive element can also be fabricated from phase-change material in PCRAM, resistive film in RRAM/CBRAM, or MTJ in MRAM, etc. For the electrical fuse fabricated from an interconnect, contact, or via fuse, programming requirement is to provide a sufficiently high current, about 4-20 mA range, for a few microseconds to blow the fuse by electro-migration, heat, rupture, decomposition, melt, ion diffusion, or some combination thereof. For anti-fuse, programming requirement is to provide a sufficiently high voltage to breakdown the dielectrics between two ends of a contact, via or CMOS gate/body. The required voltage is about 6-7V for a few millisecond to consume about a few milliampere of current in today's technologies. Programming Phase-Change Memory (PCM) requires different voltages and durations for 0 and 1. Programming to a 1 (or to reset) requires a high and short voltage pulse applied to the phase-change film. Alternatively, programming to a 0 (or to set) requires a low and long voltage pulse applied to the phase change film. The reset needs about 3V for 50 ns and consumes about 300 uA, while set needs about 2V for 300 ns and consumes about 100 uA. For MRAM, the high and low program voltages are about 2-3V and 0V, respectively, and the current is about +/−100-200 uA.

Figure 15A:
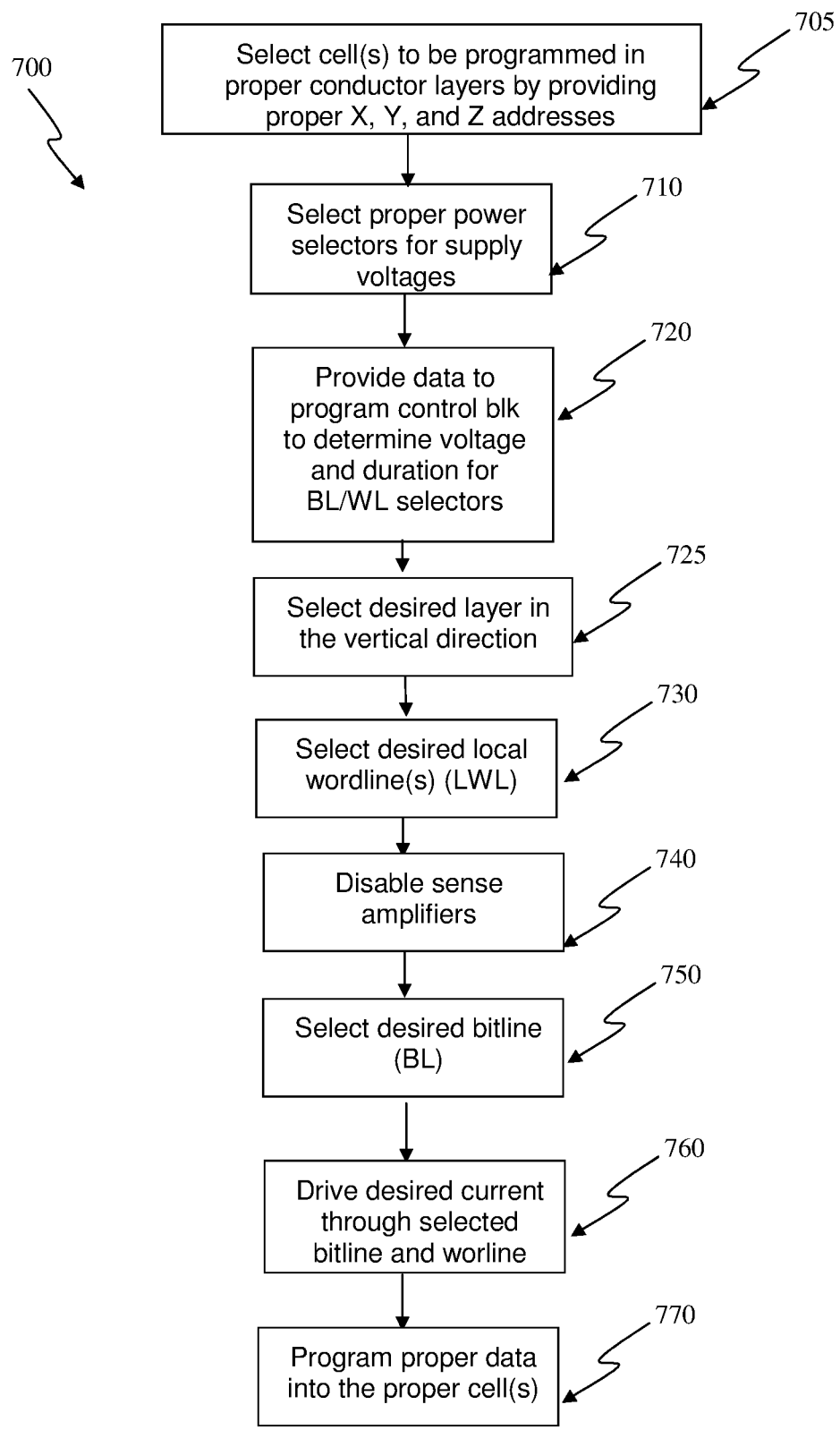
FIG. 15(a) depicts a method of programming a 3D programmable resistive memory in a flow chart according to one embodiment.
Figure 15B:
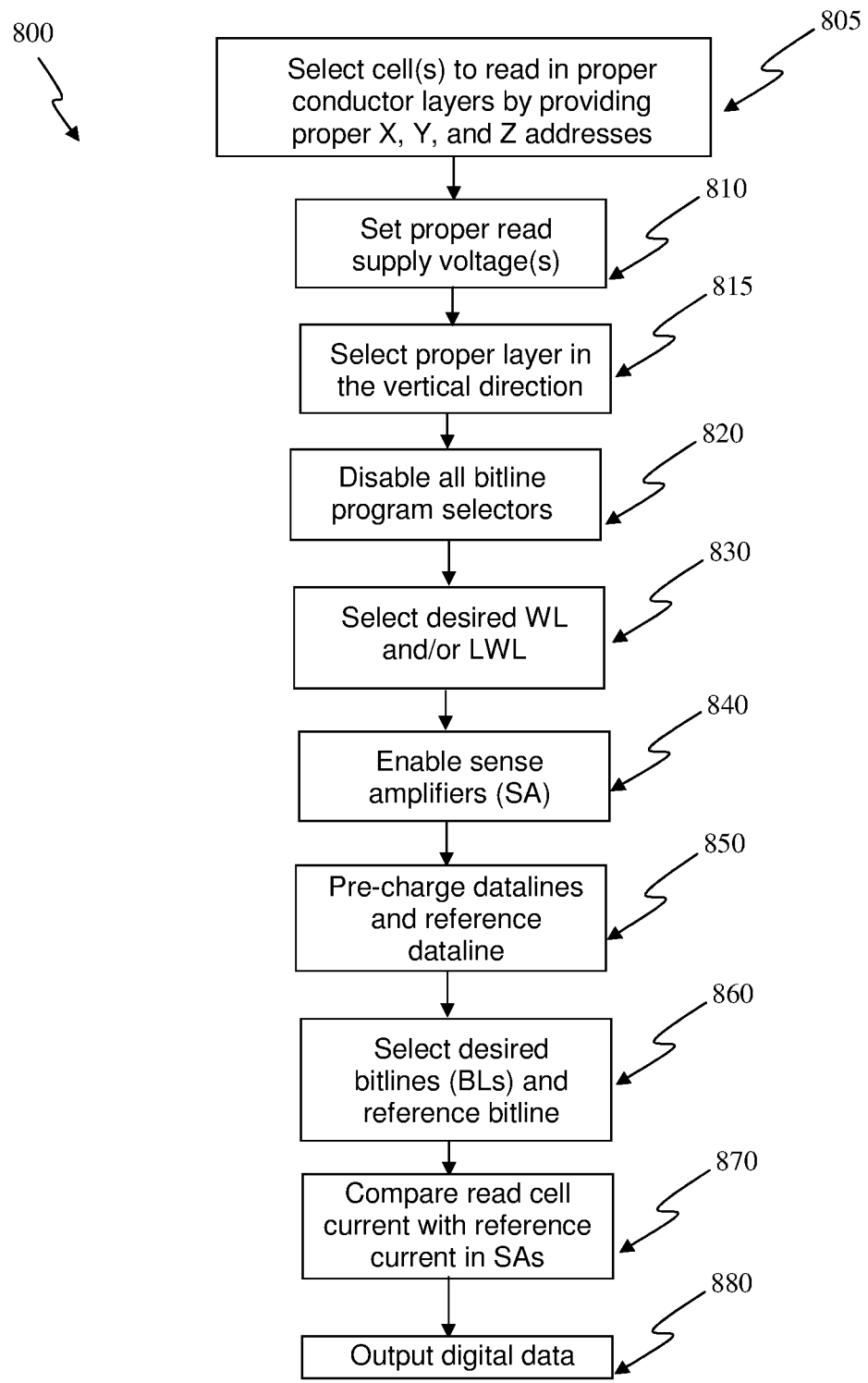
FIG. 15(b) depicts a method of reading a 3D programmable resistive memory in a flow chart according to one embodiment.

FIGS. 15($a$) and 15($b$) show flow charts depicting embodiments of a program method 700 and a read method 800, respectively, for a 3D programmable resistive memory in accordance with certain embodiments. The methods 700 and 800 are described in the context of a 3D programmable resistive memory, such as the programmable resistive memory 100 in FIGS. 14($a$), 14($b$) and 14($c$). In addition, although described as a flow of steps, one of ordinary skilled in the art will recognize that at least some of the steps may be performed in a different order, including simultaneously, or skipped.

FIG. 15($a$) depicts a method 700 of programming a 3D programmable resistive memory in a flow chart according to one embodiment. In the first step 705, determine which cell(s) to be programmed by selecting proper X-, Y-, and Z-addresses to select which row, column, and layer of conductor lines to be programmed. In step 710, proper power selectors can be selected so that high voltages can be applied to the power supplies of wordline drivers and bitlines. In step 720, data to be programmed in a control logic (not shown in FIGS. 14(*a*), 14(*b*), and 14(*c*)) can be analyzed, depending on what types of programmable resistive devices. For electrical fuse, this is a One-Time-Programmable (OTP) device such that programming always means blowing fuses into a non-virgin state and is irreversible. Program voltage and duration tend to be determined by external control signals, rather than generated internally from the memory. For PCM, programming into a 1 (to reset) and programming into a 0 (to set) require different voltages and durations such that a control logic determines the input data and select proper power selectors and assert control signals with proper timings. For MRAM, the directions of current flowing through MTJs are more important than time duration. A control logic determines proper power selectors for wordlines and bitlines and assert control signals to ensure a current flowing in the desired direction for desired time. In step 725, the desirable layers in the vertical direction are selected. In step 730, at least a cell in a row can be selected and the corresponding local wordline can be turned on. In step 740, sense amplifiers can be disabled to save power and prevent interference with the program operations. In step 750, at least a cell in a column can be selected and the corresponding Y-write pass gate can be turned on to couple the selected bitline to a supply voltage. In the last steps 760 and 770, a desired current can be driven for a desired time in an established conduction path to complete the program operations. For most programmable resistive memories, this conduction path is from a high voltage supply through a bitline select, resistive element, diode as program selector, and an NMOS pulldown of a local wordline driver to ground. Particularly, for programming a 1 to an MRAM, the conduction path is from a high voltage supply through a PMOS pullup of a local wordline driver, diode as program selector, resistive element, and bitline select to ground.

FIG. 15(*b*) depicts a method 800 of reading a 3D programmable resistive memory in a flow chart according to one embodiment. In the first step 805 determine which two conductor layers are to be selected. In step 810, proper power selectors can be selected to provide supply voltages for local wordline drivers, sense amplifiers, and other circuits. In step 815, proper layers in the vertical direction are selected. In step 820, all Y-write pass gates, i.e. bitline program selectors, can be disabled. In step 830, desired local wordline(s) can be selected so that the diode(s) as program selector(s) have a conduction path to ground. In step 840, sense amplifiers can be enabled and prepared for sensing incoming signals. In step 850, dataline and reference dataline can be pre-charged to the V− voltage of the programmable resistive device cell. In step 860, the desired Y-read pass gate can be selected so that the desired bitline is coupled to an input of the sense amplifier. A conduction path is thus established from the bitline to the resistive element in the desired cell, diode(s) as program selector(s), and the pulldown of the local wordline driver(s) to ground. The same applies for the reference branch. In the last steps 870 and 880, the sense amplifiers can compare the read current with the reference current to determine a logic output of 0 or 1 to complete the read operations.

Figure 16:
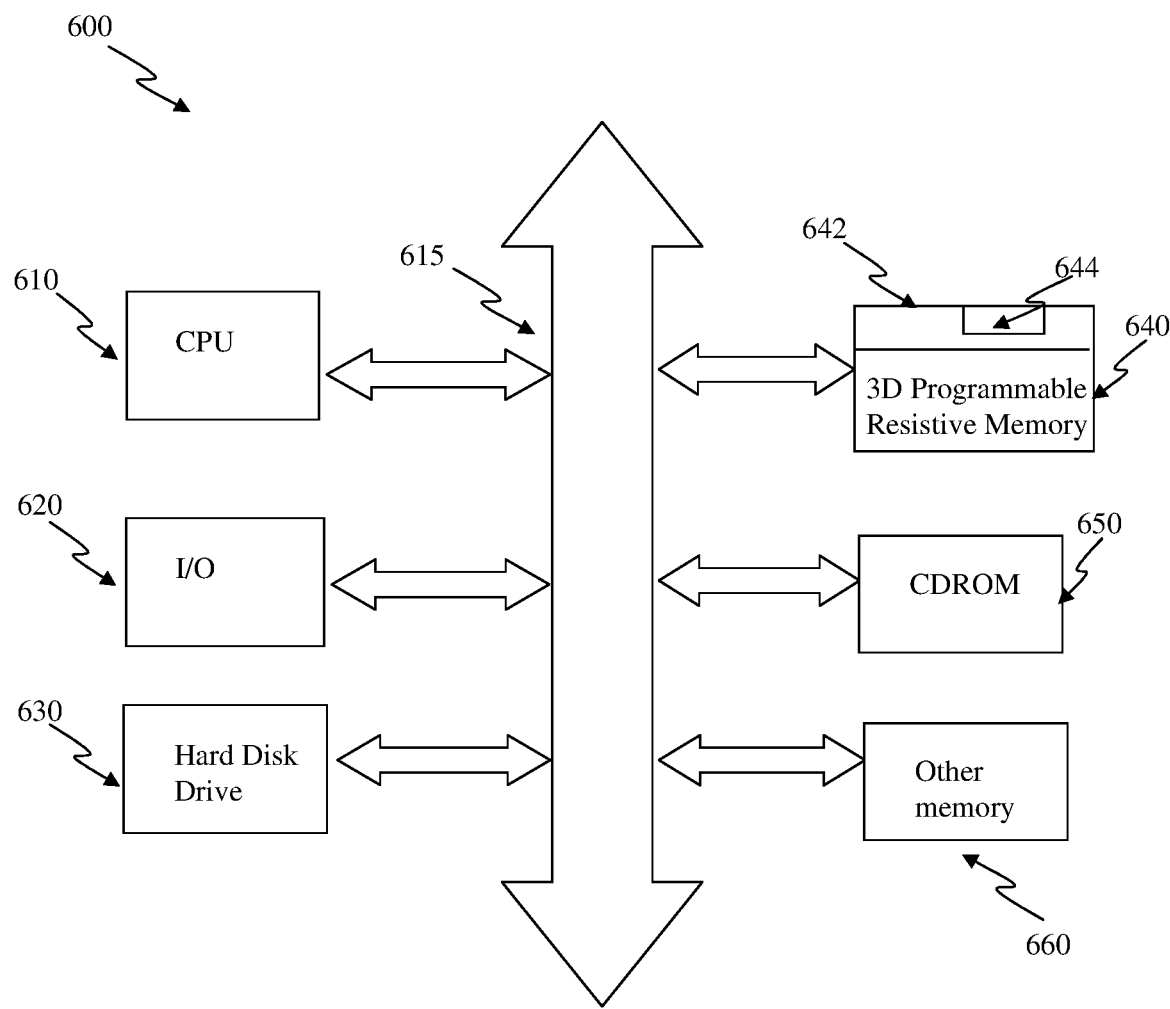
FIG. 16 shows a block diagram of an electronic system with a 3D programmable resistive memory operatively coupled to a processor.

FIG. 16 shows a processor system 600 according to one embodiment. The processor system 600 can include a 3D programmable resistive device 644, such as in a cell array 642, in 3D programmable resistive memory 640, according to one embodiment. The processor system 600 can, for example, pertain to an electronics system. The electronics system can include a Central Process Unit (CPU) 610, which communicate through a common bus 615 to various memory and peripheral devices such as I/O 620, hard disk drive 630, CDROM 650, 3D programmable resistive memory 640, and other memory 660. Other memory 660 is a conventional memory such as SRAM, DRAM, or flash, typically interfaces to CPU 610 through a memory controller. CPU 610 generally is a microprocessor, a digital signal processor, or other programmable digital logic devices. 3D programmable resistive Memory 640 is preferably constructed as an integrated circuit, which includes the memory array 642 having at least one programmable resistive device 644. The 3D programmable resistive memory 640 typically interfaces to CPU 610 through a memory controller. If desired, the 3D programmable resistive memory 640 may be combined with the processor, for example CPU 610, in a single integrated circuit.

The invention can be implemented in a part or all of an integrated circuit in a Printed Circuit Board (PCB), or in a system. The 3D programmable resistive device can be fuse, anti-fuse, or emerging nonvolatile memory. The fuse can be silicided or non-silicided polysilicon/silicon, other semiconductor material, metal, or barrier metal. The metal can be tungsten, copper, aluminum, tantalum, titanium, cobalt, or alloys thereof. The barrier metal can be titanium nitride, tantalum, tantalum nitride, ruthenium, titanium tungsten, tungsten nitride, or a combination therefore. Some other combinations can be used: Ti/W/WN, Ti/W/TiN, Ti/Al/TiN, (Ti/TiN)/Al/TiN, Ti/Al/TiW, or any combination of these layers. The anti-fuse can have a dielectric between electrodes. The dielectric layer can be one of hafnium oxide, aluminum oxide, titanium oxide, lanthanum oxide, tantalum oxide, ruthenium oxide, zirconium silicon oxide, aluminum silicon oxide, hafnium silicon oxide, hafnium aluminum oxide, hafnium silicon oxynitride, zirconium silicon aluminum oxide, hafnium aluminum silicon oxide, hafnium aluminum silicon oxynitride, zirconium silicon aluminum oxynitride, silicon oxide, silicon nitride, or a combination thereof. The emerging nonvolatile memory can be one of switchable complex metal oxide, carbon nanotube memory, grapheme resistivity switchable material, carbon resistivity switchable material, phase change material memory, conductive bridge element, switchable polymer memory, or magnetic tunnel junction memory.

This application also incorporates by reference the following: (i) U.S. patent application Ser. No. 13/471,704, filed on May, 15, 2012 and entitled "Circuit and System of Using Junction Diode as Program Selector For One-Time Programmable Devices," which is hereby incorporated herein by reference; (ii) U.S. patent application Ser. No. 13/026,752, filed on Feb. 14, 2011 and entitled "Circuit and System of Using Junction Diode as Program Selector for One-Time Programmable Devices," which is hereby incorporated herein by reference; (iii) U.S. Provisional Patent Application No. 61/375,653, filed on Aug. 20, 2010 and entitled "Circuit and System of Using Junction Diode As Program Selector for Resistive Devices in CMOS Logic Processes," which is hereby incorporated herein by reference; (iv) U.S. Provisional Patent Application No. 61/375,660, filed on Aug. 20, 2010 and entitled "Circuit and System of Using Polysilicon Diode As Program Selector for Resistive Devices in CMOS Logic Processes," which is hereby incorporated herein by reference; (v) U.S. Provisional Patent Application No. 61/609,353, filed on Mar. 11, 2012 and entitled "Circuit and System of Using Junction Diode as Program Selector for One-Time Programmable Devices," which is hereby incorporated herein by reference; and (vi) U.S. patent application Ser. No. 13/026,656, filed on Feb. 14, 2011 and entitled "Circuit and System of Using Polysilicon Diode As Program Selector for One-Time Programmable Devices," which is hereby incorporated herein by reference.

The above description and drawings are only to be considered illustrative of exemplary embodiments, which achieve the features and advantages of the present invention. Modifications and substitutions of specific process conditions and structures can be made without departing from the spirit and scope of the present invention.

The many features and advantages of the present invention are apparent from the written description and, thus, it is intended by the appended claims to cover all such features and advantages of the invention. Further, since numerous modifications and changes will readily occur to those skilled in the art, it is not desired to limit the invention to the exact construction and operation as illustrated and described. Hence, all suitable modifications and equivalents may be resorted to as falling within the scope of the invention.

What is claimed is:

1. A Programmable Resistive Device (PRD) memory, comprising:
   a plurality of PRD cells, at least one of the PRD cells including at least:
      a diode and a Programmable Resistive Element (PRE) being fabricated at a crossover of a first conductor line and a second conductor line located in a structure having more than two vertical layers;
      the PRE coupled to a first conductor line, the PRE being configured to penetrate substantially vertically through the first conductor line;
      the diode including at least a first active region and a second active region isolated from the first active region, where the first active region having a first type of dopant and the second active region having a second type of dopant, the first active region providing a first terminal of the diode, the second active region providing a second terminal of the diode, the first active region coupled to the PRE and the second active region coupled to a second conductor line,
   wherein the PRE of the at least one of the PRD cells is coupled through the first conductor line to the PRE of another of the PRD cells or is shared through the first conductor line between two PRD cells; and
   wherein the PRE is configured to be programmable by applying voltages to the first conductor line, the second conductor lines and/or the third conductor line to thereby change its resistance for a different logic state.

2. A PRD memory as recited in claim 1, wherein the PRE is provided within a contact hole through the first conductor line.

3. A PRD memory as recited in claim 1, wherein the PRE penetrates through the first conductor layer via a contact hole through the first conductor line.

4. A Programmable Resistive Device (PRD) memory, comprising:
   a plurality of PRD cells, at least one of the PRD cells including at least:
      a diode and a Programmable Resistive Element (PRE) being fabricated at a crossover of a first conductor line and a second conductor line located in a structure having more than two vertical layers;
      the PRE coupled to a first conductor line;
      the diode including at least a first active region and a second active region isolated from the first active region, where the first active region having a first type of dopant and the second active region having a second type of dopant, the first active region providing a first terminal of the diode, the second active region providing a second terminal of the diode, the first active region coupled to the PRE and the second active region coupled to a second conductor line,
   wherein the PRE of the at least one of the PRD cells is coupled through the first conductor line to the PRE of another of the PRD cells or is shared through the first conductor line between two PRD cells; and
   wherein the PRE is configured to be programmable by applying voltages to the first conductor line, the second conductor lines and/or the third conductor line to thereby change its resistance for a different logic state.

* * * * *